United States Patent
Ulupinar et al.

(10) Patent No.: US 8,867,428 B2
(45) Date of Patent: Oct. 21, 2014

(54) SPLIT-CELL RELAY APPLICATION PROTOCOL

(75) Inventors: Fatih Ulupinar, San Diego, CA (US); Yongsheng Shi, Falls Church, VA (US); Gavin Bernard Horn, La Jolla, CA (US); Parag Arun Agashe, San Diego, CA (US); Xiaolong Huang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 847 days.

(21) Appl. No.: 12/752,964

(22) Filed: Apr. 1, 2010

(65) Prior Publication Data
US 2010/0260096 A1    Oct. 14, 2010

Related U.S. Application Data

(60) Provisional application No. 61/168,737, filed on Apr. 13, 2009.

(51) Int. Cl.
| | |
|---|---|
| H04B 7/14 | (2006.01) |
| H04W 40/36 | (2009.01) |
| H04W 76/02 | (2009.01) |
| H04B 7/26 | (2006.01) |
| H04W 92/20 | (2009.01) |
| H04W 84/04 | (2009.01) |
| H04W 92/04 | (2009.01) |
| H04W 28/06 | (2009.01) |

(52) U.S. Cl.
CPC .......... *H04W 40/36* (2013.01); *H04W 76/022* (2013.01); *H04W 84/047* (2013.01); *H04W 92/04* (2013.01); *H04B 7/2606* (2013.01); *H04W 92/20* (2013.01); *H04W 28/065* (2013.01); *H01L 2924/00013* (2013.01)
USPC ............................. 370/315; 370/389; 370/392

(58) Field of Classification Search
USPC ................... 370/310, 315, 351, 389, 392, 393
See application file for complete search history.

(56) References Cited

U.S. PATENT DOCUMENTS

| | | |
|---|---|---|
| 8,532,056 B2 | 9/2013 | Ulupinar et al. |
| 2006/0003696 A1 | 1/2006 | Diaz et al. |

(Continued)

FOREIGN PATENT DOCUMENTS

| | | |
|---|---|---|
| CN | 101365168 A | 2/2009 |
| EP | 1569388 | 8/2005 |

(Continued)

OTHER PUBLICATIONS

3GPP TSG RAN WG2 Meeting #65bis; R2-092179; Seoul, Korea, Mar. 23-27, 2009; Title: Consideration for Relay; Source: Huawei; Agenda Item: 7; Document for: Discussion and Approval.*

(Continued)

*Primary Examiner* — Chi Pham
*Assistant Examiner* — Weibin Huang
(74) *Attorney, Agent, or Firm* — Michael J. DeHaemer, Jr.

(57) ABSTRACT

Systems and methodologies are described that facilitate packet routing among relay eNBs in a wireless network. Packet data convergence protocol (PDCP) layer communications from a user equipment (UE) can terminate at a donor evolved Node B (eNB) and vice versa. In this regard, a relay application protocol (RAPP) layer is defined to transport application layer control data among relay eNBs to facilitate appropriate routing. RAPP layer messages can be similar to control messages at other application layers, such as S1-AP, X2, etc., while additionally including a relay UE identifier for routing the messages among relay eNBs. In addition, RAPP layer messages can exclude other parameters normally defined in other application layers to protect security and encryption/decryption details.

82 Claims, 22 Drawing Sheets

(56) References Cited

U.S. PATENT DOCUMENTS

| | | |
|---|---|---|
| 2007/0237107 A1 | 10/2007 | Jang et al. |
| 2008/0043666 A1 | 2/2008 | Tamura et al. |
| 2008/0130549 A1 | 6/2008 | Chindapol et al. |
| 2008/0192700 A1 | 8/2008 | Lee et al. |
| 2008/0219203 A1 | 9/2008 | Chou et al. |
| 2008/0285501 A1 | 11/2008 | Zhang et al. |
| 2008/0310367 A1 | 12/2008 | Meylan |
| 2008/0310452 A1 | 12/2008 | Vedantham et al. |
| 2009/0040982 A1 | 2/2009 | Ho et al. |
| 2009/0046661 A1 | 2/2009 | Casati et al. |
| 2009/0190521 A1 | 7/2009 | Horn et al. |
| 2009/0245201 A1 | 10/2009 | Motegi et al. |
| 2010/0150022 A1 | 6/2010 | Cai et al. |
| 2010/0215020 A1 | 8/2010 | Lee et al. |
| 2010/0260097 A1 | 10/2010 | Ulupinar et al. |
| 2010/0260126 A1 | 10/2010 | Ulupinar et al. |
| 2010/0272007 A1* | 10/2010 | Shen et al. ............ 370/315 |
| 2010/0284278 A1* | 11/2010 | Alanara ............ 370/235 |
| 2012/0039240 A1* | 2/2012 | Han et al. ............ 370/315 |
| 2014/0016542 A1* | 1/2014 | Ulupinar et al. ............ 370/315 |

FOREIGN PATENT DOCUMENTS

| | | |
|---|---|---|
| EP | 1921807 A1 | 5/2008 |
| EP | 1978709 | 9/2008 |
| KR | 20080075310 A | 8/2008 |
| WO | WO2006018670 A1 | 2/2006 |
| WO | WO2007019672 | 2/2007 |
| WO | WO2007119168 A2 | 10/2007 |
| WO | WO2008115447 A2 | 9/2008 |
| WO | WO2009106615 A1 | 9/2009 |
| WO | WO2009139679 A1 | 11/2009 |

OTHER PUBLICATIONS

3GPP TR R3.020 V0.9.1 (Nov. 2008); Technical Report; 3rd Generation Partnership Project; Technical Specification Group Radio Access Network; Home (e)NodeB; Network aspects; (Release 8).*

3GPP TS 36.413 VS.5.1 (Mar. 2009); Technical Specification; 3rd Generation Partnership Project; Technical Specification Group Radio Access Network; Evolved Universal Terrestrial Radio Access Network (E-UTRAN); S1 Application Protocol (S1AP); (Release 8).*

3GPP TS 36.413 v9.1.0,"Evolved Universal Terrestrial Radio Access Network (E-UTRAN);" S1 Application Protocol (S1AP) Release 9, Dec. 2009.

3GPP: "3rd Generation Partnership Project; Technical Specification Group Radio Access Network; Home (e)NodeB; Network aspects(Release 8)" 3GPP Draft; R3-083410_R3.020_V092_Clean_V2, 3rd Generation Partnership Project (3GPP), Mobile Competence Centre; 650, Route des Lucioles; F-06921 Sophia-Antipolis Cedex; France, no. Prague, Czech Republic; 20081117, Nov. 17, 2008, XP050324621, p. 55; figures 6.2.1.2.3-1, p. 51-p. 63.

3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 8) 3GPP Standard; 3GPP TS 36.300, 3rd Generation Partnership Project (3GPP), Mobile Competence Centre; 650, Route des Lucioles; F-06921 Sophia-Antipolis Cedex; France, No. V8.8.0, Mar. 1, 2009, pp. 1-157, XP050377583, p. 45, line 3-p. 50, line 15.

"3rd Generation Partnership Project; Technical Specification Group Radio Access Network; Evolved Universal Terrestrial Radio Access (E-UTRA) Radio Resource Control (RRC); Protocol specification (Release 8)" 3GPP Standard; 3GPP TS 36.331, 3rd Generation Partnership Project (3GPP), Mobile Competence Centre; 650, Route des Lucioles; F-06921 Sophia-Antipolis Cedex; France, No. V8.4.0, Dec. 1, 2008, pp. 1-198, XP050377647, paragraph [5.2.2.5] paragraph [6.2.2].

3rd Generation Partnership Project; Technical Specification Group Radio Access Network; Evolved Universal Terrestrial Radio Access (E-UTRA); Packet Data Convergence Protocol (PDCP) specification (Release 8) 3GPP Standard; 3GPP TS 36.323, 3rd Generation Partnership Project (3GPP), Mobile Competence Centre; 650, Route des Lucioles; F-06921 Sophia-Antipolis Cedex; France, No. V8.1.0, Mar. 1, 2008, pp. 1-28, XP050377637, Chapter 5.5.1, Chapter 6.1.2.

3rd Generation Partnership Project; Technical Specification Group Radio Access Network; Evolved Universal Terrestrial Radio Access (E-UTRA); Relay architectures for E-UTRA (LTE-Advanced) (Release 9), 3GPP Draft; R2-095391 TR 36.806 V0.1.0 on Relay Architectures for E-UTRA, 3rd Generation Partnership Project (3GPP); France, no. Miyazki; 20091012, Sep. 1, 2009, XP050389991, paragraph 4, subparagraphs 4.2.1, 4.2.2, 4.2.3, subparagraphs 54.2.3.1,4.2.3.2, figures 4.2.3.1-1 and 4.2.3.1-s, figures 4.2.3.2-1 and 4.2.3.2-2.

3rd Generation Partnership Project; Technical Specification Group Radio Access Network; Evolved Universal Terrestrial Radio Access Network (E-UTRAN); S1 Application Protocol (S1AP) (Release 8) 3GPP Standard; 3GPP TS 36.413, 3rd Generation Partnership Project (3GPP), Mobile Competence Centre; 650, Route des Lucioles; F-06921 Sophia-Antipolis Cedex; France, No. V8.5.1, Mar. 1, 2009, pp. 1-215, XP050377695.

Email Discussion Rapporteur (NTT Docomo et al: 3GPP Draft; R2-093972, 3rd Generation Partnership Project (3GPP), Mobile Competence Centre ; 650, Route des Lucioles ; F-06921 Sophia-Antipolis Cedex ; France, no. Los Angeles, USA; 20090623, Jun. 23, 2009, XP050352150.

Huawei: "Consideration for Relay" 3GPP Draft; R2-092179 Consideration for Relay, 3rd Generation Partnership Project (3GPP), Mobile Competence Centre ; 650, Route des Lucioles ; F-06921 Sophia-Antipolis Cedex ; France, no. Seoul, Korea; 20090317, Mar. 17, 2009, XP050340009.

Institute for Information Industry (III) et al: "Multi-hop type-I Relay" 3GPP Draft; R3-091634_Multi-Hop_Type-I_Relay, 3rd Generation Partnership Project (3GPP), Mobile Competence Centre ; 650, Route des Lucioles ; F-06921 Sophia-Antipolis Cedex ; France, no. Shenzhen/ China; 20090820, Aug. 20, 2009, XP050353027.

International Search Report and Written Opinion—PCT/US2010/030947, International Search Authority—European Patent Office—Jul. 15, 2010.

Motorola: "Flow Control" 3GPP Draft; R2-073540, 3rd Generation Partnership Project (3GPP), Mobile Competence Centre ; 650, Route des Lucioles ; F-06921 Sophia-Antipolis Cedex ; France, vol. RAN WG2, no. Athens, Greece; 20070817, Aug. 17, 2007, XP050136235.

Research in Motion UK Limited: "Joint PDCP protocols on Uu and Un interfaces to improve type-I relay handover" 3GPP Draft; R2-093735, 3rd Generation Partnership Project (3GPP), Mobile Competence Centre ; 650, Route des Lucioles ; F-06921 Sophia-Antipolis Cedex ; France, no. Los Angeles, USA; 20090622, Jun. 22, 2009, XP050351968.

Texas Instruments: "Minimizing the Type I RN complexity in LTE-A" 3GPP Draft; R2-093787, 3rd Generation Partnership Project (3GPP), Mobile Competence Centre ; 650, Route des Lucioles ; F-06921 Sophia-Antipolis Cedex ; France, no. Los Angeles, USA; 20090623, Jun. 23, 2009, XP050352008.

Texas Instruments: "On the design of relay node for LTE-advanced" 3GPP Draft; RI-090593, 3rd Generation Partnership Project (3GPP), Mobile Competence Centre ; 650, Route des Lucioles ; F-06921 Sophia-Antipolis Cedex ; France, no. Athens, Greece; 20090203, Feb. 3, 2009, XP050318480.

Ericsson: "Overview of relaying options", R2-092081, 3GPP TSG-RAN WG2 #65bis, Mar. 27, 2009.

Qualcomm Europe: "Preference for Relay Operation in LTE-A", R1-090876, 3GPP TSG-RAN WG1 #56, Feb. 13, 2009.

Qualcomm Europe: "Preference for Relay Operation in LTE-A", R1-091049, 3GPP TSG-RAN WG1 #56, Feb. 13, 2009.

Qualcomm Europe: "Preference for Relay Operation in LTE-A", R2-092153, 3GPP TSG-RAN WG2 #65bis, Mar. 27, 2009.

Qualcomm Europe: "Preference for Relay Operation in LTE-A", R3-090702, 3GPP TSG-RAN WG3 #63bis, Mar. 27, 2009.

Texas Instruments: "On the design of relay node for LTE-advanced", R1-090290, 3GPP TSG RAN WG1 #55bis, Jan. 16, 2009.

Texas Instruments: "On the design of relay node for LTE-advanced", R1-090593, 3GPP TSG RAN WG1 #56, Feb. 13, 2009.

Taiwan Search Report—TW099111491—TIPO—Feb. 11, 2014.

* cited by examiner

SPLIT-CELL RELAY APPLICATION PROTOCOL

CLAIM OF PRIORITY UNDER 35 U.S.C. §119

The present Application for Patent claims priority to Provisional Application No. 61/168,737 entitled "SPLIT-CELL BASED RELAY FOR LTE" filed Apr. 13, 2009, and assigned to the assignee hereof and hereby expressly incorporated by reference herein.

BACKGROUND

1. Field

The following description relates generally to wireless communications, and more particularly to routing data packets among multiple access points.

2. Background

Wireless communication systems are widely deployed to provide various types of communication content such as, for example, voice, data, and so on. Typical wireless communication systems may be multiple-access systems capable of supporting communication with multiple users by sharing available system resources (e.g., bandwidth, transmit power, . . . ). Examples of such multiple-access systems may include code division multiple access (CDMA) systems, time division multiple access (TDMA) systems, frequency division multiple access (FDMA) systems, orthogonal frequency division multiple access (OFDMA) systems, and the like. Additionally, the systems can conform to specifications such as third generation partnership project (3GPP), 3GPP long term evolution (LTE), ultra mobile broadband (UMB), and/or multi-carrier wireless specifications such as evolution data optimized (EV-DO), one or more revisions thereof, etc.

Generally, wireless multiple-access communication systems may simultaneously support communication for multiple mobile devices. Each mobile device may communicate with one or more access points (e.g., base stations) via transmissions on forward and reverse links. The forward link (or downlink) refers to the communication link from access points to mobile devices, and the reverse link (or uplink) refers to the communication link from mobile devices to access points. Further, communications between mobile devices and access points may be established via single-input single-output (SISO) systems, multiple-input single-output (MISO) systems, multiple-input multiple-output (MIMO) systems, and so forth. Access points, however, can be limited in geographic coverage area as well as resources such that mobile devices near edges of coverage and/or devices in areas of high traffic can experience degraded quality of communications from an access point.

Cell relays can be provided to expand network capacity and coverage area by facilitating communication between mobile devices and access points. For example, a cell relay can establish a backhaul link with a donor access point, which can provide access to a number of cell relays, and the cell relay can establish an access link with one or more mobile devices or additional cell relays. To mitigate modification to backend core network components, communication interfaces with the backend network components, such as S1-U, can terminate at the donor access point. Thus, the donor access point appears as a normal access point to backend network components. To this end, the donor access point can route packets from the backend network components to the cell relays for communicating to the mobile devices.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with one or more aspects and corresponding disclosure thereof, various aspects are described in connection with facilitating defining a relay application protocol (RAPP) for communicating control data between a donor eNB and an end device, such as user equipment (UE) or one or more split-cell relay eNBs, through one or more intermediary split-cell relay eNBs. For example, the RAPP can be similar to an application protocol utilized by the donor eNB to communicate with one or more core network components, however, the RAPP can include parameters identifying one or more aspects of a split-cell relay connected to the end device and/or can exclude parameters relating to security, encryption/decryption, and/or similar parameters relating to interpreting a payload of the RAPP layer. This allows the donor eNB to tunnel application layer communications through one or more intermediary split-cell relay eNBs to the end device without exposing packet contents to the intermediary split-cell relay eNBs. In this example, a split-cell relay eNB providing access to the end device can transmit a payload of the RAPP packet over a disparate protocol, such as a radio resource control (RRC) protocol to the end device.

According to related aspects, a method is provided that includes receiving a packet having an application layer from an initial device and generating a disparate packet having a RAPP layer that includes one or more parameters of the application layer and one or more additional parameters for routing the disparate packet among one or more relay eNBs. The method can also include transmitting the disparate packet to an eNB.

Another aspect relates to a wireless communications apparatus. The wireless communications apparatus can include at least one processor configured to obtain a packet from a device having an application layer and create a disparate packet with a RAPP layer that includes one or more parameters of the application layer and one or more additional parameters for routing the disparate packet among one or more relay eNBs. The at least one processor is further configured to transmit the disparate packet to an eNB. The wireless communications apparatus also comprises a memory coupled to the at least one processor.

Yet another aspect relates to an apparatus. The apparatus includes means for receiving a packet including an application layer from a device and means for generating a disparate packet including a RAPP layer that comprises one or more parameters of the application layer and one or more additional parameters for routing the disparate packet. The apparatus also includes means for transmitting the disparate packet to an eNB.

Still another aspect relates to a computer program product, which can have a computer-readable medium including code for causing at least one computer to obtain a packet from a device having an application layer and code for causing the at least one computer to create a disparate packet with a RAPP layer that includes one or more parameters of the application layer and one or more additional parameters for routing the disparate packet among one or more relay eNBs. The computer-readable medium can also comprise code for causing the at least one computer to transmit the disparate packet to an eNB.

Moreover, an additional aspect relates to an apparatus including a component that receives a packet including an application layer from a device and a RAPP translating component that generates a disparate packet including a RAPP layer that comprises one or more parameters of the application layer and one or more additional parameters for routing the disparate packet. The apparatus can further include a RAPP communicating component that transmits the disparate packet to an eNB.

According to another aspect, a method is provided that includes receiving a packet from a relay eNB comprising a RAPP layer that includes a relay UE identifier and generating a disparate packet having a disparate application layer that includes a disparate identifier. The method additionally includes transmitting the disparate packet to a core network component or a donor eNB.

Another aspect relates to a wireless communications apparatus. The wireless communications apparatus can include at least one processor configured to obtain a packet from a relay eNB comprising a RAPP layer that includes a relay UE identifier and create a disparate packet having a disparate application layer that includes a disparate identifier related to the relay UE identifier. The at least one processor is further configured to transmit the disparate packet to a core network component or a donor eNB. The wireless communications apparatus also comprises a memory coupled to the at least one processor.

Yet another aspect relates to an apparatus. The apparatus includes means for receiving a packet from a relay eNB comprising a RAPP layer that includes a relay UE identifier and means for determining one or more parameters in the RAPP layer of the packet. The apparatus further includes means for creating a disparate packet having a disparate application layer that includes a disparate identifier for transmitting to a core network component or a donor eNB.

Still another aspect relates to a computer program product, which can have a computer-readable medium including code for causing at least one computer to obtain a packet from a relay eNB comprising a RAPP layer that includes a relay UE identifier and code for causing the at least one computer to create a disparate packet having a disparate application layer that includes a disparate identifier related to the relay UE identifier. The computer-readable medium can also comprise code for causing the at least one computer to transmit the disparate packet to a core network component or a donor eNB.

Moreover, an additional aspect relates to an apparatus including a RAPP communicating component that receives a packet from a relay eNB comprising a relay application protocol (RAPP) layer that includes a relay UE identifier and a RAPP processing component that determines one or more parameters in the RAPP layer of the packet. The apparatus can further include a backhaul component that creates a disparate packet having a disparate application layer that includes a disparate identifier for transmitting to a core network component or a donor eNB.

In yet another aspect, a method is provided that includes receiving a packet from an eNB comprising a RAPP layer that includes a relay UE identifier and generating a disparate packet including an RRC layer based at least in part on the packet. The method further includes determining a UE related to the relay UE identifier and transmitting the disparate packet to the UE.

Another aspect relates to a wireless communications apparatus. The wireless communications apparatus can include at least one processor configured to obtain a packet from an eNB comprising a RAPP layer that includes a relay UE identifier and create a disparate packet including an RRC layer based at least in part on the packet. The at least one processor is further configured to transmit the disparate packet to a UE indicated in the relay UE identifier. The wireless communications apparatus also comprises a memory coupled to the at least one processor.

Yet another aspect relates to an apparatus. The apparatus includes means for receiving a packet from an eNB comprising a RAPP layer that includes a relay UE identifier and means for determining one or more parameters in the RAPP layer of the packet. The apparatus also includes means for creating a disparate packet for a UE related to the relay UE identifier including an RRC layer based at least in part on the one or more parameters.

Still another aspect relates to a computer program product, which can have a computer-readable medium including code for causing at least one computer to obtain a packet from an eNB comprising a RAPP layer that includes a relay UE identifier and code for causing the at least one computer to create a disparate packet including an RRC layer based at least in part on the packet. The computer-readable medium can also comprise code for causing the at least one computer to transmit the disparate packet to a UE indicated in the relay UE identifier.

Moreover, an additional aspect relates to an apparatus including a RAPP communicating component that receives a packet from an eNB comprising a relay application protocol (RAPP) layer that includes a relay UE identifier and a RAPP processing component that determines one or more parameters in the RAPP layer of the packet. The apparatus can further include an RRC communicating component that creates a disparate packet having a disparate application layer based at least in part on the one or more parameters in the packet and transmits the packet to a UE related to the relay UE identifier.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed and this description is intended to include all such aspects and their equivalents.

DETAILED DESCRIPTION

Figure 1:
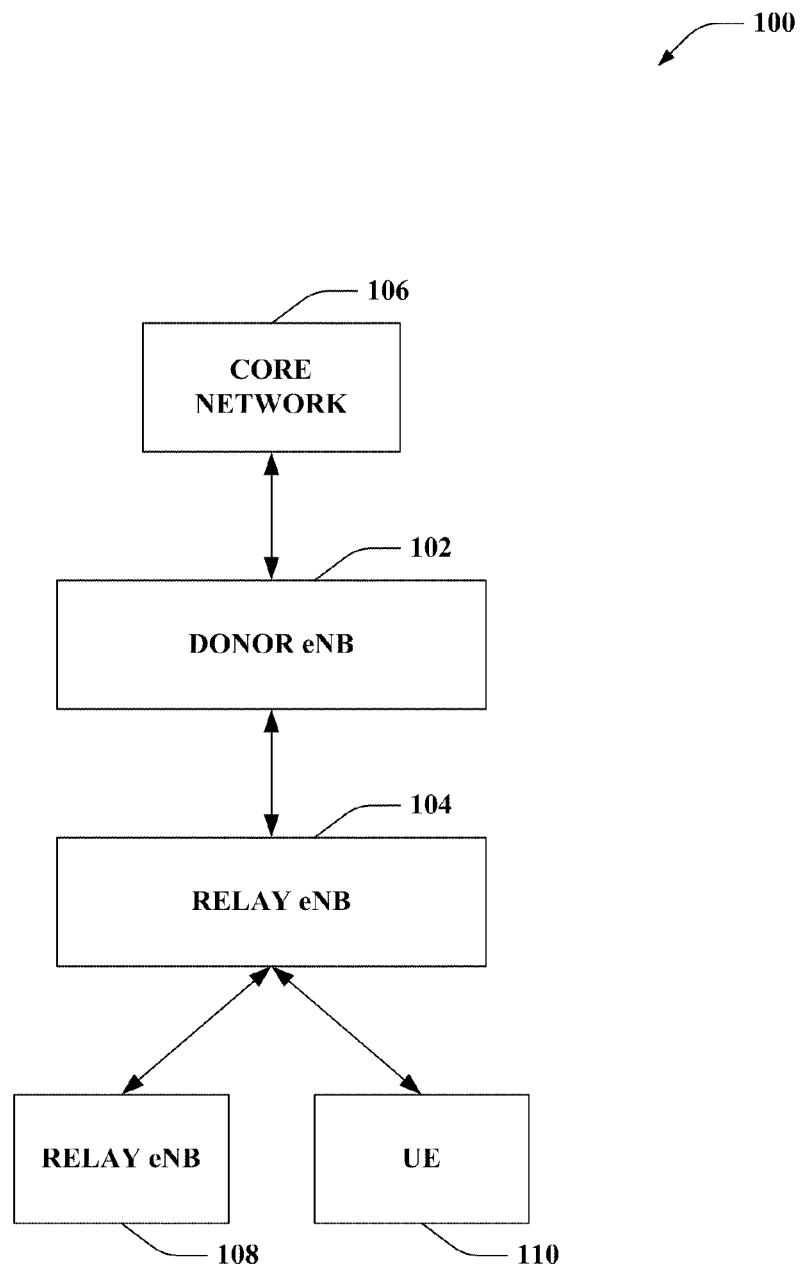
FIG. 1 is an illustration of an example wireless communications system that facilitates providing relay evolved Node Bs (eNB) for wireless networks.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Furthermore, various aspects are described herein in connection with a terminal, which can be a wired terminal or a wireless terminal A terminal can also be called a system, device, subscriber unit, subscriber station, mobile station, mobile, mobile device, remote station, remote terminal, access terminal, user terminal, terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, or some other terminology.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), cdma2000, etc. UTRA includes Wideband-CDMA (W-CDMA) and other variants of CDMA. Further, cdma2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). Additionally, cdma2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Referring to FIG. 1, a wireless communication system 100 is illustrated that facilitates providing relay functionality in wireless networks. System 100 includes a donor eNB 102 that provides one or more relay eNBs, such as relay eNB 104, with access to a core network 106. Similarly, relay eNB 104 can provide one or more disparate relay eNBs, such as relay eNB 108, or UEs, such as UE 110, with access to the core network 106 via donor eNB 102. Donor eNB 102, which can also be referred to as a cluster eNB, can communicate with the core network 106 over a wired or wireless backhaul link, which can be an LTE or other technology backhaul link. In one example, the core network 106 can be a 3GPP LTE or similar technology network.

Donor eNB 102 can additionally provide an access link for relay eNB 104, which can also be wired or wireless, LTE or other technologies, and the relay eNB 104 can communicate with the donor eNB 102 using a backhaul link over the access link of the donor eNB 102. Relay eNB 104 can similarly provide an access link for relay eNB 108 and/or UE 110, which can be a wired or wireless LTE or other technology link. In one example, donor eNB 102 can provide an LTE access link, to which relay eNB 104 can connect using an LTE backhaul, and relay eNB 104 can provide an LTE access link to relay eNB 108 and/or UE 110. Donor eNB 102 can connect to the core network 106 over a disparate backhaul link technology. Relay eNB 108 and/or UE 110 can connect to the relay eNB 104 using the LTE access link to receive access to core network 106, as described. A donor eNB and connected relay eNBs can be collectively referred to herein as a cluster.

According to an example, relay eNB 104 can connect to a donor eNB 102 at the link layer (e.g., media access control (MAC) layer) as would a UE in conventional LTE configurations. In this regard, donor eNB 102 can act as a conventional LTE eNB requiring no changes at the link layer or related interface (e.g., user-to-user (Uu), such as E-UTRA-Uu) to support the relay eNB 104. In addition, relay eNB 104 can appear to UE 110 as a conventional eNB at the link layer, such that no changes are required for UE 110 to connect to relay eNB 104 at the link layer, for example. In addition, relay eNB 104 can configure procedures for resource partitioning between access and backhaul link, interference management, idle mode cell selection for a cluster, and/or the like. It is to be appreciated that relay eNB 104 can connect to additional donor eNBs, in one example.

With respect to transport layer communications, transport protocols related to relay eNB 108 or UE 110 communications can terminate at the donor eNB 102, referred to as cell relay functionality, since the relay eNB 104 is like a cell of the donor eNB 102. For example, in a cell relay configuration, donor eNB 102 can receive communications for the relay eNB 104 from the core network 106, terminate the transport protocol, and forward the communications to the relay eNB 104 over a disparate transport layer keeping the application layer substantially intact. It is to be appreciated that the forwarding transport protocol type can be the same as the terminated transport protocol type, but is a different transport layer established with the relay eNB 104.

Relay eNB 104 can determine a relay eNB or UE (e.g., relay eNB 108 or UE 110) related to the communications, and provide the communications to the relay eNB or UE (e.g., based on an identifier thereof within the communications).

Similarly, donor eNB 102 can terminate the transport layer protocol for communications received from relay eNB 104, translate the communications to a disparate transport protocol, and transmit the communications over the disparate transport protocol to the core network 106 with the application layer intact for relay eNB 104 as a cell relay. In these examples, where relay eNB 104 is communicating with another relay eNB, the relay eNB 104 can support application protocol routing to ensure communications reach the correct relay eNB.

In an example, a packet data convergence protocol (PDCP) layer for relay eNB 108 (or related devices communicating therewith) and/or UE 110 can also be terminated at the donor eNB 102. In this example, for packets or other data received from relay eNB 108, UE 110, or other relay eNBs or UEs communicating with relay eNB 104, relay eNB 104 can forward the packets or other data to donor eNB 102 (and vice versa) without determining the PDCP payload. In this regard, security and encryption considerations can be handled at the donor eNB 102 and a node from which the packet or other data originated, which can be relay eNB 108, UE 110, etc. Thus, relay eNB 104 and/or other intermediary relay eNBs need not decrypt and re-encrypt communications (or apply other security procedures to the application layer payload) upon receiving and forwarding the packets or other data.

For example, upon receiving packets from a relay eNB 108 or UE 110, relay eNB 104 can forward the packets to donor eNB 102, without analyzing the PDCP layer payload, based at least in part on an identifier or address specified in a radio link control (RLC) or similar layer. Similarly, relay eNB 104 can forward packets from donor eNB 102 to relay eNB 108 or UE 110 without processing the PDCP layer. In an example, relay eNB 104 can analyze a PDCP header of the packets to determine one or more parameters for communicating to donor eNB 102. For instance, to assist in flow control, sequence number (SN) status transfer, etc., relay eNB 104 can acquire one or more parameters from a header of a PDCP layer of a packet from donor eNB 102 to relay UE 110 (e.g., such as an SN or similar parameters), and specify the one or more parameters to donor eNB 102. In addition, for example, relay eNB 104 can send PDCP layer feedback information to donor eNB 102 related to communicating packets from donor eNB 102 to relay eNB 108 or UE 110.

In addition, donor eNB 102 can store PDCP layer contexts for each UE (e.g., UE 110), relay eNB (e.g., relay eNB 104), or other device with which donor eNB 102 ultimately communicates (e.g., via intermediary relay eNBs). In this regard, donor eNB 102 can store and/or analyze the PDCP layer feedback according to a related context for relay eNB 108 or UE 110 for subsequent use in communicating with the relay eNB 108 or UE 110. Moreover, donor eNB 102, in an example, can multiplex PDCP layer communications over a single Un or other radio protocol interface with relay eNB 104 to provide PDCP instances to communicate with the related devices. It is to be appreciated, however, that donor eNB 102 can maintain less than one context per PDCP layer communication, and in one example, can have one PDCP context to handle substantially all PDCP layer communications therewith.

For control plane communications, however, donor eNB 102 can utilize a relay application protocol (RAPP) to route packets to/from the relay eNB 104 and/or a related end device, such as relay eNB 108 or UE 110, communicating therewith. Control plane communications can refer to signals transmitted over logical control channels between a UE and eNB that relate to establishment, management, etc. of communications over one or more data channels. For example, core network 106 can include a mobility management entity (MME) or similar component that performs various operations to establish core network communications for UE 110. The MME can utilize an S1-application protocol (S1-AP) or similar application level protocol over a PDCP layer (and a plurality of lower layers) to communicate control data for UE 110 through one or more eNBs. S1-AP can refer to a signaling protocol (e.g., in LTE or other 3GPP specifications) for communicating control data or other data between an eNB and a core network. Donor eNB 102 can receive S1-AP or similar protocol communications from core network 106 and can translate the communications to utilize RAPP. For example, the RAPP can include one or more identifiers to facilitate routing related packets among one or more relay eNBs, radio bearer IDs (identifiers related to establishing radio bearers), handover parameters, and/or the like. In addition, for example, the RAPP can exclude other parameters of the S1-AP or other protocol, such as those relating to security (e.g., parameters for decrypting/encrypting a packet, identifiers specific to donor eNB 102 and/or the end device, etc.).

For example, core network 106 can generate communications for an eNB that serves UE 110 and can transmit the communications to donor eNB 102 over S1-AP. Donor eNB 102 can determine that the packet relates to UE 110 (e.g., based on an identifier in the S1-AP packet, and/or the like) and can generate a RAPP packet for communicating data and/or one or more other parameters in the S1-AP packet. Donor eNB 102 can include information to facilitate routing the RAPP packet to UE 110, such as an identifier of UE 110, an identifier of a relay eNB serving UE 110 (e.g., relay eNB 104, in this example) and/or the like. In addition, the RAPP packet can exclude parameters in the S1-AP message related to interpreting the payload of the S1-AP layer. Donor eNB 102 can determine a next relay eNB in a communications path to the relay eNB serving UE 110, which is relay eNB 104 in this example, and can transmit the RAPP packet thereto. It is to be appreciated, for example, that where the serving relay eNB is relay eNB 108, the next downstream relay eNB from donor eNB 102 would also be relay eNB 104.

Relay eNB 104 can receive the RAPP packet and determine that a payload or one or more parameters of the RAPP packet relates to UE 110. Accordingly, relay eNB 104 can communicate the payload and/or one or more parameters to UE 110 over a disparate layer communication (e.g., a radio resource control (RRC) layer). In one example, the RAPP packet can include a non-access stratum (NAS) or higher layer message. For example, donor eNB 102 can have received the NAS message as part of the S1-AP message and included the NAS message in the generated RAPP packet. In this example, relay eNB 104 can forward the NAS message to UE 110. UE 110 can interpret the NAS message at least in part by using security parameters previously negotiated with donor eNB 102.

In addition, it is to be appreciated that donor eNB 102 and/or relay eNB 104 can perform similar functionalities for X2 messages directed to one or more disparate relay eNBs, such as relay eNB 108. Thus, donor eNB 102 can generate RAPP packets for received or generated X2 messages intended for relay eNB 108 and can transmit the RAPP packets to relay eNB 104 for providing to relay eNB 108. In one example, the X2 messages can be received from other donor eNBs in other clusters, relay eNBs in the cluster of donor eNB 102, and/or the like. Accordingly, donor eNB 102 can utilize the RAPP to communicate packets to end devices through one or more intermediary relay eNBs without exposing security parameters or requiring the intermediary relay eNBs to perform security procedures. Rather, the intermediary relay eNBs can route the packets to the end devices, as described. Moreover, it is to be appreciated that the core network can include one or more core network components that facilitate providing network access to a UE, such as an MME, general packet radio service (GPRS) support node (SGSN), serving gateway (SGW), packet data network (PDN) gateway (PGW), policy and charging rules function (PCRF), and/or home subscriber server (HSS), etc.

Figure 2:
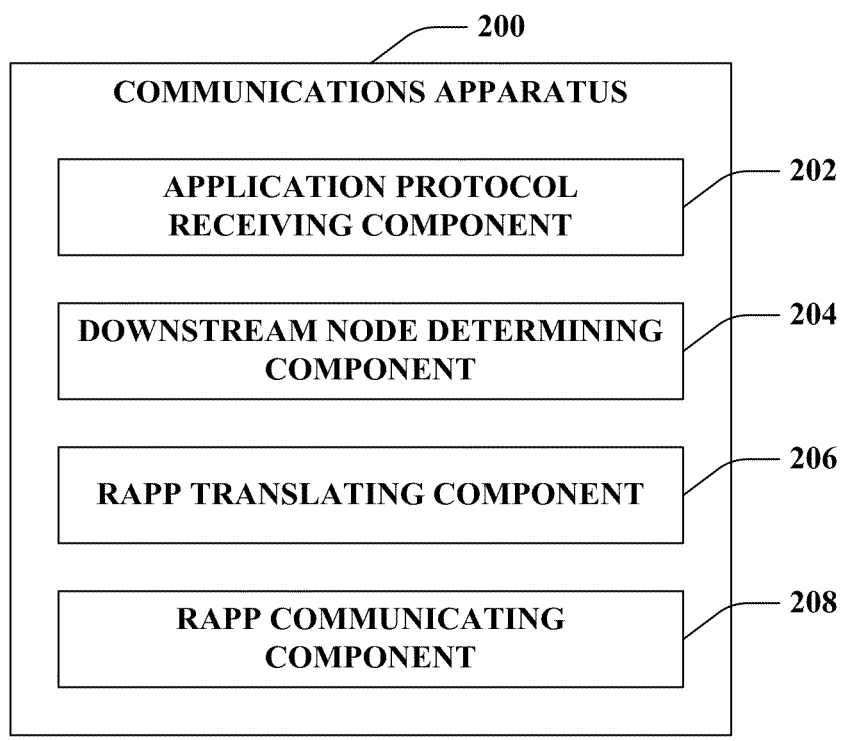
FIG. 2 is an illustration of an example communications apparatus for employment within a wireless communications environment.

Turning to FIG. 2, illustrated is a communications apparatus 200 for employment within a wireless communications environment. The communications apparatus 200 can be a base station or a portion thereof, a mobile device or a portion thereof, or substantially any communications apparatus that receives and transmits data over a wireless communications environment. The communications apparatus 200 can include an application protocol receiving component 202 that obtains one or more packets having an application protocol layer from one or more devices or network components, a downstream node determining component 204 that associates the one or more packets with a downstream node (e.g., based on an identifier), a RAPP translating component 206 that generates a disparate packet with a RAPP layer and includes one or more parameters from the application protocol layer of the received packet in the RAPP layer of the disparate packet, and a RAPP communicating component 208 that transmits the disparate packet with the RAPP layer to one or more similar or disparate devices or network components.

According to an example, application protocol receiving component 202 can obtain an application layer packet from one or more network components, such as a core network component (e.g., MME and/or the like), an eNB, etc. In this regard, the application layer packet can include an S1-AP layer, and X2 layer, and/or the like. Downstream node determining component 204 can discern a downstream node, such as a UE, relay eNB, etc. for which the application layer packet is intended. In one example, the application layer packet can include an identifier related to the downstream node, and the intended downstream node can be determined from the identifier. For instance, in S1-AP, the application layer packet can include an eNB UE S1AP ID, which can relate to an identifier assigned by the communications apparatus 200 for the related downstream node that can include an identifier of a UE and a donor eNB serving the UE.

RAPP translating component 206 can generate a RAPP packet for transmitting at least a portion of the application layer packet (e.g., a payload and/or one or more parameters) to the downstream node through one or more relay eNBs. As described, for example, the RAPP packet can exclude one or more parameters of the application layer packet (e.g., the eNB UE S1AP ID, in S1-AP, etc.) so as not to expose security information, to decrease the size of the packet for more efficient transmitting, etc. In addition, the RAPP packet can include one or more parameters related to providing the RAPP packet to the downstream node. In one example, the RAPP packet can include an identifier of a serving relay eNB, an identifier of the downstream node assigned by the serving relay eNB, an identifier of the radio bearer over which the serving relay eNB is to transmit at least a portion of the RAPP packet to the downstream node, and/or the like.

RAPP communicating component 208 can transmit the RAPP packet to a next downstream relay eNB in a communications path to the downstream node. This can be determined, for example, based at least in part on locating an identifier (e.g., eNB UE S1AP ID) in the application layer packet in a routing table that associates such identifiers with identifiers of the next downstream relay eNB in the communications path, resources for communicating therewith, and/ or the like. In another example, RAPP translating component 206 can obtain the aforementioned identifier of the serving relay eNB, the downstream node, and/or the serving relay eNB radio bearer from the same or a similar routing table (e.g., or from the identifier in the application layer packet itself). In addition, the RAPP packet can include one or more layers below the RAPP layer, such as PDCP, a relay routing protocol (RRP) layer, a radio link control (RLC) layer, a media access control (MAC) layer, a level 1 (L1) layer, and/or the like.

Figure 3:
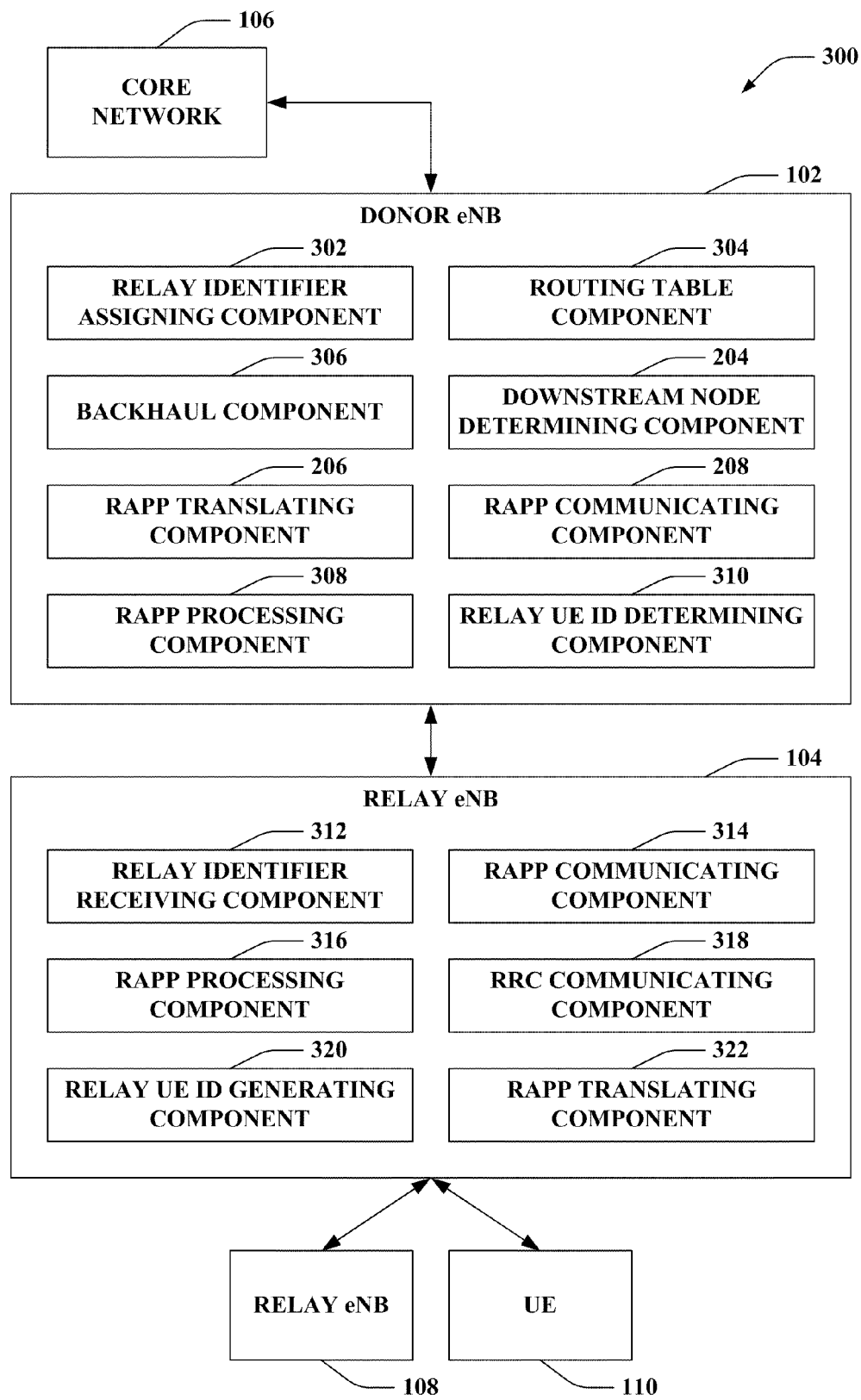
FIG. 3 is an illustration of an example wireless communications system that facilitates utilizing a relay application protocol (RAPP) layer to communicate disparate application layer data among various relay eNBs.

Turning now to FIG. 3, an example wireless communication system 300 that facilitates utilizing a RAPP layer to communicate secure packets through one or more relay eNBs is illustrated. System 300 includes a donor eNB 102 that provides relay eNB 104 (and/or other relay eNBs) with access to core network 106. Additionally, as described, relay eNB 104 can provide relay eNB 108 and UE 110 with access to the core network 106 through the donor eNB 102. Moreover, for example, there can be one or more intermediary relay eNBs (not shown) between relay eNB 104 and donor eNB 102 (and/or similarly between relay eNB 104 and relay eNB 108 or UE 110). In addition, it is to be appreciated that relay eNB 108 can comprise the components of relay eNB 104 and provide similar functionality, in one example. Moreover, donor eNB 102 can be a macrocell access point, femtocell access point, picocell access point, mobile base station, and/or the like. Relay eNB 104 (and relay eNB 108) can similarly be mobile or stationary relay nodes that communicate with donor eNB 102 (and relay eNB 104) over a wireless or wired backhaul, as described.

Donor eNB 102 comprises a relay identifier assigning component 302 that generates an identifier for, and/or associates an identifier to, a relay eNB and a routing table component 304 that maintains a routing table comprising associations between one or more identifiers related to one or more relay eNBs. Donor eNB 102 can also include backhaul component 306 that obtains one or more packets having an application protocol layer from one or more network components and/or transmits such packets to the one or more network components, a downstream node determining component 204 that associates the one or more packets with a downstream node, a RAPP translating component 206 that generates a disparate packet with a RAPP layer and includes one or more parameters from the application protocol layer of the received packet in the RAPP layer of the disparate packet, and a RAPP communicating component 208 that transmits the disparate packet with the RAPP layer to one or more similar or disparate network components and/or receives packets with RAPP layers from one or more downstream nodes. Moreover, donor eNB 102 can include a RAPP processing component 308 that determines one or more parameters or other data in a RAPP layer of a received packet as well as a relay UE ID determining component 310 that obtains a relay UE ID from one or more downstream nodes related to communications therefrom.

Relay eNB 104 can comprise a relay identifier receiving component 312 that obtains an identifier from an upstream node related to communicating therewith, a RAPP communicating component 314 that can transmit packets with RAPP layers to upstream or downstream nodes and/or receive such packets therefrom, and a RAPP processing component 316 that determines one or more parameters in a RAPP layer of a received packet. Relay eNB 104 can also include an RRC communicating component 318 that transmits packets over an RRC layer or receives such packets from one or more downstream nodes, a relay UE ID generating component 320 that creates an identifier for a UE served by relay eNB 104, and a RAPP translating component 322 that can create a packet with a RAPP layer for communicating data received from a downstream node over an RRC or similar layer.

According to an example, donor eNB 102 can provide network access to relay eNB 104 and/or one or more devices communicating therewith, as described. In this regard, relay eNB 104 can establish a connection to donor eNB 102, and relay identifier assigning component 302 can generate an identifier for relay eNB 104. It is to be appreciated that relay identifier assigning component 302 can generate the identifier and/or one or more disparate identifiers during connection establishment and/or subsequent to connection establishment, periodically during communicating with relay eNB 104, according to a schedule or one or more events, etc. In addition, relay identifier assigning component 302 can generate the identifier for relay eNB 104 according to a specification, configuration, random function, a type or class (e.g., macrocell, femtocell, picocell, etc.) of relay eNB 104, and/or the like. Relay identifier assigning component 302 can provide the identifier to relay eNB 104 over a connection therewith (e.g., a backhaul connection, a wireless interface connection, through one or more UEs, relay eNBs, or other devices, and/or the like).

In one example, the connection establishment can include relay eNB 104 transmitting a specialized RRC connection request that includes a relay indicator. RAPP communicating component 314 can transmit the specialized connection request (which can be a message defined in RAPP, for example) to donor eNB 102. RAPP communicating component 208 can obtain the connection request, and relay identifier assigning component 302 assigns the identifier for relay eNB 104, in this example. Relay identifier assigning component 302 can then indicate the identifier in a connection setup message, which can be similar to an RRC connection setup message, but defined for RAPP to include the relay identifier. RAPP communicating component 208 can transmit the message to relay eNB 104.

In any case, relay identifier receiving component 312 can obtain the identifier for subsequent use when communicating to donor eNB 102. In addition, relay identifier assigning component 302 can provide the identifier for routing table component 304, which can store the identifier along with one or more additional parameters. For example, the one or more additional parameters can include an identifier of a next downstream relay eNB in a communications path to relay eNB 104. In this example, the next downstream relay eNB is relay eNB 104. In another example, however, where relay eNB 108 connects to donor eNB 102 via relay eNB 104, relay identifier assigning component 302 can generate an identifier for relay eNB 108, and routing table component 304 can store the identifier for relay eNB 108 with an identifier for relay eNB 104 as the next downstream relay eNB in the communications path to relay eNB 108. In this example, it is to be appreciated that relay eNB 104 can similarly store the identifier for relay eNB 108 in a routing table with an identifier of a next downstream relay eNB in the communications path to relay eNB 108, which is relay eNB 108 in this example, for routing packets thereto based on the identifier.

Moreover, for example, backhaul component 306 can communicate the identifier or a disparate identifier for relay eNB 104 to core network 106 for association with subsequent communications intended for relay eNB 104. In another example, backhaul component 306 can receive an identifier for relay eNB 104 from core network 106. Where this identifier is different from that generated by relay identifier assigning component 302, routing table component 304 can additionally store this identifier with an association to the identifier generated by relay identifier assigning component 302. In addition, backhaul component 306 can obtain a packet from one or more disparate eNBs (e.g., via core network 106 or over a direct wired or wireless link with the one or more disparate eNBs). The packet can include an application layer, as described, such as an X2 or similar application layer that supports eNB-to-eNB communication. Downstream node determining component 204 can obtain an identifier in the application layer of the packet to discern a downstream node to receive the packet. The identifier in the application layer of the packet can be the identifier assigned by relay identifier assigning component 302, the identifier generated by core network 106 or provided thereto by backhaul component 306, and/or the like, as described.

RAPP translating component 206 can generate a disparate packet with a RAPP layer for communicating to the intended relay eNB through possibly one or more intermediary relay eNBs. Where the identifier in the application layer of the received packet is different from the identifier assigned by relay identifier assigning component 302, routing table component 304 can determine the identifier of the relay eNB assigned by relay identifier assigning component 302 based on a stored association to the identifier received in the application layer of the packet. In any case, RAPP translating component 206 can include the identifier assigned by relay identifier assigning component 302 in the RAPP layer of the disparate packet. In addition, routing table component 304 can provide an identifier related to the next downstream relay eNB in a communications path to the intended relay eNB based on a stored association, as described above. RAPP communicating component 208 can transmit the disparate packet with the RAPP layer to the next downstream relay eNB.

In an example, the intended relay eNB can be relay eNB 108, and an identifier in the received application layer packet can correspond thereto. In this example, RAPP communicating component 208 can determine the next downstream relay eNB from routing table component 304, which includes an association of an identifier of relay eNB 108 to an identifier of relay eNB 104—the next downstream relay eNB in a communications path to relay eNB 108. Thus, RAPP communicating component 208 can provide the disparate packet to relay eNB 104. RAPP communicating component 314 can obtain the disparate packet, and RAPP processing component 316 can determine a next downstream relay eNB in a communications path to relay eNB 108 (e.g., using a routing table (not shown) that stores such an identifier upon receiving the identifier assignment for relay eNB 108 from relay identifier assigning component 302, as described). RAPP communicating component 314 can accordingly forward the disparate packet to the next downstream relay eNB, which is relay eNB 108 in this example. Thus, relay eNBs, in one example, can determine whether to process or forward packets received from an upstream eNB based at least in part on the identifier in the RAPP layer; for example, where the identifier relates to the relay eNB, it can process the packet, and where it does not so relate, the relay eNB can forward the packet to the next downstream relay eNB, as described.

Moreover, in another example, relay eNB 104 can communicate with UE 110 providing access to core network 106 thereto via donor eNB 102. In this regard, RRC communicating component 318 can establish communications with UE 110 (e.g., based on receiving a random access request over a provided random access channel and performing a random access procedure therewith). For example, RRC communicating component 318 can provide resources to UE 110 for transmitting and/or receiving communications. Upon establishing connection with UE 110, relay UE ID generating component 320 can create an identifier for UE 110 and can associate the relay identifier with the identifier for the UE to generate a relay UE ID. Moreover, for example, this can include establishing connection with UE 110 as part of a handover procedure from a source eNB to relay eNB 104. It is to be appreciated that relay UE ID generating component 320 can additionally or alternatively create relay UE IDs for UE 110 at different times as well, such as according to a timer, based on one or more events, etc. In any case, relay UE ID generating component 320 can store the identifier for subsequent utilization in communicating packets from UE 110 to the core network 106 via donor eNB 102.

For example, RRC communicating component 318 can receive a packet from UE 110 over a set of assigned resources. RAPP translating component 322 can create a RAPP packet to forward data in the received packet to donor eNB 102. In one example, the data in the received packet can be secured, encrypted, etc. according to one or more parameters negotiated among UE 110 and donor eNB 102. Thus, RAPP translating component 322 can include such data along with the relay UE identifier. RAPP communicating component 314 can transmit the RAPP packet to donor eNB 102 (and/or one or more intermediary relay eNBs if present). In one example, where relay eNB 104 can communicate with more than one donor eNB, RAPP communicating component 314 can additionally select a donor eNB to receive the RAPP packet, which can be based on an identifier of the donor eNB in the packet received from UE 110 at RRC communicating component 318, an identifier of the donor eNB previously associated to the UE 110 at relay eNB 104 (e.g., at connection establishment), and/or the like.

RAPP communicating component 208 can receive the RAPP packet from relay eNB 104 (or from one or more intermediary relay eNBs that can forward the packet upstream, as described). RAPP processing component 308 can determine one or more parameters or other data in the RAPP layer of the RAPP packet. Relay UE ID determining component 310 can extract the relay UE ID from the RAPP packet. Backhaul component 306 can provide the one or more parameters or other data to a core network 106 component along with an identifier related to UE 110 and/or can create a disparate packet, having a disparate application layer and including the one or more parameters, for communicating with core network 106. This can be the received relay UE ID, an identifier, or a portion thereof, generated by relay identifier assigning component 302 and associated therewith in the routing table component 304, and/or the like. In the latter example, routing table component 304 can locate the identifier related to UE 110 based on the relay UE ID and can provide the identifier related to UE 110 to the backhaul component 306 for associating with the disparate packet to be transmitted to core network 106.

Core network 106 can process the parameters or other data and send response data to donor eNB 102 over backhaul component 306. In another example, core network 106 can send data intended for the UE 110 regardless of receiving prior communications therefrom. In either case, donor eNB 102 can provide the response data or other data from donor eNB 102, for example, to UE 110 through relay eNB 104 (and/or one or more intermediary relay eNBs). In one example, as described, donor eNB 102 can secure or otherwise encrypt data for UE 110 according to previously negotiated parameters such that UE 110 can unsecure or otherwise decrypt the data upon receipt. Downstream node determining component 204 can detect an identifier in the response data received over backhaul component 306 or other data generated at donor eNB 102. RAPP translating component 206, as described, can create a RAPP packet that includes the response data or other data, which can be secured. In addition, downstream node determining component 204 can provide an identifier for the RAPP packet to facilitate routing through one or more relay eNBs.

In one example, downstream node determining component 204 can provide the identifier received in the response data or otherwise generated by donor eNB 102. In another example, downstream node determining component 204 can retrieve an associated identifier from routing table component 304 based on the identifier received in the response data. Moreover, for example, the identifier provided by downstream node determining component 204 can be the relay UE ID described previously. In addition, RAPP communicating component 208 can utilize routing table component 304 to determine a next downstream relay eNB in a communications path to the relay eNB indicated by relay UE ID (e.g., relay eNB 104 in this example). RAPP communicating component 208 can subsequently provide the RAPP packet to relay eNB 104. For example, where one or more intermediary relay eNBs exist between donor eNB 102 and relay eNB 104, routing table component 304 can provide an identifier of the next downstream relay eNB to RAPP communicating component 208, which can communicate the RAPP packet thereto. The intermediary relay eNBs can similarly include routing table components, as described previously, that map the relay UE IDs, or other associated identifiers, to next downstream relay eNBs, and RAPP communicating components that forward the RAPP packet to the next downstream relay eNB until the RAPP packet reaches its destination device or a serving relay eNB of the destination device. In a similar example, where the relay UE ID relates to relay eNB 108 and a UE it serves, relay eNB 104 can comprise one or more components of donor eNB 102, as described, such as a routing table component 304, to receive and route the RAPP packets according to the identifier at the RAPP layer.

RAPP communicating component 314 can receive the RAPP packet. RAPP processing component 316 can determine one or more parameters or other data in the RAPP packet (e.g., a payload of the RAPP layer). RRC communicating component 318 can generate an RRC packet for communicating the parameters or other data. Based on the identifier in the RAPP layer of the RAPP packet, RRC communicating component 318 can determine a UE to receive the parameters or other data, and can accordingly transmit the data to the appropriate UE (UE 110 in this example) in the RRC packet.

It is to be appreciated that the foregoing components and related functions can be utilized to communicate control data among relay eNBs without requiring security processing at each relay eNB. For example, RRC communicating component 318 can receive an attach request from UE 110. Relay UE ID generating component 320 can create an identifier for UE 110 and associate it with a relay identifier assigned by donor eNB 102. RAPP translating component 206 can include data from the attach request in a RAPP packet, such as the attach request payload, along with the relay UE ID. RAPP communicating component 314 can provide the RAPP packet to donor eNB 102, as described. RAPP communicating component 208 can receive the packet, and RAPP processing component 308 can extract the attach request payload and provide it to core network 106 over backhaul component 306. In this example, backhaul component 306 can also include an identifier with the attach request, such as the relay UE ID, an identifier associated therewith in routing table component 304, and/or the like, as described.

In this example, backhaul component 306 can receive an attach accept message from core network 106 verifying attachment of UE 110 to core network 106. This can be received in an S1-AP layer of a packet, for example. Downstream node determining component 204 can locate an identifier of the device to which the attach accept is related, and can provide that identifier to RAPP translating component 206. In another example, as described, downstream node determining component 204 can retrieve an associated identifier from routing table component 304. In either case, the identifier can be the relay UE ID, as described. RAPP translating component 206 can include the attach accept, one or more parameters thereof, a payload thereof, a related message (e.g., security mode command), etc., along with the relay UE ID in a RAPP packet for transmitting to UE 110. RAPP communicating component 208 can transmit the RAPP packet to the next downstream relay eNB to the relay eNB that serves UE 110. As described, this next downstream relay eNB can be determined according to an identifier associated with the relay UE ID or other identifier in routing table component 304.

Whether received directly from donor eNB 102 or from one or more intermediary relay eNBs, RAPP communicating component 314 can obtain the RAPP packet. As described, RAPP processing component 316 can obtain the attach accept or related message (e.g., security mode command) and determine a UE to receive the message. As described, for example, this can be determined from the relay UE ID in the RAPP layer of the RAPP packet. In another example, as described, relay eNB 104 can also have a routing table that associates relay UE IDs to one or more aspects of communicating with a related downstream device, such as a bearer identifier, a set of resources, and/or the like. RRC communicating component 318 can transmit the message to UE 110 based on the identifier, the one or more aspects of communicating therewith, and/or the like.

In addition, other messages can be similarly communicated using RAPP to facilitate attaching UE 110 to core network 106. Moreover, as described in further detail herein, the foregoing components and functionalities can be utilized to transmit messages during dedicated bearer activation, UE triggered service requests, UE mobility (e.g., handover), and/or the like. In handover, for example, a handover request can be communicated from relay eNB 104 based on RRC communicating component 318 receiving measurement reports from UE 110. In this regard, RAPP translating component 322 can create a RAPP version of the handover request, as described, and RAPP communicating component 314 can provide the handover request to donor eNB 102. In addition, RAPP communicating component 314 can provide buffer contents related to one or more packets received from UE 110, one or more parameters related to SN status transfer of UE 110, and/or the like to donor eNB 102. Donor eNB 102 can, in turn, provide these parameters to a disparate relay eNB in the cluster or a donor eNB of another cluster (or to core network 106 for providing to one or more of the disparate eNBs) using backhaul component 306, as described further herein.

Utilizing RAPP, as described, allows control packets to be forwarded through relay eNBs without security processing at each relay eNB. Indeed, as described, RAPP can exclude parameters utilized to facilitate such security processing when communicating packets through the relay eNBs. In one example, donor eNB 102 can store context information for given UEs to apply security to related communications, and the UE can possess information to remove security and vice versa, as described. FIGS. 4-10 illustrate various example implementations of the foregoing described functionalities.

Figure 4:
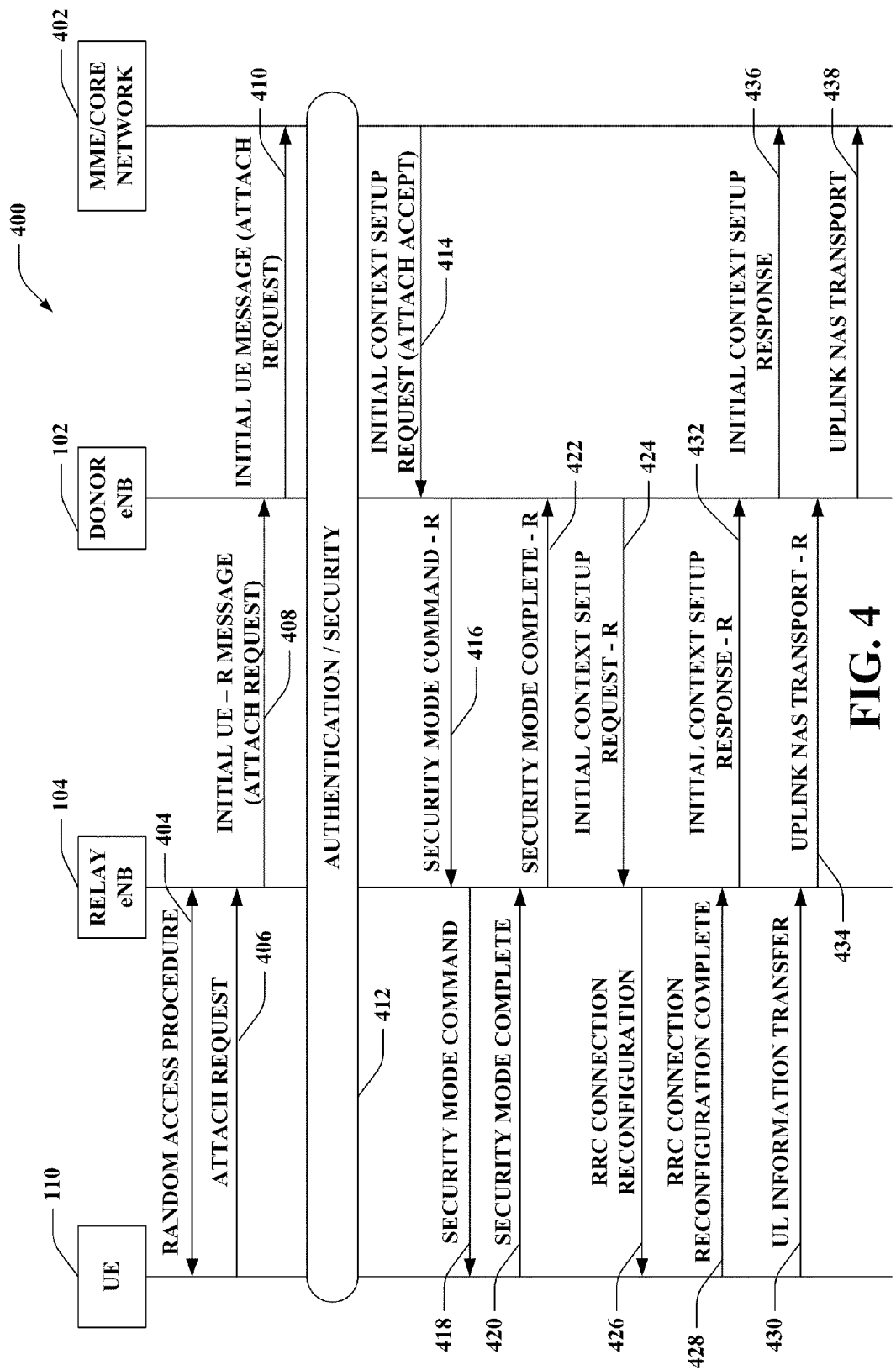
FIG. 4 is an illustration of an example wireless communications system that facilitates attaching a user equipment (UE) to a network using RAPP layer messages.

Referring to FIG. 4, an example wireless communication system 400 that facilitates attaching a UE to a core network through one or more relay eNBs is illustrated. System 400 includes a donor eNB 102 that provides relay eNB 104 (and/or other relay eNBs) with access to an MME/core network 402. Additionally, as described, relay eNB 104 can provide UE 110 with access to the MME/core network 402 through the donor eNB 102. Moreover, for example, there can be multiple relay eNBs 104 between the donor eNB 102 and UE 110. Furthermore, donor eNB 102 can be a macrocell access point, femtocell access point, picocell access point, mobile base station, and/or the like, as described. Relay eNB 104 can similarly be a mobile or stationary relay node that communicates with donor eNB 102 over a wireless or wired backhaul, as described. In addition, MME/core network 402 can relate to an MME or similar component that interfaces with one or more core network components to establish core network access for UE 110.

In the depicted example, UE 110 performs a random access procedure 404 with relay eNB 104 to receive a set of resources for communicating therewith (e.g., over an air interface). The random access procedure can include, for example, UE 110 transmitting a random access preamble to relay eNB 104 over a random access channel provided by relay eNB 104, receiving a random access response therefrom, providing an RRC connection request, and receiving an RRC connection setup, which can specify the set of resources over which UE 110 can communicate with relay eNB 104 (e.g., to request network attachment). Accordingly, UE 110 can transmit an attach request 406 to relay eNB 104, which can include a NAS message within an RRC connection setup complete message, for example. Upon receiving the attach request 406, relay eNB 104 can generate a relay UE ID, as described previously, which can include, for example, a prefix of a relay ID previously assigned by donor eNB 102 and a suffix of UE ID generated by relay eNB 104.

In addition, relay eNB 104 can create an initial UE-R message 408, which can be defined for RAPP communications, for transmitting the NAS attach request. For example, the initial UE-R message can be similar to an initial UE message in S1-AP, but can have additional parameters and/or exclude parameters of the S1-AP initial UE message. In one example, the initial UE-R message 408 can have a format (e.g., include fields) similar to the following:

| Information Element (IE)/Group Name |
| --- |
| Message Type |
| Relay UE ID |
| NAS-Protocol Data Unit (PDU) |
| Tracking Area Identity (TAI) |
| E-UTRAN Cell Global Identity (CGI) |
| Serving Temporary Mobile Subscriber Identity (S-TMSI) |

Thus, the initial UE-R message 408 can include the NAS attach request (e.g., in the NAS PDU IE) as well as the relay UE ID, as described above. Relay eNB 104 can transmit the initial UE-R message 408 with the attach request to donor eNB 102. Donor eNB 102 can receive the message, as described, and can map the relay UE ID to a disparate identifier, such as an eNB UE S1AP ID generated at donor eNB 102. Donor eNB 102 can create an initial UE message 410 (e.g., an S1-AP initial UE message) specifying the disparate identifier, and can transmit the initial UE message 410 with the attach request to MME/core network 402.

UE 110 and MME/core network 402 can perform authentication/security 412 to ensure UE 110 is authorized in the core network. This can include, for example, exchanging messages among various core network nodes, such as the MME, and old MME/serving SGSN, SGW, PGW, PCRF, and/or HSS. In addition, MME/core network 402 can setup one or more system architecture evolution (SAE) bearers (e.g., in a SGW/PGW) for UE 110. MME/core network 402 can send an initial context setup request 414, which can be an S1-AP message that includes the disparate identifier transmitted with the initial UE message, to donor eNB 102 if the UE 110 can attach to the core network. The initial context setup request 414 can include an attach accept message.

Donor eNB 102 can determine a relay UE ID for the downstream destination node based on the disparate identifier, as described (e.g., based on a mapping of the identifiers stored in a routing table). Donor eNB 102 can then generate a security mode command-R 416, which can be defined for communicating RAPP messages, that is similar to a security mode command message utilized by an RRC protocol. For example, the security mode command-R 416 can have a format similar to the following:

| IE/Group Name |
| --- |
| Message Type |
| RELAY UE ID |
| Security Configuration |
| > Integrity Protection Algorithm |
| > Ciphering Algorithm |
| > Key Indicator |
| > Next Hop Chaining Count |

Thus, the security mode command-R 416 can additionally include the relay UE ID to facilitate identifying the intended downstream node. The other fields of the security mode command-R 416 (or a security mode command message in RRC) relate to security algorithms and/or other parameters, as described above, that are negotiated with the UE to secure/unsecure and/or encrypt/decrypt subsequent packets at UE 110 and/or donor eNB 102. Donor eNB 102 can transmit the security mode command-R 416 to relay eNB 104. As described, this can be based on identifying relay eNB 104 as a next downstream relay eNB.

For example, as described, where one or more intermediary relay eNBs are present between donor eNB 102 and relay eNB 104, donor eNB 102 can provide the security mode command-R 416 to the an intermediary relay eNB that is the next downstream relay eNB in a communications path to relay eNB 104, which can be determined based on locating an identifier of the next downstream relay eNB related to the relay UE ID. The intermediary relay eNB (not shown) can similarly forward the security mode command-R 416, without performing security or decryption procedures, to the next downstream relay eNB in a communications path to relay eNB 104 (based at least in part on a routing table that maps the relay UE ID in the security mode command-R 416 to an identifier of the next downstream relay eNB).

Whether from donor eNB 102 or by way of one or more intermediary relay eNBs, relay eNB 104 can receive the security mode command-R 416. Relay eNB 104 can determine that it is the destination relay eNB based at least in part on the relay UE ID (e.g., the relay portion thereof matches the identifier assigned to relay eNB 104 by donor eNB 102). Accordingly, relay eNB 104 can generate a security mode command RRC message similar to the received security mode command-R 416 (e.g., but excluding the relay UE ID), and can transmit the security mode command 418 to UE 110. UE 110 can receive and process security mode command 418 and can transmit a security mode complete 420, which can be an RRC message, to relay eNB 104 that acknowledges the provided security parameters. Such acknowledgement messages, for example, can include one or more acknowledgement indicator values. Relay eNB 104 can create a security mode complete-R 422, which can be defined for RAPP communications, for routing to donor eNB 102 (through one or more intermediary relay eNBs, in one example). The security mode complete-R 422 can be similar to the security mode complete in RRC but including the relay UE ID, which is previously generated at relay eNB 104, as described. Relay eNB 104 can transmit the security mode complete-R 422 to donor eNB 102.

Following security mode establishment, donor eNB 102 can communicate with UE 110 to setup an initial context. To facilitate communicating through one or more relay eNBs 104 without requiring security to be performed by the relay eNBs, donor eNB 102 can create an initial context setup request-R 424, which can be defined for RAPP communications and can be similar to an initial context setup request message in S1-AP. For example, the initial context setup request-R 424 can have a format similar to the following:

| IE/Group Name |
| --- |
| Message Type |
| Relay UE ID |
| UE Aggregate Maximum Bit Rate |
| SAE Bearer to Be Setup List |
| > SAE Bearer to Be Setup Item IEs |
| >>Relay Radio Bearer ID |
| >>SAE Bearer ID |
| >>SAE Bearer Level QoS Parameters |
| Control Plane Security Information |
| Trace Activation |
| Handover Restriction List |
| NAS-PDU |
| UE Radio Capability |
| Subscriber Profile ID for RAT/Frequency priority |

In this regard, the initial context setup request-R 424 additionally includes the relay UE ID to facilitate routing of the message, as described. In addition, the initial context setup request-R 424 includes one or more relay radio bearer IDs, which can relate to a bearer of relay eNB 104 over which to communicate information received from a core network over the corresponding SAE bearer to the UE 110. Moreover, the initial context setup request-R 424 additionally comprises control plane security parameters for communicating with donor eNB 102. Donor eNB 102 can communicate the initial context setup request-R 424 to relay eNB 104.

Relay eNB 104 can obtain the initial context setup request-R 424 (from donor eNB 102 or one or more intermediary relay eNBs, as described) and can accordingly send an RRC connection reconfiguration 426 to the UE 110 to establish the default radio bearer therewith. In addition, relay eNB 104 can store a mapping of the default radio bearer to one or more routing identifiers for subsequent use in communicating data received over the corresponding SAE bearer to UE 110. UE 110 can transmit an RRC connection reconfiguration complete 428 to relay eNB 104 to confirm establishment of the default radio bearer. In addition, UE 110 can send a UL information transfer 430, which can be an RRC message, to relay eNB 104 including an attach complete. UE 110, for example, can secure or encrypt the attach complete in the UL information transfer according to the security parameters negotiated with donor eNB 102, described above.

Relay eNB 104 can generate an initial context setup response-R 432, which can be defined for RAPP communications and can be similar to an initial context setup response message in S1-AP to indicate completion of bearer setup. For example, the initial context setup response-R 432 can have a format similar to the following:

| IE/Group Name |
| --- |
| Message Type |
| Relay UE ID |
| SAE Bearer Setup List |
| > SAE Bearer Setup Item IEs |
| >>Relay Radio Bearer ID |
| >>GPRS Tunnelling Protocol (GTP) Tunnel Endpoint Identifier (TEID) |
| SAE Bearer Failed to Setup List |
| Criticality Diagnostics |

In this regard, the initial context setup response-R 432 can include the relay UE ID and the one or more relay radio bearer IDs described above of bearers established UE 110. Relay eNB 104 can transmit the initial context setup response-R 432 to donor eNB 102. In addition, relay eNB 104 can generate an uplink NAS transport-R 434, which can be defined for RAPP communications, to route the UL information transfer 430 to donor eNB 102. The uplink NAS transport-R 434 can be similar to an uplink NAS transport message in S1-AP, but can have a format similar to the following:

| IE/Group Name |
| --- |
| Message Type |
| Relay UE ID |
| NAS-PDU |

Thus, the uplink NAS transport-R 434 includes the relay UE ID for identification of an originating node, and the attach accept as the NAS-PDU. Relay eNB 104 can transmit the uplink NAS transport-R 434 to donor eNB 102.

Donor eNB 102 can receive the initial context setup response-R 432 and can generate an initial context setup response 436 S1-AP message that includes the eNB UE S1AP ID, or other identifier of donor eNB 102 used for downlink traffic on S1-U, instead of the relay UE ID, along with a TEID of the donor eNB 102, for example. Donor eNB 102 can transmit the initial context setup response 436 to MME/core network 402. In addition, for example, donor eNB 102 can generate an uplink NAS transport 438 for communicating the attach accept received in uplink NAS transport-R 434. In one example, donor eNB 102 can decrypt or otherwise unsecure the attach accept received in uplink NAS transport-R 434 according to the one or more parameters negotiated with UE 110, as described previously. In addition, the uplink NAS transport 438 can include an eNB UE S1AP ID or other identifier mapped to the relay UE ID at donor eNB 102. Donor eNB 102 can communicate the attach accept in the uplink NAS transport 438 to MME/core network 402.

Figure 5:
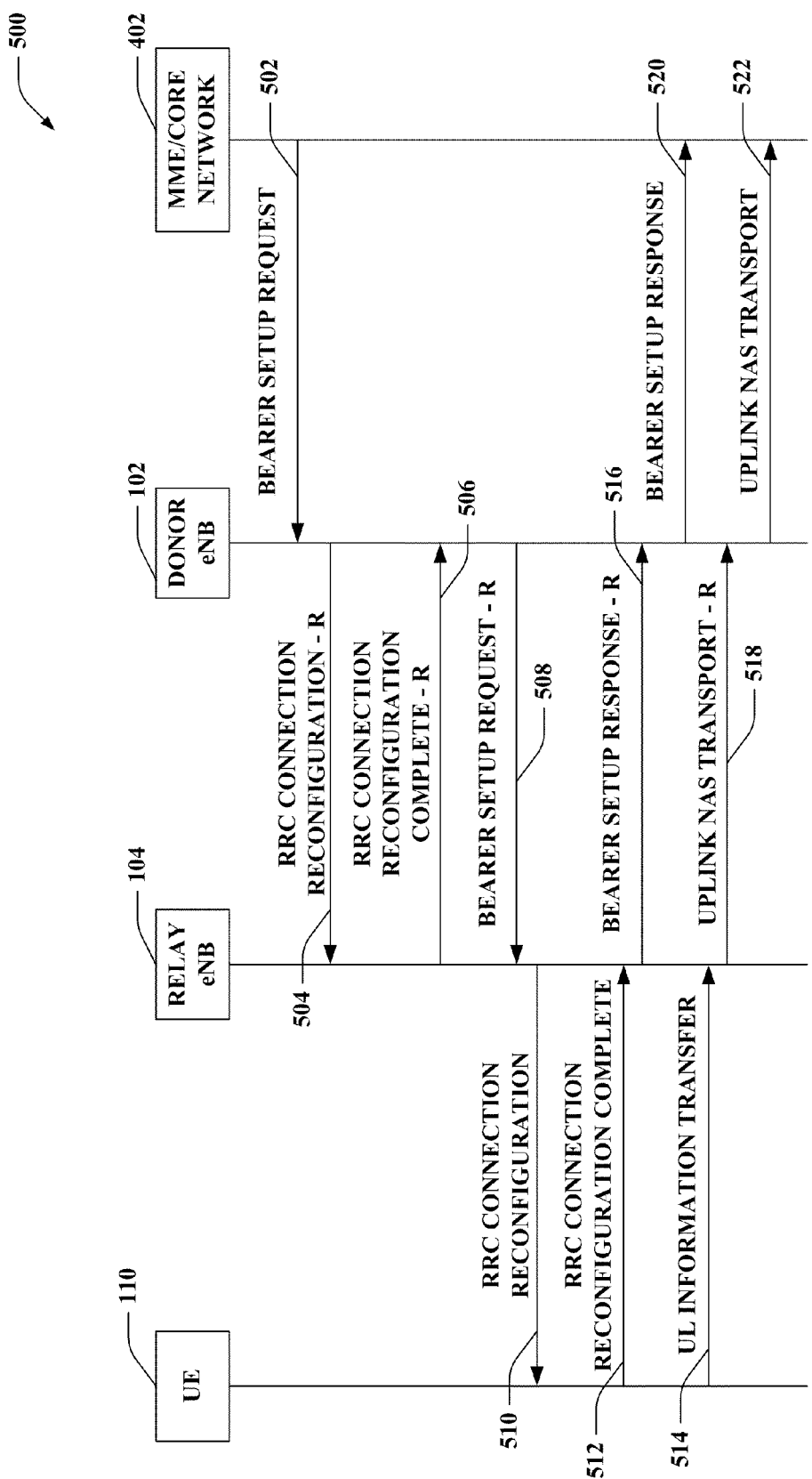
FIG. 5 is an illustration of an example wireless communications system that activates radio bearers using RAPP layer messages.

Turning to FIG. 5, an example wireless communication system 500 is illustrated that facilitates activating dedicated bearers for UE communication to a core network. System 500 includes a donor eNB 102 that provides relay eNB 104 (and/or other relay eNBs) with access to an MME/core network 402. Additionally, as described, relay eNB 104 can provide UE 110 with access to the MME/core network 402 through the donor eNB 102. Moreover, for example, there can be multiple relay eNBs 104 between the donor eNB 102 and UE 110. Further, donor eNB 102 can be a macrocell access point, femtocell access point, picocell access point, mobile base station, and/or the like, as described. Relay eNB 104 can similarly be a mobile or stationary relay node that communicates with donor eNB 102 over a wireless or wired backhaul, as described. In addition, MME/core network 402 can relate to an MME or similar component that interfaces with one or more core network components to establish core network access for UE 110.

In the depicted example, MME/core network 402 can initiate a request to create a dedicated bearer. In one example, an SGW/PGW of the core network can cause MME/core network 402 to request bearer setup from an eNB. In this regard, MME/core network 402 transmits a bearer setup request 502 to donor eNB 102. Donor eNB 102 can send an RRC connection reconfiguration-R 504 to relay eNB 104, which can be defined for RAPP communications and can be similar to an RRC connection reconfiguration additionally including a relay UE ID and/or one or more relay radio bearer IDs, as described above, to setup and/or update dedicated radio bearers for UE 110 traffic. Relay eNB 104 can confirm bearer setup by transmitting an RRC connection reconfiguration complete-R 506 to donor eNB 102, which can be defined for RAPP communications and can be similar to an RRC connection reconfiguration complete including the relay UE ID and/or the one or more relay radio bearer IDs setup and/or updated by relay eNB 104.

Donor eNB 102 can then generate a bearer setup request-R 508, which can be defined for RAPP communications and can be similar to a bearer setup request S1-AP message with a relay UE ID (e.g., instead of MME UE S1AP ID and/or eNB UE S1AP ID) and one or more relay radio bearer IDs related to one or more SAE bearers (e.g., without transport layer addresses and/or GTP TEIDs related to the SAE bearers). Thus, for example, the bearer setup request-R 508 can have a format similar to the following;

| IE/Group Name |
|---|
| Message Type |
| Relay UE ID |
| UE Aggregate Maximum Bit Rate |
| SAE Bearer to be Setup List |
| >SAE Bearer To Be Setup Item IEs |
| >>Relay Radio Bearer ID |
| >> SAE Bearer ID |
| >> SAE Bearer Level QoS parameters |
| NAS-PDU |

Donor eNB 102 can transmit the bearer setup request-R 508 to relay eNB 104 including relay radio bearer IDs that relate to dedicated radio bearers to be established to the UE.

Relay eNB 104 can thus send one or more RRC connection reconfigurations 510 to UE 110 to establish dedicated radio bearers therewith. UE 110 can transmit RRC connection configuration completes 512 to relay eNB 104 to indicate bearer establishment. In addition, UE 110 can transmit a session management response or similar message in a UL information transfer 514 to relay eNB 104. Relay eNB 104 can acknowledge bearer establishment by generating a bearer setup response-R 516 for transmitting to donor eNB 102. For example, bearer setup response-R 516 can be defined for RAPP communications and similar to a bearer setup response S1AP message. For example, the bearer setup response-R 516 can have a format similar to the following:

| IE/Group Name |
|---|
| Message Type |
| Relay UE ID |
| SAE Bearer Setup List |
| >SAE Bearer Setup Item IEs |
| >>Relay Radio Bearer ID |
| >> SAE Bearer ID |
| SAE Bearer Failed to Setup List |
| Criticality Diagnostics |

Thus, the bearer setup response-R 516 includes the relay UE ID, as described, and relay radio bearer IDs related to one or more bearers successfully established with UE 110. In addition, relay eNB 104 can map the successfully established relay radio bearer IDs to an identifier for routing subsequent data received over the corresponding SAE bearer to UE 110. In another example, relay eNB 104 can additionally map relay radio bearer IDs related to communicating with UE 110 to bearers utilized to communicate uplink packets from UE 110 to donor eNB 102.

In addition, relay eNB 104 can transmit the NAS message in UL information transfer 514 to donor eNB 102 in an uplink NAS transport-R 518, as described previously. Donor eNB 102 can transmit a bearer setup response 520 to MME/core network 402 based on the bearer setup response-R 516. For example, the bearer setup response can be the S1AP message, and thus can exclude the relay UE ID and instead have a related eNB UE S1AP ID and/or MME UE S1AP ID (e.g., transport layer addresses and/or GTP TEIDs related to the SAE bearers successfully established as indicated in the bearer setup response-R 516 instead of relay radio bearer IDs, etc.), as described. In addition, donor eNB 102 can transmit the NAS message in uplink NAS transport-R 518 to MME/core network 402 in an uplink NAS transport 522 S1AP message, as described. Moreover, for example, donor eNB 102 can store the relay radio bearer IDs in a bearer mapping table for associating subsequent communications from MME/core network 402 to the correct relay radio bearer (e.g., based on the UE and/or its related PDCP context, as described). Furthermore, it is to be appreciated that MME/core network 402 can acknowledge bearer activation between one or more components, such as an MME and/or SGW/PGW.

Figure 6:
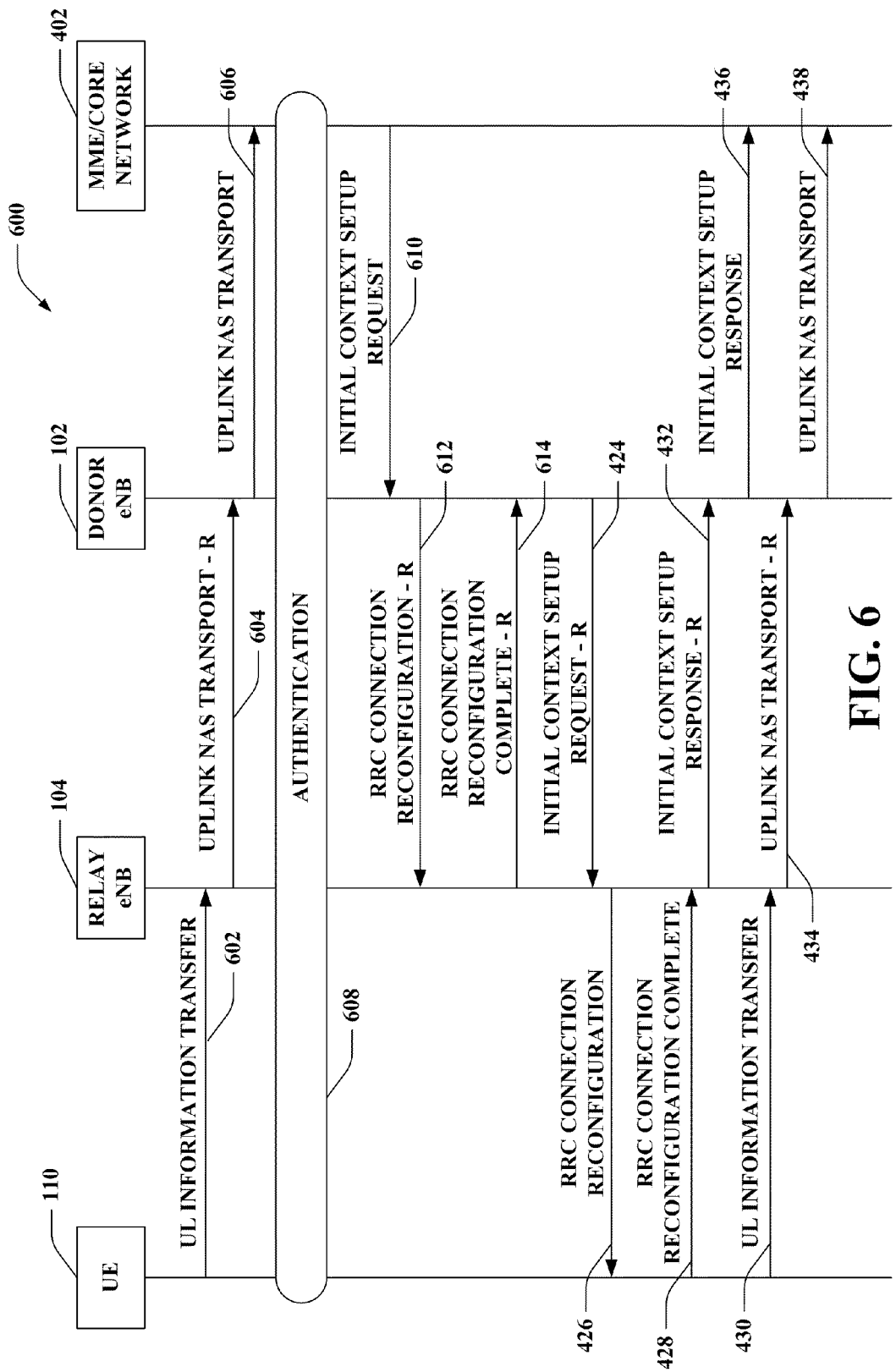
FIG. 6 is an illustration of an example wireless communications system that performs UE-triggered service requests using RAPP layer messages.

Referring to FIG. 6, an example wireless communication system 600 that facilitates triggering service requests from a UE to a core network through one or more relay eNBs is illustrated. System 600 includes a donor eNB 102 that provides relay eNB 104 (and/or other relay eNBs) with access to an MME/core network 402. Additionally, as described, relay eNB 104 can provide UE 110 with access to the MME/core network 402 through the donor eNB 102. Moreover, for example, there can be multiple relay eNBs 104 between the donor eNB 102 and UE 110. Further, donor eNB 102 can be a macrocell access point, femtocell access point, picocell access point, mobile base station, and/or the like, as described. Relay eNB 104 can similarly be a mobile or stationary relay node that communicates with donor eNB 102 over a wireless or wired backhaul, as described. In addition, MME/core network 402 can relate to an MME or similar component that interfaces with one or more core network components to establish core network access for UE 110.

In the depicted example, UE 110 can transmit a UL information transfer 602 to relay eNB 104, which can include a NAS message related to triggering the service request. Relay eNB 104 can generate an uplink NAS transport-R 604, as described, to communicate the NAS message through one or more relay eNBs. Donor eNB 102 can obtain the uplink NAS transport-R 604 and can create an uplink NAS transport, which can be an S1AP message. Donor eNB 102 can transmit the NAS transport 606 to MME/core network 402. This can cause MME/core network 402 (e.g., one or more components thereof, such as an SGW, PGW, PCRF, HSS, etc.) to perform authentication 608 with UE 110 (e.g., through the donor eNB 102, relay eNB 104, etc.) to ensure UE 110 can communicate with MME/core network 402.

MME/core network 402 can send an initial context setup request 610 to donor eNB 102 indicating UE 110 is authorized to access the core network. Donor eNB 102 can transmit an RRC connection reconfiguration-R 612, which includes the relay UE ID for UE 110 as described, as well as one or more relay radio bearer IDs of relay eNB 104 to establish for UE 110. Relay eNB 104 can setup one or more radio bearers, as requested in the RRC connection reconfiguration-R 612, and can transmit an RRC connection reconfiguration complete-R 614 to donor eNB 102 confirming setup of the radio bearers corresponding to the relay radio bearer IDs, as described.

Donor eNB 102 can then communicate with UE 110 to setup an initial context. As described, donor eNB 102 can create an initial context setup request-R 424, which includes the relay UE ID and/or one or more relay radio bearer IDs. In addition, the one or more relay radio bearer IDs can relate to a bearer of relay eNB 104, previously established with UE 110, over which to communicate information received from a core network over the corresponding SAE bearer to the UE 110. Donor eNB 102 can communicate the initial context setup request-R 424 to relay eNB 104. Relay eNB 104 can obtain the initial context setup request-R 424 (from donor eNB 102 or one or more intermediary relay eNBs, as described) and can accordingly send an RRC connection reconfiguration 426 to the UE 110 to establish the corresponding radio bearer therewith. In addition, relay eNB 104 can store a mapping of the radio bearer to one or more routing identifiers for subsequent use in communicating data received over the corresponding SAE bearer to UE 110.

UE 110 can transmit an RRC connection reconfiguration complete 428 to relay eNB 104 to confirm establishment of the radio bearer. In addition, UE 110 can send a UL information transfer 430 to relay eNB 104 including a session management response, as described, or other message indicating successful bearer establishment. Relay eNB 104 can generate an initial context setup response-R 432 to indicate completion of bearer setup, as described, and can provide the initial context setup response-R 432 to donor eNB 102. In addition, relay eNB 104 can generate and transmit an uplink NAS transport-R 434 to route the UL information transfer 430 to donor eNB 102.

Donor eNB 102 can receive the initial context setup response-R 432 and can generate an initial context setup response 436 S1-AP message that includes the eNB UE S1AP ID, or other identifier of donor eNB 102 used for downlink traffic on S1-U, instead of the relay UE ID along with a TEID of the donor eNB 102, for example. Donor eNB 102 can transmit the initial context setup response 436 to MME/core network 402. In addition, for example, donor eNB 102 can generate an uplink NAS transport 438 for communicating the session management response received in uplink NAS transport-R 434. Moreover, the uplink NAS transport 438 can include an eNB UE ID or other identifier mapped to the relay UE ID at donor eNB 102. Donor eNB 102 can communicate the session management response in the uplink NAS transport 438 to MME/core network 402. It is to be appreciated that one or more components in MME/core network 402 can perform additional functionalities to process the session management response, such as updating bearers in the core network to support UE 110 communication, perform session modification, and/or the like.

Figure 7:
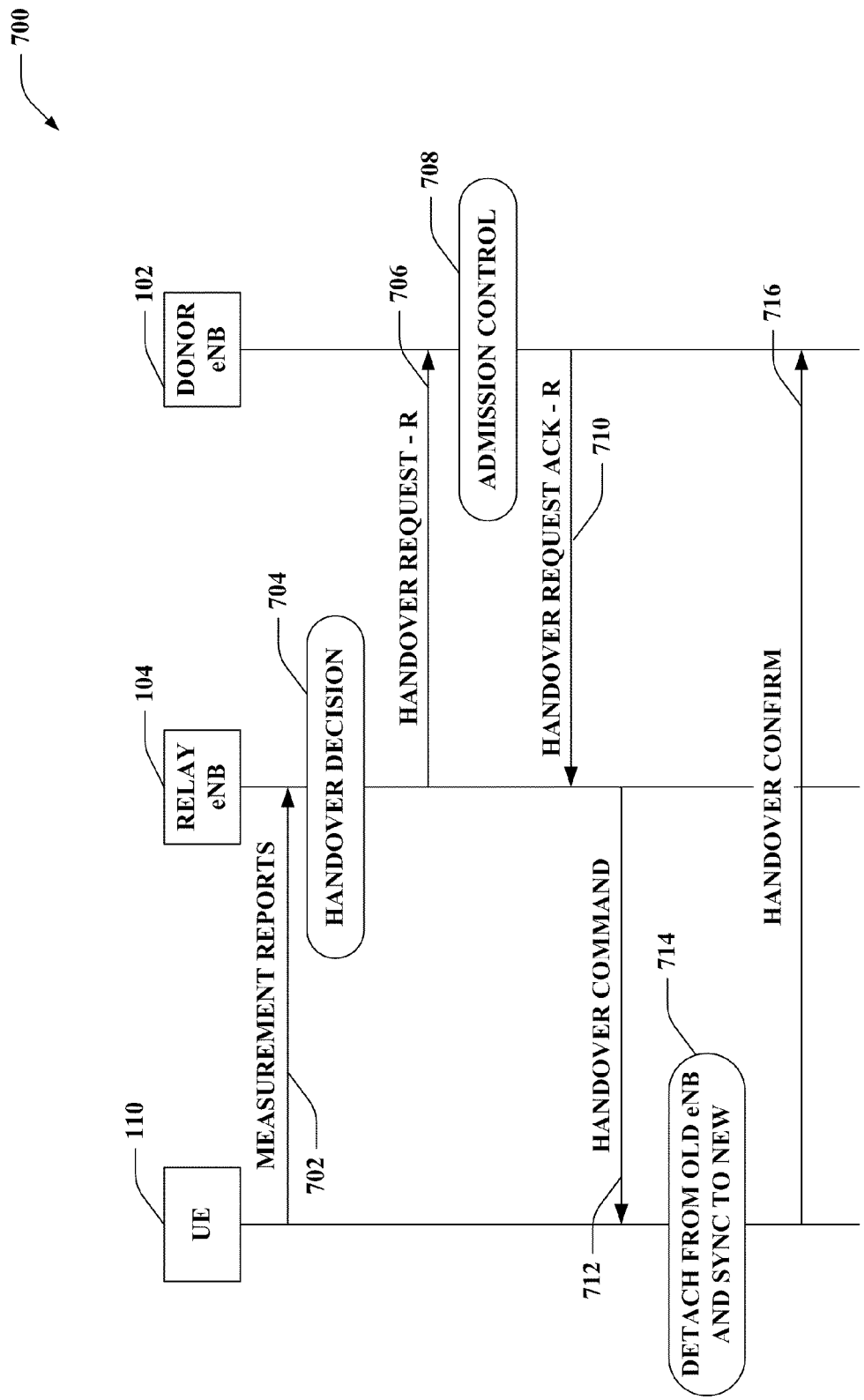
FIG. 7 is an illustration of an example wireless communications system that facilitates intra-cluster handover to a donor eNB using RAPP layer messages.

Turning to FIG. 7, an example wireless communication system 700 is illustrated that facilitates intra-cluster handover for a UE from a relay eNB to its donor eNB. System 700 includes a donor eNB 102 that provides relay eNB 104 (and/or other relay eNBs) with access to a core network (not shown). Additionally, as described, relay eNB 104 can provide UE 110 with access to the donor eNB 102. Moreover, for example, there can be multiple relay eNBs 104 between the donor eNB 102 and UE 110. Further, donor eNB 102 can be a macrocell access point, femtocell access point, picocell access point, mobile base station, and/or the like, as described. Relay eNB 104 can similarly be a mobile or stationary relay node that communicates with donor eNB 102 over a wireless or wired backhaul, as described.

In the depicted example, UE 110 can transmit measurement reports 702 to relay eNB 104 that can include one or more communications metrics related to one or more surrounding eNBs (e.g., signal-to-noise ratio (SNR) and/or the like). Relay eNB 104 can make a handover decision 704 based at least in part on the measurement reports (e.g., where donor eNB 102 has a more desirable SNR or other communication metric, desired services, and/or the like). In this example, relay eNB 104 determines to handover UE 110 to donor eNB 102 and transmits a handover request-R 706 to the donor eNB 102 (e.g., through one or more other relay eNBs or otherwise). The handover request-R 706 can be defined for RAPP communications and can be similar to a handover request message in an X2 interface additionally including information regarding relay radio bearer IDs to be setup, RRC context information, control plane security information, etc. In this regard, handover request-R 706 can have a format similar to the following:

| IE/Group Name |
|---|
| Message Type |
| Transaction ID |
| Cause |
| Target Cell ID |
| UE Context Information |
| > Aggregate Maximum Bit Rate |
| > Subscriber Profile ID for RAT/Frequency priority |
| >SAE Bearers To Be Setup List |
| >>SAE Bearer Info |
| >>>Relay Radio Bearer ID |
| >>> SAE Bearer ID |
| >>> SAE Bearer Level QoS Parameters |
| > RRC Context |
| >Handover Restriction List |
| >Location Reporting Information |
| Control Plane Security Information |
| UE History Information |
| Trace Activation |

Thus, for example, the relay radio bearer IDs can relate to relay radio bearers established with UE 110, as described previously. In addition, control plane security information can relate to one or more parameters for decrypting UE 110 communications in the control plane. The transaction ID can be assigned by relay eNB 104 as a reference for a subsequent communication.

Donor eNB 102 can perform admission control 708, which can include determining allocation of bandwidth among bearers or other streams for communicating with donor eNB 102. Donor eNB 102 can the transmit a handover request acknowledgment (ACK)-R 710 to relay eNB 104, which again can be a message defined for RAPP communications. For example, the handover request ACK-R 710 can have a format similar to the following:

| IE/Group Name |
| --- |
| Message Type |
| Transaction ID |
| Relay UE ID |
| SAE Bearers Admitted List |
| > SAE Bearer Info |
| >>Relay Radio Bearer ID |
| >> SAE Bearer ID |
| SAE Bearers Not Admitted List |
| > SAE Bearer Info |
| >>Relay Radio Bearer ID |
| >> SAE Bearer ID |
| >> Cause |
| Target eNB To Source eNB Transparent Container |
| Criticality Diagnostics |

Thus, handover request ACK-R 710 can be similar to a handover request ACK in X2 additionally including a transaction ID (e.g., the transaction ID from the handover request-R 706), a relay UE ID, and relay radio bearer IDs for bearers established at donor eNB 102 (and/or bearers not established at donor eNB 102). Relay eNB 104 can transmit a handover command 712 to UE 110 to complete handover. UE 110 can detach from the old eNB (relay eNB 104) and synchronize to the new eNB (donor eNB 102) 714, and UE 110 can transmit a handover confirm 716 to donor eNB 102 to complete handover thereto.

Figure 8:
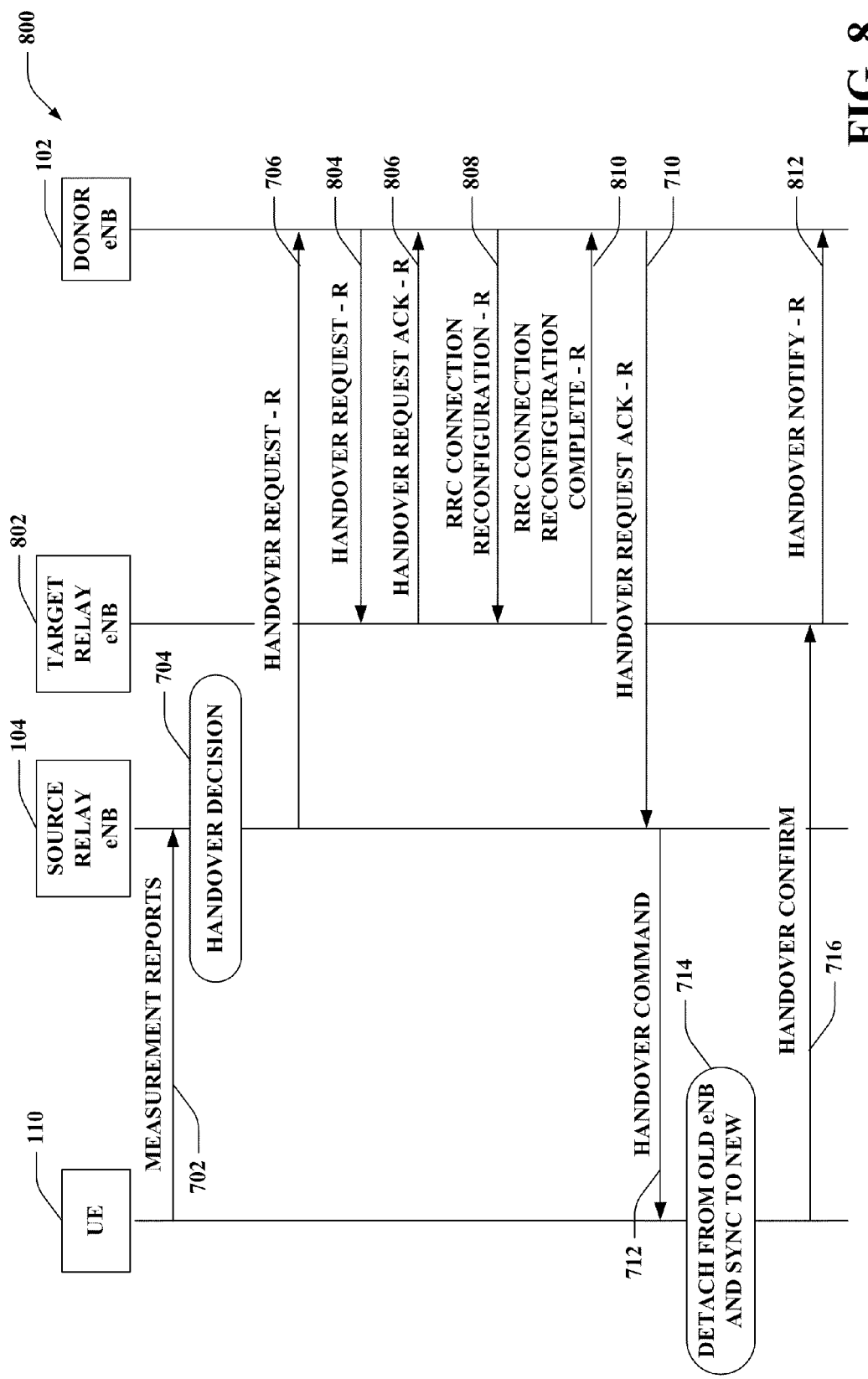
FIG. 8 is an illustration of an example wireless communications system that facilitates intra-cluster handover to a relay eNB using RAPP layer messages.

Turning to FIG. 8, an example wireless communication system 800 is illustrated that facilitates intra-cluster handover for a UE to a disparate relay eNB. System 800 includes a donor eNB 102 that provides source relay eNB 104 and target relay eNB 802 (and/or other relay eNBs) with access to a core network (not shown). Additionally, as described, source relay eNB 104 can provide UE 110 with access to the donor eNB 102. Moreover, for example, there can be multiple relay eNBs between the donor eNB 102 and UE 110. Further, donor eNB 102 can be a macrocell access point, femtocell access point, picocell access point, mobile base station, and/or the like, as described. Source relay eNB 104 and target relay eNB 802 can similarly be mobile or stationary relay nodes that communicate with donor eNB 102 over a wireless or wired backhaul, as described.

In the depicted example, UE 110 can transmit measurement reports 702 to source relay eNB 104 that can include one or more communications metrics related to one or more surrounding eNBs (e.g., signal-to-noise ratio (SNR) and/or the like), such as target relay eNB 802. Source relay eNB 104 can make a handover decision 704 based at least in part on the measurement reports (e.g., where target relay eNB 802 has a more desirable SNR or other communication metric, desired services, and/or the like). In this example, source relay eNB 104 determines to handover UE 110 to target relay eNB 802, which is in the same cluster as source relay eNB 104, and transmits a handover request-R 706 to the donor eNB 102 (e.g., through one or more other relay eNBs or otherwise), as described above.

Donor eNB 102 can transmit a handover request-R 804 to target relay eNB 802—this can be the same as handover request-R 708. Target relay eNB 802 can similarly attempt to setup one or more bearers corresponding to the relay radio bearer IDs in the handover request-R 804 and can transmit a handover request ACK-R 806, as described, indicating the bearers setup (and/or one or more bearers not setup). Donor eNB 102 can transmit an RRC connection reconfiguration-R 808, as described, to initialize the one or more bearers, and target relay eNB 802 can transmit an RRC connection reconfiguration complete-R 810 indicating the bearers successfully initialized. Donor eNB 102 can subsequently transmit a handover request ACK-R 810 to source relay eNB 104, as described previously, to indicate acknowledgement for handover, as well as the bearers setup and initialized at target relay eNB 802 for UE 110.

Source relay eNB 104 can transmit a handover command 712 to UE 110 to complete handover. UE 110 can detach from the old eNB (source relay eNB 104) and synchronize to the new eNB (target relay eNB 802) 714, and UE 110 can transmit a handover confirm 716 to target relay eNB 802 to complete handover thereto. Target relay eNB 802 can additionally notify donor eNB 102 of the handover using a handover notify-R 812. The handover notify-R 812 can be defined for RAPP communications and can be similar to a handover notify in X2 additionally including a relay UE ID related to UE 110 and target relay eNB 802 (and/or associated with source relay eNB 104). Handover notify-R 812 can have a format similar to the following:

| IE/Group Name |
| --- |
| Message Type |
| Relay UE ID |
| E-UTRAN CGI |

Donor eNB 102 can update routing tables and/or other structures that utilize the relay UE ID for routing packets to UE 110 to include the relay UE ID specified in the handover notify-R 812, for example.

Figure 9:
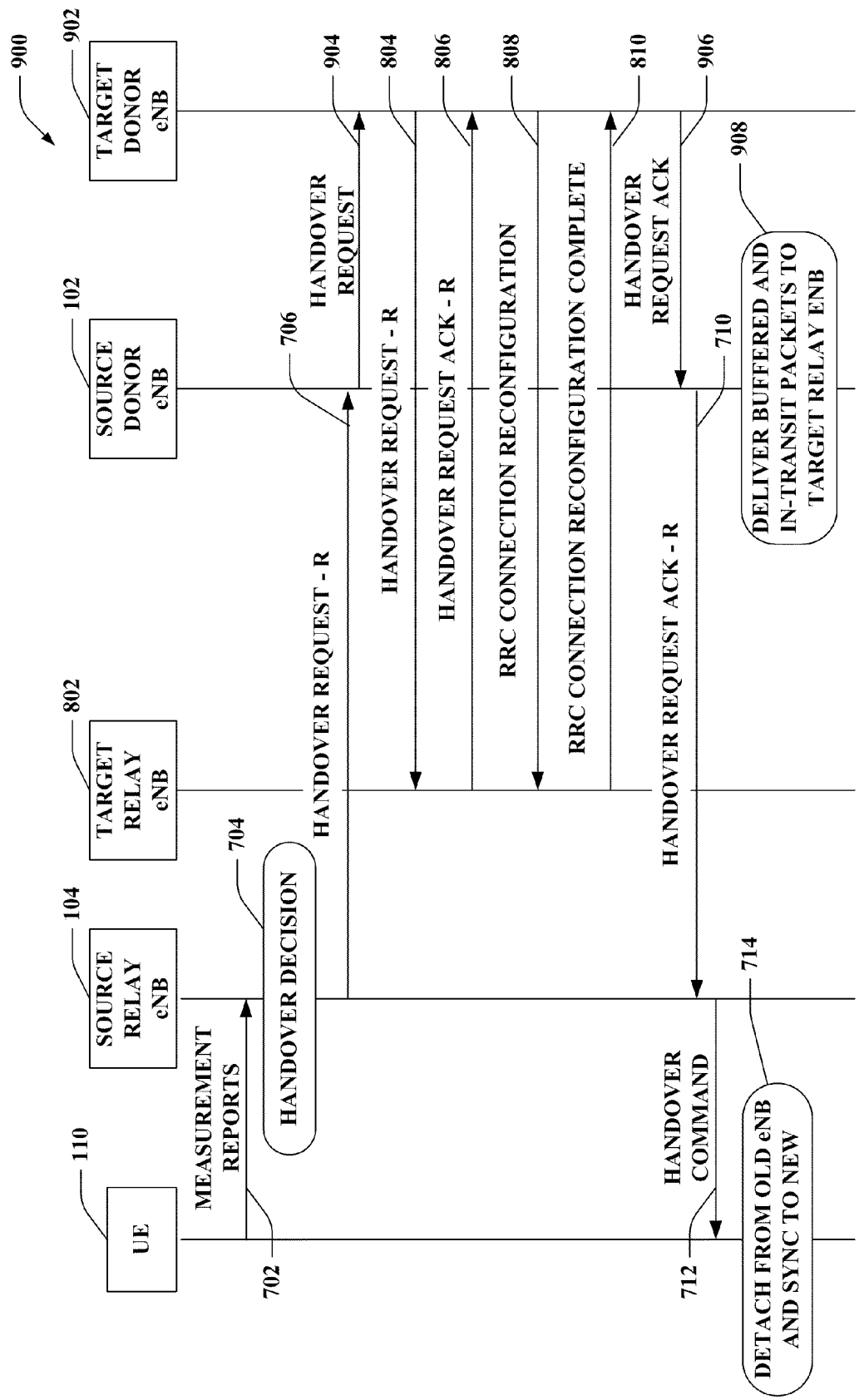
FIG. 9 is an illustration of an example wireless communications system that facilitates inter-cluster handover using RAPP layer messages.
Figure 10:
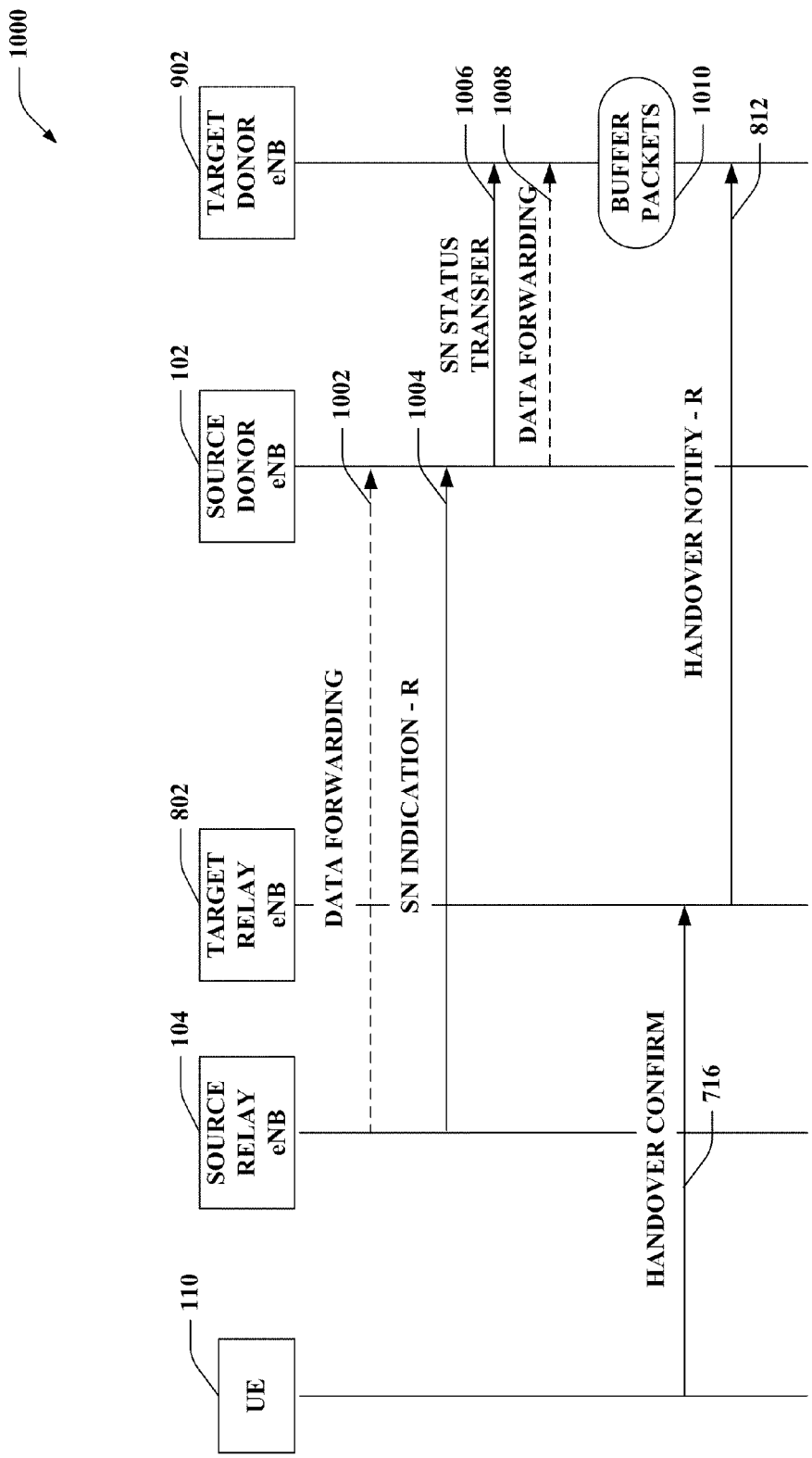
FIG. 10 is an illustration of an example wireless communications system that provides context information during inter-cluster handover using RAPP layer messages.

Referring now to FIGS. 9-10, example wireless communication systems 900 and 1000 are illustrated that facilitate inter-cluster handover for a UE to a disparate relay eNB or donor eNB in a disparate cluster. Systems 900 and 1000 include a source donor eNB 102 that provides source relay eNB 104 (and/or other relay eNBs) with access to a core network (not shown). Additionally, as described, source relay eNB 104 can provide UE 110 with access to the donor eNB 102. Moreover, for example, there can be multiple relay eNBs between the donor eNB 102 and UE 110. Similarly, target relay eNB 802 can communicate with target donor eNB 902 to receive and provide access to a core network. Furthermore, source donor eNB 102 and/or target donor eNB 902 can be macrocell access points, femtocell access points, picocell access points, mobile base stations, and/or the like, as described. Source relay eNB 104 and target relay eNB 802 can similarly be mobile or stationary relay nodes that communicate with donor eNB 102 over a wireless or wired backhaul, as described. In one example, FIG. 10 illustrates communications occurring among the displayed nodes after handover in FIG. 9.

In FIG. 9, UE 110 can transmit measurement reports 702 to source relay eNB 104 that can include one or more communications metrics related to one or more surrounding eNBs (e.g., signal-to-noise ratio (SNR) and/or the like), such as target relay eNB 802. Source relay eNB 104 can make a handover decision 704 based at least in part on the measurement reports (e.g., where target relay eNB 802 has a more desirable SNR or other communication metric, desired services, and/or the like). In this example, source relay eNB 104 determines to handover UE 110 to target relay eNB 802, which is served by target donor eNB 902, and transmits a handover request-R 706 to source donor eNB 102 (e.g., through one or more other relay eNBs or otherwise), as described above. For example, handover request-R 706 can be similar to a handover request in X2 but excluding security parameters.

Source donor eNB 102 can transmit a handover request 904 to target donor eNB 902, which can relate to an X2 message, as described previously. In this regard, source donor eNB 102 converts the handover request-R 706 to the handover request 904, which can include replacing a relay UE ID field with an eNB UE S1AP ID or similar value, as described. Moreover, source donor eNB 102 can include a security key (e.g., KeNB) for interpreting secured communications from UE 110 in the handover request 904. In addition, one or more relay radio bearers IDs can be removed from the handover request-R 706 to create handover request 904 and replaced by transport layer addresses, GTP TEIDs, and/or the like, as described.

In another example, an S1 protocol can be utilized to communicate between source donor eNB 102 and target donor eNB 902 (e.g., where X2 is not available), in which case donor eNB 102 can transmit the handover request 904 to one or more components of a core network (not shown) for providing to target donor eNB 902. In this example, handover request 904 can be defined for use with S1 and can include similar parameters as the handover request 904 in X2. Furthermore, one or more core network components for target donor eNB 902 (e.g., an MME, SGW, PGW, etc.) can additionally establish SAE bearers as defined in the handover request 904 for UE 110. In either case, target donor eNB 902 can generate a handover request-R 804 for transmitting to target relay eNB 802 (e.g., through one or more intermediary relay eNBs or otherwise), which can again be similar to handover request 904 with additional or subtracted fields related to the RAPP definition of handover request-R 804. In addition, target donor eNB 902 can calculate a security key (e.g., RRC key) and include the key in handover request-R 804 (e.g., as part of the control plane security information, as described above).

Target relay eNB 802 can attempt to setup one or more bearers corresponding to the relay radio bearer IDs in the handover request-R 804 and can transmit a handover request ACK-R 806, as described, indicating the bearers setup (and/or one or more bearers not setup) to target donor eNB 902. The handover request ACK-R 806 can additionally include a transaction ID indicated in handover request-R 804 and an assigned relay UE ID for UE 110. Target donor eNB 902 can transmit an RRC connection reconfiguration-R 808, as described, to initialize the one or more bearers, as described, and target relay eNB 802 can transmit an RRC connection reconfiguration complete-R 810 indicating the bearers successfully initialized. Target donor eNB 902 can subsequently transmit a handover request ACK to source donor eNB 102, over an X2 or S1 interface, as described above. Source donor eNB 102 can transmit a handover request ACK-R 810 to source relay eNB 104, as described previously, to indicate acknowledgement for handover as well as the bearers setup and initialized at target relay eNB 802 for UE 110.

Source relay eNB 104 can transmit a handover command 712 to UE 110 to complete handover. UE 110 can detach from the old eNB (source relay eNB 104) and synchronize to the new eNB (target relay eNB 802) 714. Source donor eNB 102 can deliver buffered and in-transit packets to target relay eNB 802 908. In this regard, target relay eNB 802 can receive the buffered and in-transit packets for effectively continuing communications with UE 110.

In FIG. 10, once UE 110 has been handed over to target relay eNB 802, source relay eNB 104 can perform data forwarding 1002 to source donor eNB 102, which includes providing UL packets in the receive buffer of source relay eNB 104. In addition, source relay eNB 104 can transmit a sequence number (SN) indication-R 1004 to source donor eNB 102, which can be defined in RAPP for communicating information about served UEs, such as SN status for given bearers in the source relay eNB 104, to facilitate handover thereof. For example, SN indication-R 1004 can be similar to SN indication in X2 defined for transferring contexts for handover additionally including a relay UE ID and one or more relay radio bearer IDs. For example, SN indication-R 1004 can have a format similar to the following:

| IE/Group Name |
|---|
| Message Type |
| UE List |
| > UE Item |
| >>Relay UE ID |
| >>SAE Bearers Subject To Status Transfer List |
| >>>SAE Bearers Subject To Status Transfer Item |
| >>>> Relay Radio Bearer ID |
| >>>> SAE Bearer ID |
| >>>> DL COUNT Value |

The DL COUNT value, for example, can relate to a sequence number the target relay eNB 802 should assign to the next DL (SDU) not having an SN (e.g., the last successfully transmitted DL PDCP SN related to the corresponding SAE bearer). Source donor eNB 102, upon receiving the SN indication-R 1004, can generate and transmit an SN status transfer to target donor eNB 902 to provide information regarding communicating with one or more UEs being handed over.

It is to be appreciated, as described, that source donor eNB 102 can provide the SN status transfer 1006 directly to target donor eNB 902 over X2 or through a core network utilizing S1. In addition, source donor eNB 102 can perform data forwarding 1008 to target donor eNB 902 to provide the UL packets in the receive buffer of source relay eNB 104. UE 110 can transmit a handover confirm 716 to target relay eNB 802 to complete handover thereto. Target relay eNB 802 can additionally notify target donor eNB 902 of the handover using a handover notify-R 812, as described. Target donor eNB 902 can update routing tables and/or other structures that utilize the relay UE ID for routing packets to UE 110 to include the relay UE ID specified in the handover notify-R 812, for example. In addition, target donor eNB 902 can begin forwarding the UL data received in data forwarding 1008 to target relay eNB 802 for providing to UE 110. Similarly, UE 110 can begin transmitting UL data to target relay eNB 802 for forwarding to target donor eNB 902, as described. In addition, for example, target relay eNB 802 can utilize the security key received in the handover request 904 (shown in FIG. 9) for communicating with UE 110.

Figure 11:
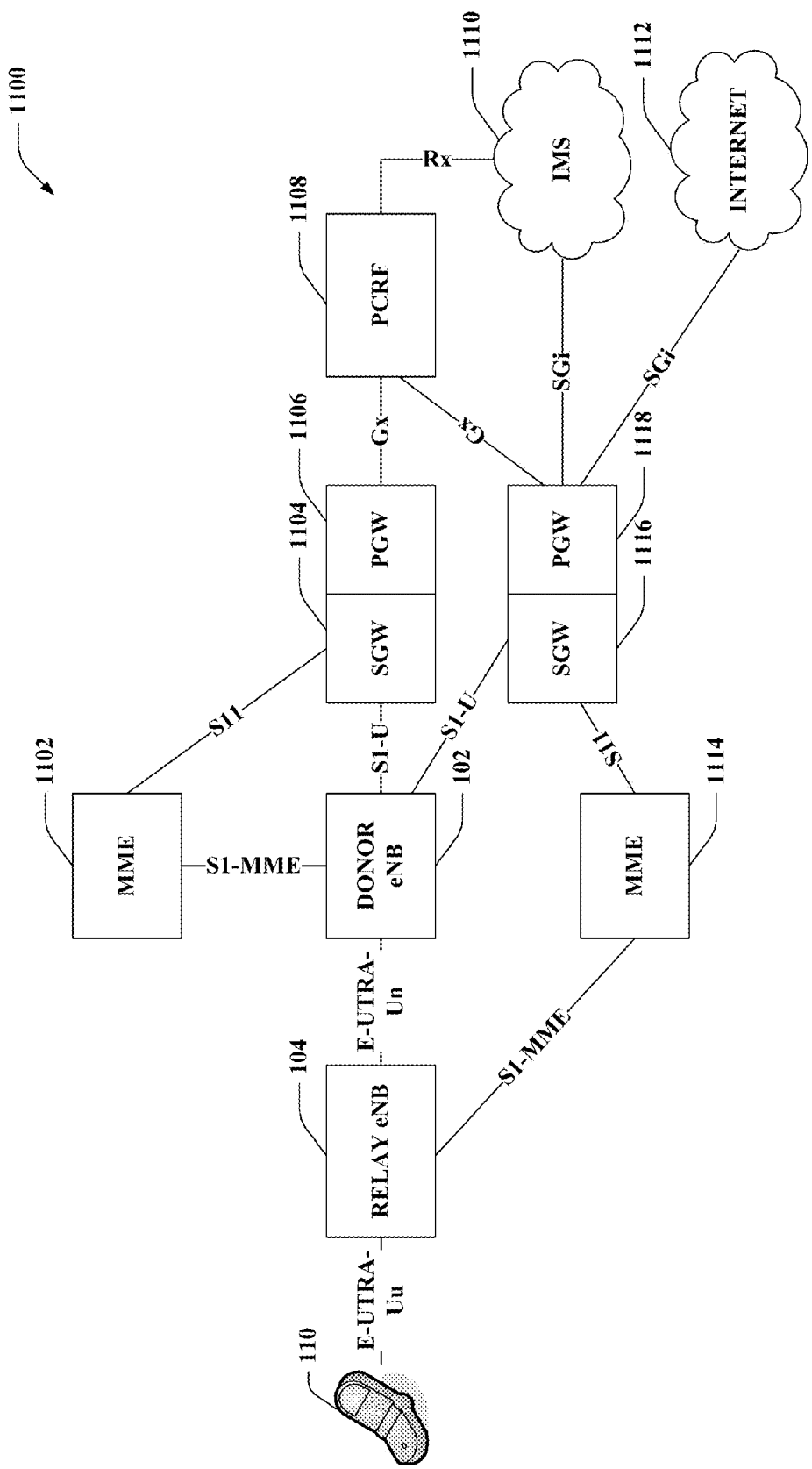
FIG. 11 is an illustration of an example wireless communications system that utilizes cell relays to provide access to a wireless network.

Now turning to FIG. 11, an example wireless communication network 1100 that provides split-cell relay functionality is depicted. Network 1100 includes a UE 110 that communicates with a relay eNB 104, as described, to receive access to a wireless network. Relay eNB 104 can communicate with a donor eNB 102 to provide access to a wireless network, and as described, donor eNB 102 can communicate with an MME 1102 and/or SGW 1104 that relate to the relay eNB 104. SGW 1104 can connect to or be coupled with a PGW 1106, which provides network access to SGW 1104 and/or additional SGWs. PGW 1106 can communicate with a PCRF 1108 to authenticate/authorize UE 110 to use the network, which can utilize an IMS 1110 to provide addressing to the UE 110 and/or relay eNB 104.

According to an example, MME 1102 and/or SGW 1104 and PGW 1106 can be related to donor eNB 102 serving substantially all relay eNBs in the cluster. Donor eNB 102 can also communicate with an SGW 1116 and PGW 1118 that relate to the UE 110, such that the PGW 1118 can assign UE 110 a network address to facilitate tunneling communications thereto through the relay eNB 104, donor eNB 102, and SGW 1116. Moreover, for example, SGW 1116 can communicate with an MME 1114 to facilitate control plane communications to and from the UE 110. It is to be appreciated that MME 1102 and MME 1114 can be the same MME, in one example. PGW 1118 can similarly communicate with a PCRF 1108 to authenticate/authorize UE 110, which can communicate with an IMS 1110. In addition, PGW 1118 can communicate directly with the IMS 1110 and/or internet 1112.

In an example, UE 110 can communicate with the relay eNB 104 over one or more radio protocol interfaces, such as an E-UTRA-Uu interface, as described, and the relay eNB 104 can communicate with the donor eNB 102 using one or more radio protocol interfaces, such as an E-UTRA-Un or other interface. As described, relay eNB 104 can leave a PDCP layer of packets from UE 110 intact, while retrieving one or more parameters from the PDCP header. In this regard, encryption/decryption, security, and or other procedures can be performed by UE 110 and donor eNB 102, such that relay eNB 104 does not need to perform such tasks.

In addition, as described, relay eNB 104 can translate control data packets received from UE 110 to RAPP layer packets for routing to donor eNB 102 through potentially one or more additional relay eNBs (not shown). Donor eNB 102 communicates with the MME 1102 using an S1-MME interface and the SGW 1104 and PGW 1106 over an S1-U interface, as depicted. The transport and/or application layers used over the S1-MME and S1-U interfaces are terminated at the donor eNB 102, as described. In this regard, upon receiving communications for the relay eNB 104 from the MME 1102 or SGW 1104, donor eNB 102 decouples upper layers from the transport and/or application layer by defining a new transport and/or application layer packet and transmitting the upper layer communication to the relay eNB 104 in the new transport/application layer packet (over the E-UTRA-Un interface, in one example).

Upon transmitting control plane communications from the relay eNB 104 to the MME 1102, donor eNB 102 can indicate an identifier of the relay eNB 104 (e.g., in an S1-AP message), and MME 1102 can transmit the identifier in responding communications to the donor eNB 102. In one example described previously, donor eNB 102 can determine the identifier based on a relay UE identifier received from relay eNB 104 in the control plane communications (e.g., as a RAPP layer parameter). In an example, donor eNB 102 can insert the determined identifier in the TEID of a GTP-U header, etc. SGW 1104 can transmit the TEID in a responding GTP-U header such that donor eNB 102 can determine the relay eNB 104, or one or more downstream relay eNBs, is to receive the translated packet, as described above. For example, this can be based at least in part on locating at least a portion of the TEID in a routing table at donor eNB 102 associated with the relay UE identifier.

Thus, upon receiving a packet from SGW 1104 (or SGW 1116), donor eNB 102 can determine a relay UE identifier related to the packet (e.g., from a routing table), create a disparate packet with a RAPP layer including the relay UE identifier, and transmit the disparate packet to the appropriate relay eNB, which can be relay eNB 104 in this example. Relay eNB 104 can accordingly translate the RAPP layer to an application layer of a disparate packet for transmitting to UE 110 based on the relay UE identifier, as described. These foregoing functionalities can mitigate the need for user datagram protocol (UDP)/internet protocol (IP) routing on the backhaul link between various eNBs, for example. In addition, headers can be compressed between donor eNB 102 and UE 110, in one example, as described. As shown, MME 1102 can communicate with SGW 1104, and MME 1114 to SGW 1116, using an S11 interface. PGWs 1106 and 1118 can communicate with PCRF 1108 over a Gx interface. Furthermore, PCRF 1108 can communicate with IMS 1110 using an Rx interface, and PGW 1118 can communicate with IMS 1110 and/or the internet 1112 using an SGi interface.

Figure 12:
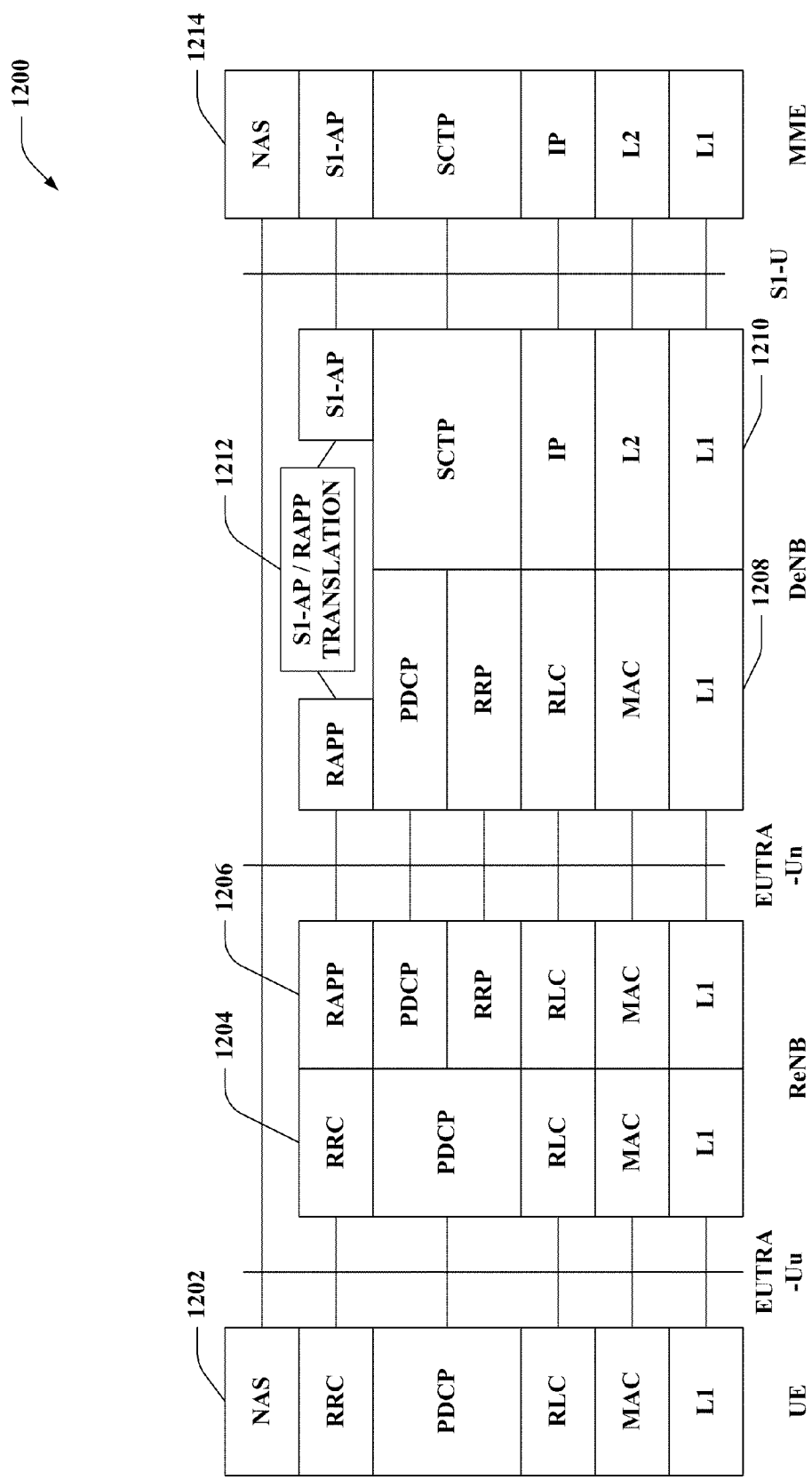
FIG. 12 is an illustration of example protocol stacks that facilitate providing split-cell relay functionality for control data communications.

Referring to FIG. 12, example protocol stacks 1200 are illustrated that facilitate communicating in a wireless network to provide split-cell relay functionality for control plane communications. A UE protocol stack 1202 is shown comprising an L1 layer, MAC layer, an RLC layer, a PDCP layer, an RRC layer, and a NAS layer. A relay eNB (ReNB) access link protocol stack 1204 is depicted having an L1 layer, MAC layer, RLC layer, PDCP layer, and RRC layer, along with an ReNB backhaul link protocol stack 1206 having an L1 layer, MAC layer, RLC layer, RRP layer, a PDCP layer, and a RAPP layer, which as described can communicate data from the RRC layer including one or more parameters related to routing the data and/or excluding one or more parameters related to interpreting the data. A donor eNB (DeNB) access link protocol stack 1208 is also shown having an L1 layer, MAC layer, RLC layer, RRP layer, PDCP layer, which is terminated at the DeNB as described, and a RAPP layer, along with a DeNB backhaul link protocol stack 1210 having an L1 layer, L2 layer, IP layer, stream control transmission protocol (SCTP) layer, and an S1-AP layer. Between the DeNB access link protocol stack 1208 and the DeNB backhaul link protocol stack 1210, the DeNB can also include an S1-AP/RAPP translation 1212, as described. MME protocol stack 1214 has an L1 layer, L2, layer, IP layer, SCTP layer, S1-AP layer, and a NAS layer.

According to an example, a UE can communicate with an ReNB to receive access to an MME for authenticating the UE. In this regard, UE can communicate over L1, MAC, RLC, PDCP, and RRC layers with the ReNB over a EUTRA-Uu interface (e.g., to configure the UE for IP communications with the MME), as shown between protocol stacks 1202 and 1204. The UE can tunnel NAS layer communications through the ReNB and other entities to the MME, which can confirm authentication for the UE, as shown between protocol stacks 1202 and 1214. To facilitate such tunneling, the ReNB communicates with a DeNB over L1, MAC, RLC, RRP, PDCP, and RAPP layers using an EUTRA-Un interface, as shown between protocol stacks 1206 and 1208. As described, the ReNB can create a RAPP communication from the RRC communication by inserting a related relay UE identifier that corresponds to the ReNB and the UE.

In addition, the RRP layer can be generated to otherwise tunnel PDCP layer communications to DeNB, allowing security termination for the PDCP layer at DeNB, as shown between protocol stacks 1206 and 1208. In this regard, the RRP layer can similarly specify an identifier to facilitate routing packets among relay eNBs and DeNB, which can include an RRP ID comprising the relay UE identifier, or similar association of an identifier of ReNB and an identifier of UE, along with an identifier of a radio bearer over which ReNB communicates with UE. The ReNB and DeNB can route packets to/from the UE, through various intermediary ReNBs in one example, using the RRP layer and RRP ID. In another example, the RAPP layer and the relay UE identifier can be utilized for similar routing.

The DeNB can receive UE communications from the ReNB and terminate the PDCP layer. This can include applying encryption/decryption, security procedures, and/or the like, such that ReNB need not perform such procedures for UE communication. In addition, S1-AP/RAPP translation 1212 can be performed on the RAPP layer to create an S1-AP layer for the communication, as described. Thus, for example, the transport layer can be terminated and translated to an SCTP context established with MME, and the RAPP layer including the NAS message can be translated to S1-AP, which can include removing a relay UE identifier, adding a disparate identifier for the UE established or otherwise stored at MME, etc. The DeNB can transmit the NAS payload to the MME over the S1-AP layer, as shown between protocol stacks 1210 and 1214.

Similarly, the DeNB can receive packets from the MME over an S1-AP and other layers comprising a NAS communication for the UE, as shown over protocol stacks 1214 and 1210. DeNB can similarly receive the S1-AP layer communication and S1-AP/RAPP translation 1212 can be performed to create a RAPP layer for a disparate packet. For example, as described, this can include inserting a relay UE identifier in the RAPP packet, removing one or more security parameters, inserting one or more relay radio bearer IDs related to radio bearers to be established for one or more SAE bearers, and/or the like. DeNB can transmit the packet with the RAPP layer to ReNB for providing to a ReNB serving the UE, as shown between protocol stacks 1208 and 1206. In addition, DeNB can add a PDCP layer with a context established with the UE and an RRP layer for routing as well, for example. ReNB can obtain the packet with the RAPP layer and can create an RRC layer for communicating a payload of the RAPP layer packet to UE (e.g., over one or more additional layers). Where the RAPP layer communication includes one or more identifiers of radio bearers to be established, ReNB can establish the radio bearers with UE, as described, to facilitate communicating data from an SAE bearer of the MME to the UE. In any case, ReNB can transmit the RRC communication to the UE based at least in part on the relay UE identifier, as shown between protocol stacks 1204 and 1202, and the UE can process the NAS message in the RRC payload.

Figure 13:
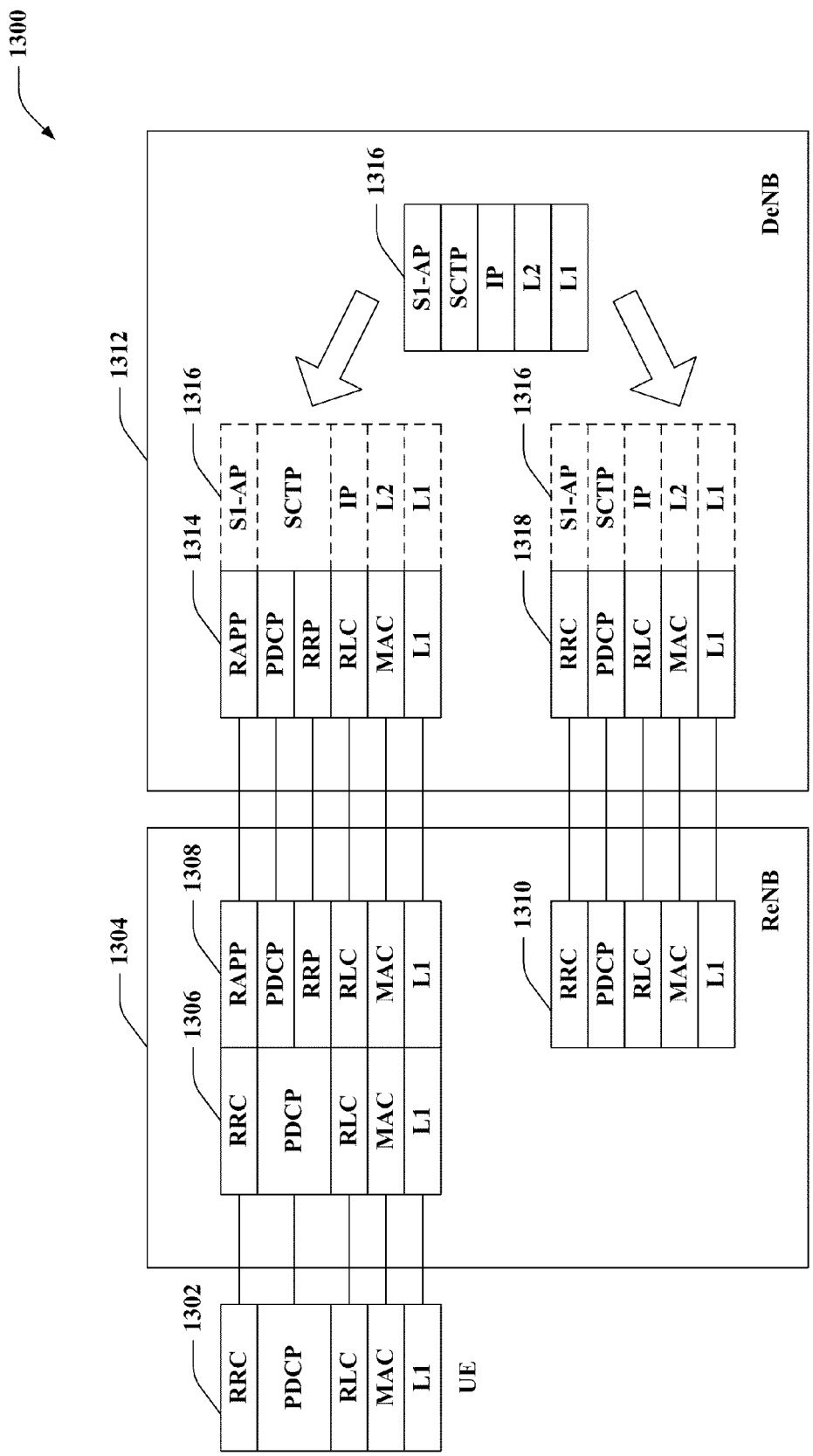
FIG. 13 is an illustration of example protocol stacks that facilitate interfacing with UEs and relay eNBs for control data communications.

Referring to FIG. 13, example protocol stacks 1300 are illustrated that facilitate communicating in a wireless network to provide split-cell relay functionality for control plane communications. A protocol stack 1302 for a UE is shown comprising an L1 layer, MAC layer, an RLC layer, a PDCP layer, and an RRC layer. ReNB protocol stacks 1304 are additionally shown including an ReNB access link protocol stack 1306, which comprises an L1, MAC, RLC, RRP, PDCP, and RAPP layers, as described. ReNB protocol stacks 1304 also include a plurality of ReNB backhaul link protocol stacks 1308 and 1310. ReNB backhaul link protocol stack 1308 supports communications for a UE in conjunction with ReNB access link protocol stack 1306. ReNB backhaul link protocol stack 1308 includes an L1 layer, MAC layer, RLC layer, RRP layer, PDCP layer, and a RAPP layer, as described previously.

ReNB backhaul link protocol stack 1310 is also provided that includes an L1 layer, MAC layer, RLC layer, PDCP layer, and RRC layer. ReNB backhaul link protocol stack 1310 can relate to communicating directly with a DeNB for communications intended for the ReNB. In addition, DeNB protocol stacks 1312 are illustrated that include access link protocol stacks 1314 and 1318 that are respectively utilized for communicating packets intended for a UE and a ReNB, as well as a DeNB backhaul link protocol stack 1316 that can support communications to the UE and ReNB. As depicted, DeNB access link protocol stack 1314 can include an L1 layer, MAC layer, RLC layer, RRP layer, PDCP layer, and RAPP layer configured to receive communications from the ReNB backhaul with the same layers. DeNB access link protocol stack 1318 can include an L1, MAC, RLC, PDCP, and RRC layer for communicating with the ReNB. DeNB backhaul link protocol stack 1316 can include an L1, L2, IP, SCTP, and S1-AP layer for communicating data to a core network (not shown).

According to an example, the UE can transmit communications to the ReNB for providing to a core network. UE can communicate with the ReNB over an RRC layer, as shown between protocol stacks 1302 and 1306. ReNB can translate the RRC communications to RAPP layer communications, as described, which can include a relay UE identifier related to the ReNB and the UE. In addition, ReNB can include a RRP layer for routing communications among multiple ReNBs. The ReNB can communicate control data received from the UE to a DeNB over the RAPP layer, as shown between protocol stacks 1308 and 1314. The DeNB can translate the RAPP layer communications to S1-AP, as described above, and transmit the S1-AP communications a core network over an SCTP layer, for example, as depicted in DeNB backhaul link protocol stack 1316. In addition, as illustrated in DeNB backhaul link protocol stack 1316, DeNB can transmit the SCTP layer using an IP layer established with the core network.

Moreover, for example, the DeNB can receive communications from a core network over DeNB backhaul link protocol 1316 using an S1-AP application layer. Where the communications relate to the UE, the DeNB can translate the backhaul link communications from S1-AP to RAPP, as described, and transmit the RAPP layer communications over a PDCP with a context established with the UE and an RRP for routing the communications among multiple ReNBs. The DeNB can transmit the RAPP layer communications to the ReNB, as shown between protocol stacks 1314 and 1308. The ReNB can translate the RAPP layer communications to RRC and can transmit the RRC communications to UE based on a relay UE identifier in the RAPP layer, as described and shown between protocol stacks 1306 and 1302.

Similarly, where the communications received from the core network over DeNB backhaul link protocol stack 1316 relate to the ReNB, the DeNB can translate the S1-AP communications to RRC and transmit the communications to the ReNB, as shown between protocol stacks 1318 and 1310, based on an identifier received in the core network communications as described. In addition, for other ReNBs attached to the ReNB depicted, similar procedures can be utilized as for communicating with the UE. For example, the DeNB can communicate with ReNB over RAPP, and the ReNB communicating with the attached ReNB can translate RAPP to RRC for communicating to the attached ReNB.

Referring to FIGS. 14-17, methodologies relating to routing packets using split-cell relays are illustrated. While, for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Figure 14:
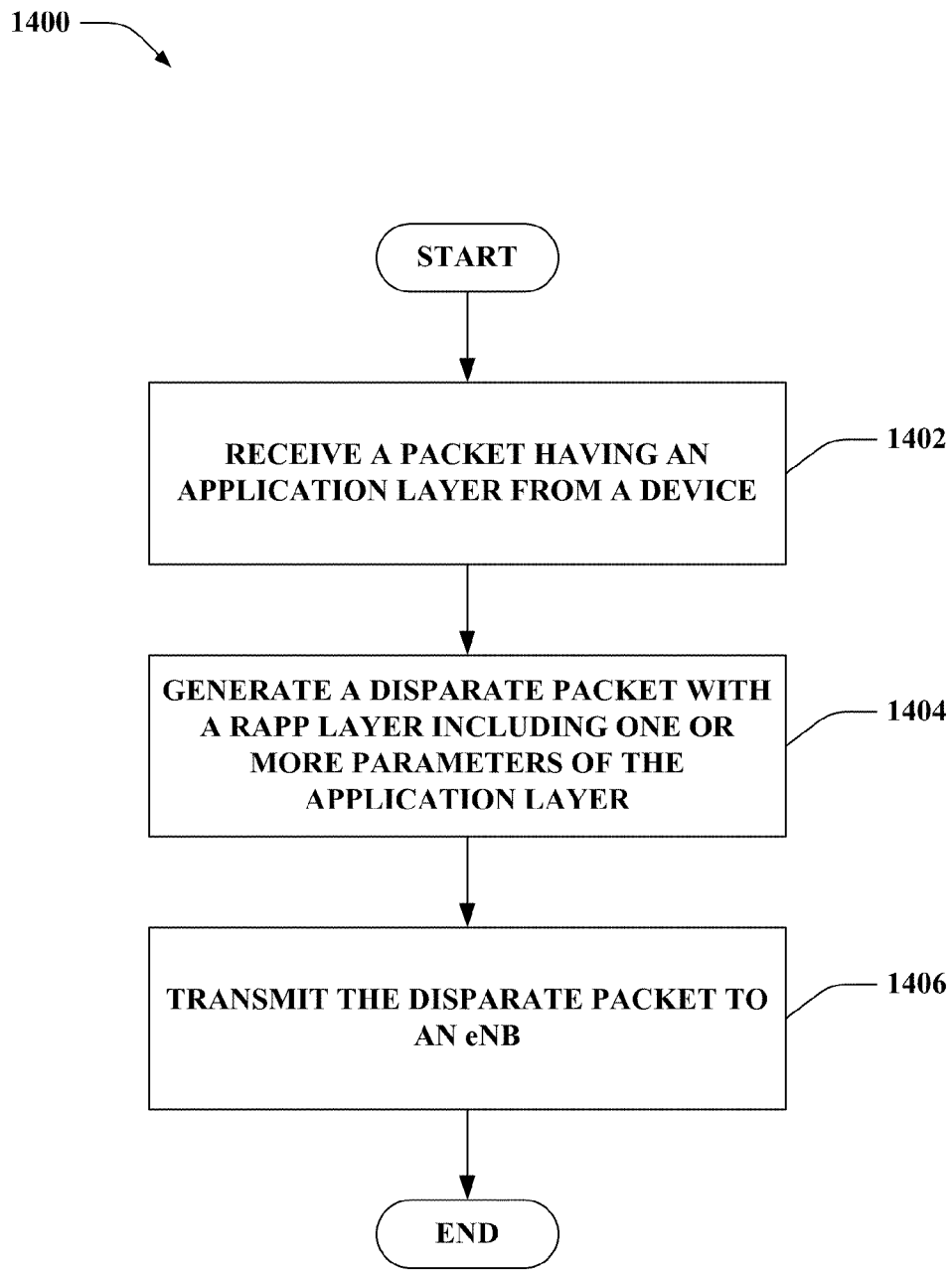
FIG. 14 is an illustration of an example methodology for translating packets to include a RAPP layer for communicating through one or more relay eNBs.

Turning to FIG. 14, an example methodology 1400 that facilitates translating a received packet to a packet with a RAPP layer is illustrated. At 1402, a packet having an application layer can be received from a device. As described above, this can be a control data related communication from a UE, a donor eNB, a relay eNB, a core network, and/or the like. Moreover, as described, the communication can relate to establishing a connection with a network component, requesting or acknowledging bearer establishment, requesting or acknowledging handover, and/or the like. At 1404, a disparate packet with a RAPP layer can be generated to include one or more parameters of the application layer. Thus, for example, the disparate packet can maintain many of the parameters of the application layer of the packet, as described, and can add a relay UE identifier to facilitate identifying a relay eNB that serves a UE related to the packet.

In an example, the relay UE identifier can be utilized to route the disparate packet, where the packet is received from a core network. In another example, the relay UE identifier can be eventually utilized to determine a disparate identifier to communicate received data to a core network, as described. Moreover, the disparate packet with the RAPP layer can be generated to include one or more parameters related to one or more relay radio bearers to establish with a UE, or one or more relay radio bearers previously established with the UE. In addition, the disparate packet with the RAPP layer can be generated to exclude one or more parameters related to security or encryption of an upper layer payload, as described. In another example, the disparate packet can include SN information and/or status transfer information where the packet relates to a handover request, as described. At 1406, the disparate packet can be transmitted to an eNB. As described, this can be a donor eNB, which can forward payload data to a core network for processing, as described, or one or more relay eNBs, which can forward the packet to one or more disparate relay eNBs or communicate a payload to a related UE, as described above.

Figure 15:
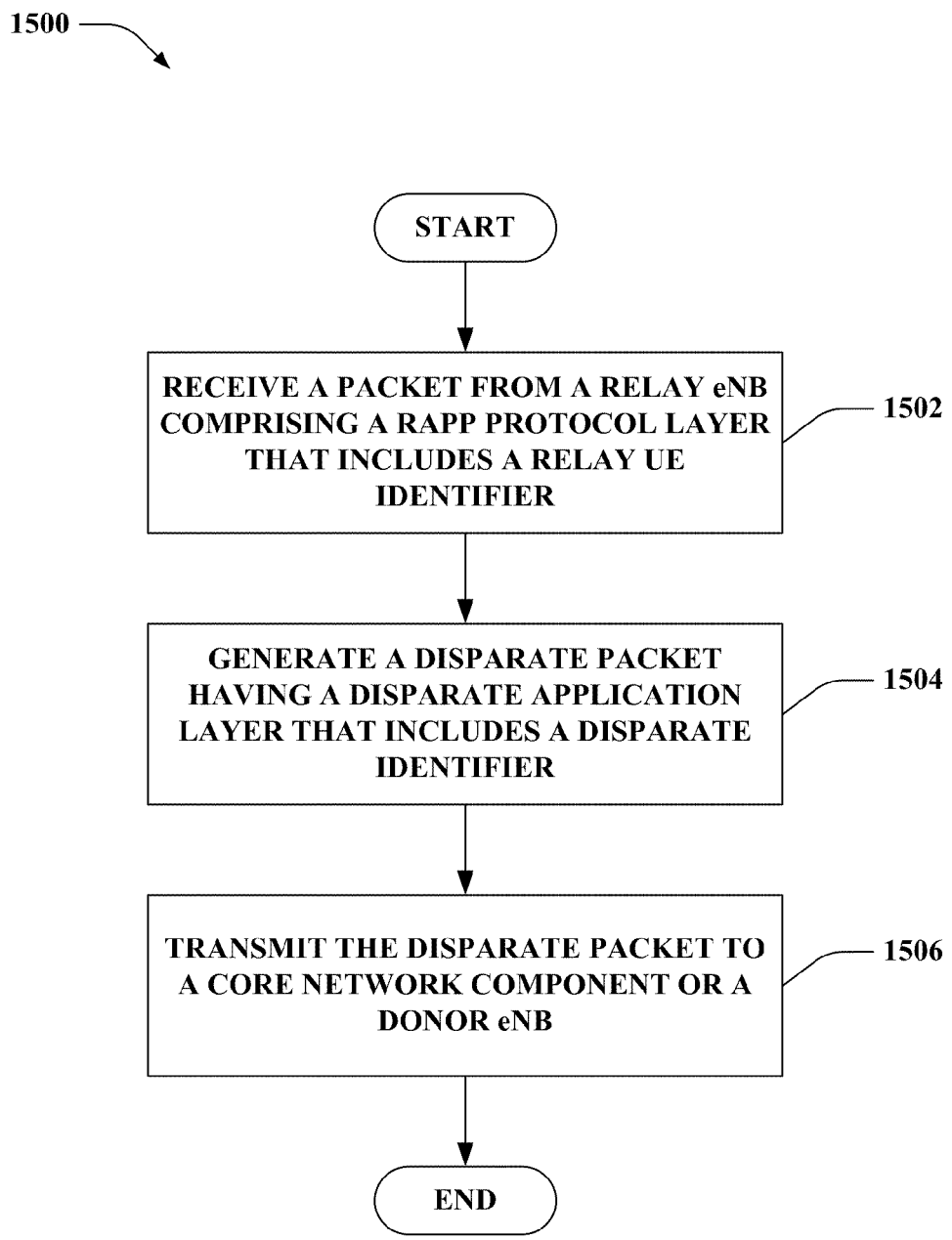
FIG. 15 is an illustration of an example methodology that processes RAPP layer packets to create a disparate application layer for communicating to a core network component or donor eNB.

Referring to FIG. 15, an example methodology 1500 is shown that facilitates translating a RAPP layer in a received packet to a disparate application layer. At 1502, a packet can be received from a relay eNB that comprises a RAPP protocol layer including a relay UE identifier. As described, the packet can relate to establishing connection to a core network, establishing one or more radio bearers with a UE for communications from related SAE bearers in the core network, handing over UE communications within the network (e.g., intra- or inter-cluster), and/or the like. In addition, the relay UE identifier can be utilized to associate responding packets in a core network with a UE, as described, and/or to route packets among various relay eNBs. At 1504, a disparate packet having a disparate application layer that includes a disparate identifier can be generated.

In one example, this can include determining the disparate identifier based on the relay UE identifier. As described, for example, a routing table can be utilized to store associations between the identifiers. In addition, for example, the disparate packet excludes the relay UE identifier of the RAPP layer of the packet, but can include other parameters related to establishing bearers for the relay to communicate with a UE, as described. At 1506, the disparate packet can be transmitted to a core network component or a donor eNB. In one example, where transmitted to a donor eNB, the donor eNB can forward the packet to a related relay eNB (e.g., as indicated by an identifier in the disparate application layer of the disparate packet) by creating a corresponding RAPP layer packet, as described.

Figure 16:
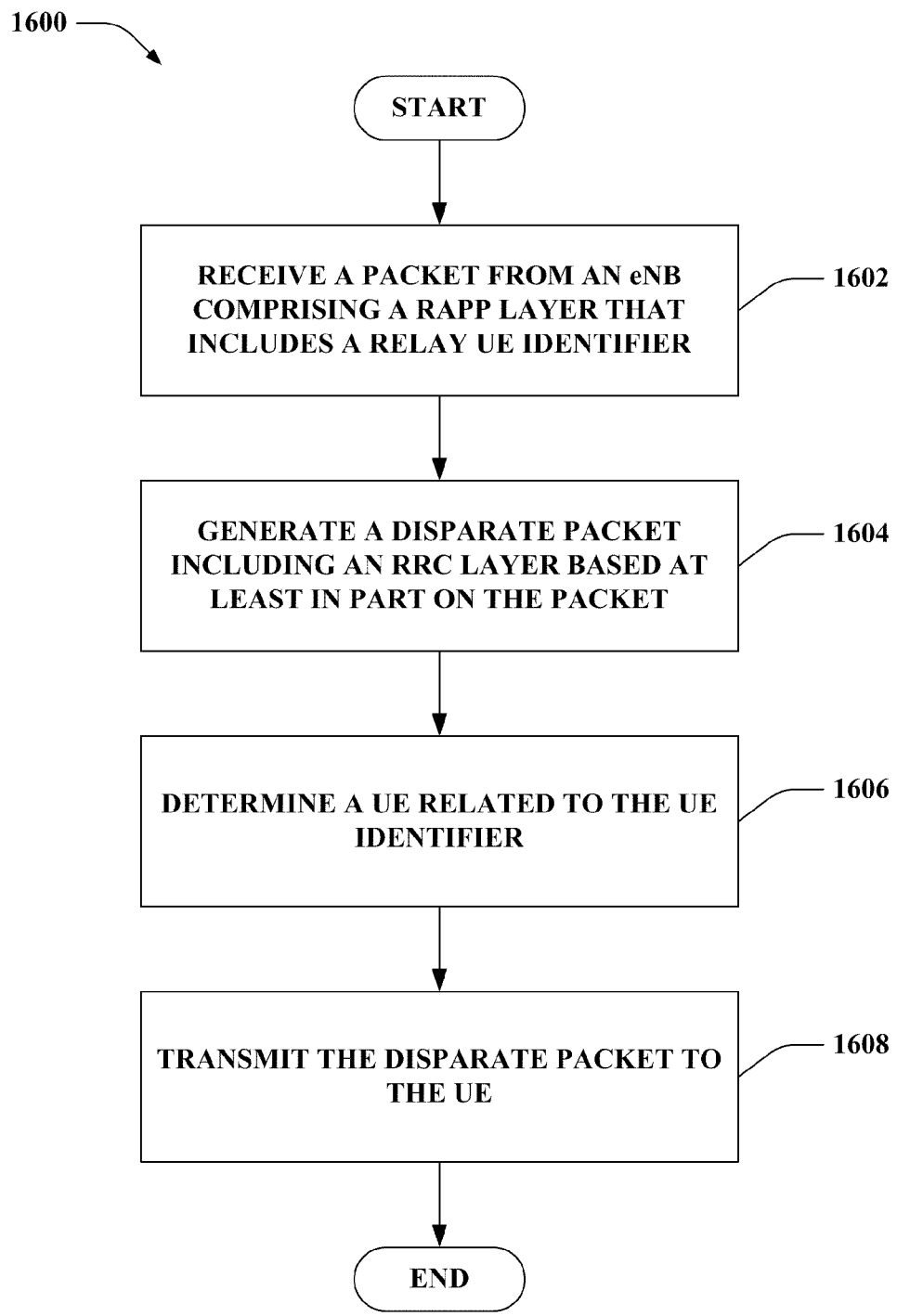
FIG. 16 is an illustration of an example methodology that processes RAPP layer packets to create a disparate application layer for communicating to a UE.

Turning to FIG. 16, an example methodology 1600 that facilitates transmitting packets from a donor eNB to a UE is illustrated. At 1602, a packet can be received from an eNB that comprises a RAPP layer including a relay UE identifier. As described, the packet can be received from a relay eNB or a donor eNB where a PDCP layer of the packet can originate at the donor eNB to facilitate handling security/encryption at the donor eNB and a UE. At 1604, a disparate packet can be generated to include an RRC layer based at least in part on the packet. As described, the RAPP layer can be translated for transmission over an RRC layer. This can include extracting one or more parameters from the RAPP layer for including in the RRC layer, such as an upper layer payload, while excluding other parameters, such as the relay UE identifier. At 1606, a UE related to the relay UE identifier can be determined, and at 1608, the disparate packet can be transmitted to the UE. As described, the UE portion of the UE identifier can have been previously assigned to the UE.

Figure 17:
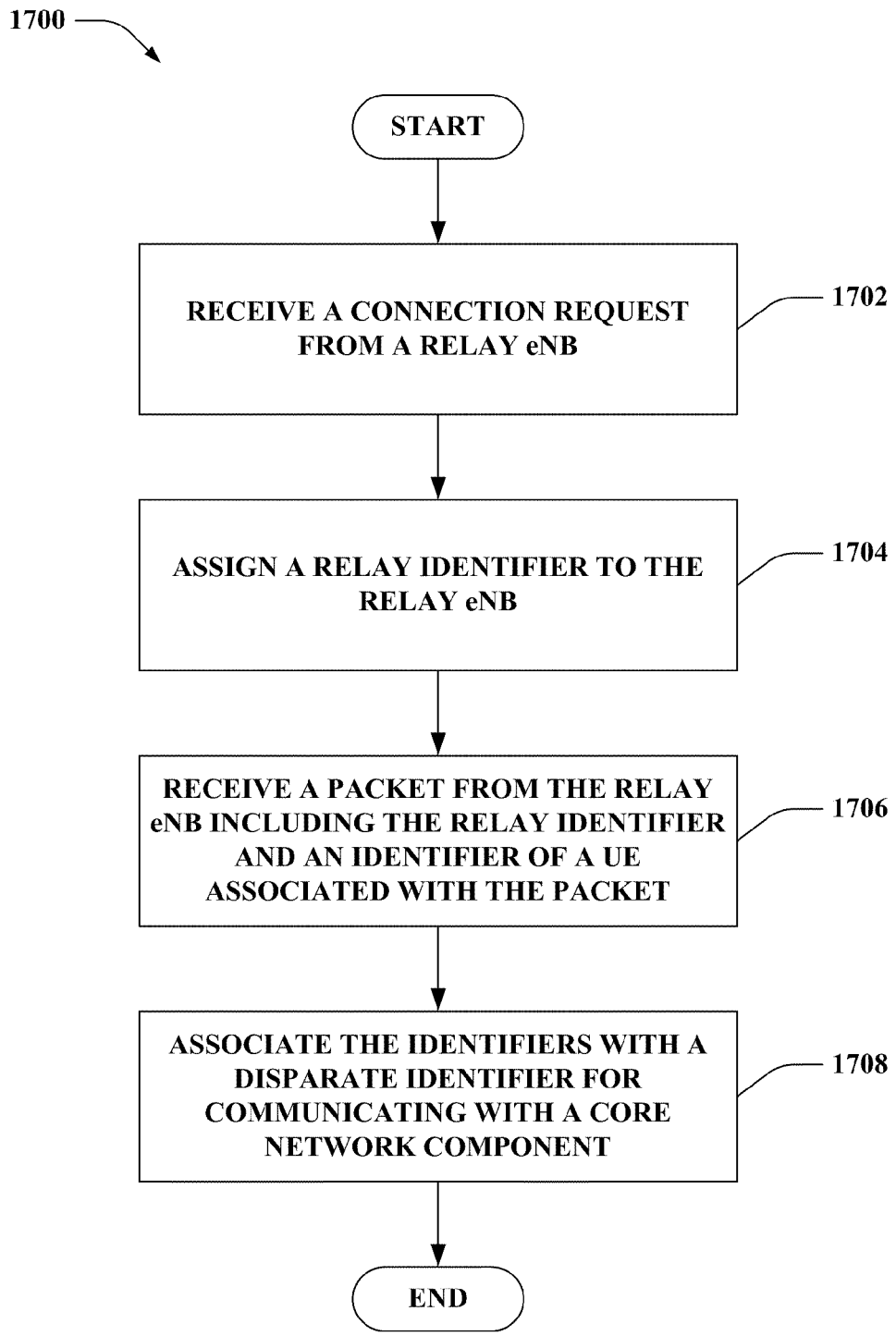
FIG. 17 is an illustration of an example methodology that facilitates assigning and associating a relay UE identifier with packets related to a UE.

Referring to FIG. 17, an example methodology 1700 is shown that facilitates associating one or more identifiers with a relay eNB and/or an attached UE for determining routing of packets intended for the relay eNB and/or the attached UE. At 1702, a connection request can be received from a relay eNB. At 1704, a relay identifier can be assigned to the relay eNB. As described, this can include generating the identifier, obtaining the identifier from a core network component, etc. At 1706, a packet can be received from the relay eNB including the relay identifier and an identifier of a UE associated with the packet. In this regard, the relay eNB can have assigned the identifier of the UE. In one example, the relay identifier and the identifier of the UE can be concatenated. At 1708, the identifiers can be associated with a disparate identifier for communicating with a core network component. The association can be stored in a routing table, as described for example. The association can be subsequently utilized to determine the relay identifier and identifier of the UE for received upstream packets, as described.

It will be appreciated that, in accordance with one or more aspects described herein, inferences can be made regarding determining relay UE identifier related to devices when creating RAPP layers, utilizing SN information or status transfer in handover procedures, determining relay eNBs or donor eNBs to receive UE communications in handover procedures, and/or other aspects described herein. As used herein, the term to "infer" or "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Figure 18:
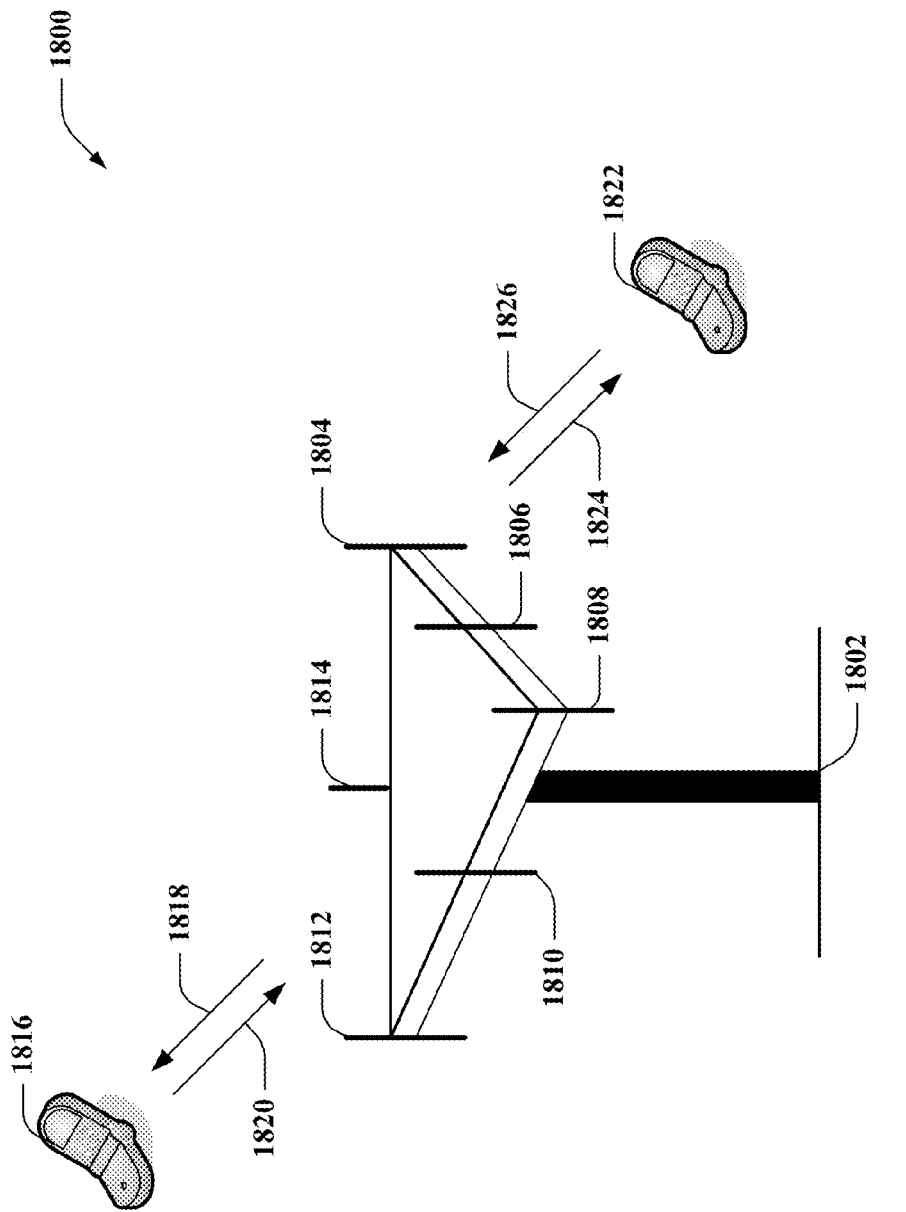
FIG. 18 is an illustration of a wireless communication system in accordance with various aspects set forth herein.

Referring now to FIG. 18, a wireless communication system 1800 is illustrated in accordance with various embodiments presented herein. System 1800 comprises a base station 1802 that can include multiple antenna groups. For example, one antenna group can include antennas 1804 and 1806, another group can comprise antennas 1808 and 1810, and an additional group can include antennas 1812 and 1814. Two antennas are illustrated for each antenna group; however, more or fewer antennas can be utilized for each group. Base station 1802 can additionally include a transmitter chain and a receiver chain, each of which can in turn comprise a plurality of components associated with signal transmission and reception (e.g., processors, modulators, multiplexers, demodulators, demultiplexers, antennas, etc.), as will be appreciated by one skilled in the art.

Base station 1802 can communicate with one or more mobile devices such as mobile device 1816 and mobile device 1822; however, it is to be appreciated that base station 1802 can communicate with substantially any number of mobile devices similar to mobile devices 1816 and 1822. Mobile devices 1816 and 1822 can be, for example, cellular phones, smart phones, laptops, handheld communication devices, handheld computing devices, satellite radios, global positioning systems, PDAs, and/or any other suitable device for communicating over wireless communication system 1800. As depicted, mobile device 1816 is in communication with antennas 1812 and 1814, where antennas 1812 and 1814 transmit information to mobile device 1816 over a forward link 1818 and receive information from mobile device 1816 over a reverse link 1820. Moreover, mobile device 1822 is in communication with antennas 1804 and 1806, where antennas 1804 and 1806 transmit information to mobile device 1822 over a forward link 1824 and receive information from mobile device 1822 over a reverse link 1826. In a frequency division duplex (FDD) system, forward link 1818 can utilize a different frequency band than that used by reverse link 1820, and forward link 1824 can employ a different frequency band than that employed by reverse link 1826, for example. Further, in a time division duplex (TDD) system, forward link 1818 and reverse link 1820 can utilize a common frequency band and forward link 1824 and reverse link 1826 can utilize a common frequency band.

Each group of antennas and/or the area in which they are designated to communicate can be referred to as a sector of base station 1802. For example, antenna groups can be designed to communicate to mobile devices in a sector of the areas covered by base station 1802. In communication over forward links 1818 and 1824, the transmitting antennas of base station 1802 can utilize beamforming to improve signal-to-noise ratio of forward links 1818 and 1824 for mobile devices 1816 and 1822. Also, while base station 1802 utilizes beamforming to transmit to mobile devices 1816 and 1822 scattered randomly through an associated coverage, mobile devices in neighboring cells can be subject to less interference as compared to a base station transmitting through a single antenna to all its mobile devices. Moreover, mobile devices 1816 and 1822 can communicate directly with one another using a peer-to-peer or ad hoc technology (not shown).

According to an example, system 1800 can be a multiple-input multiple-output (MIMO) communication system. Further, system 1800 can utilize substantially any type of duplexing technique to divide communication channels (e.g., forward link, reverse link, . . . ) such as FDD, FDM, TDD, TDM, CDM, and the like. In addition, communication channels can be orthogonalized to allow simultaneous communication with multiple devices over the channels; in one example, OFDM can be utilized in this regard. Thus, the channels can be divided into portions of frequency over a period of time. In addition, frames can be defined as the portions of frequency over a collection of time periods; thus, for example, a frame can comprise a number of OFDM symbols. The base station 1802 can communicate to the mobile devices 1816 and 1822 over the channels, which can be create for various types of data. For example, channels can be created for communicating various types of general communication data, control data (e.g., quality information for other channels, acknowledgement indicators for data received over channels, interference information, reference signals, etc.), and/or the like.

Figure 19:
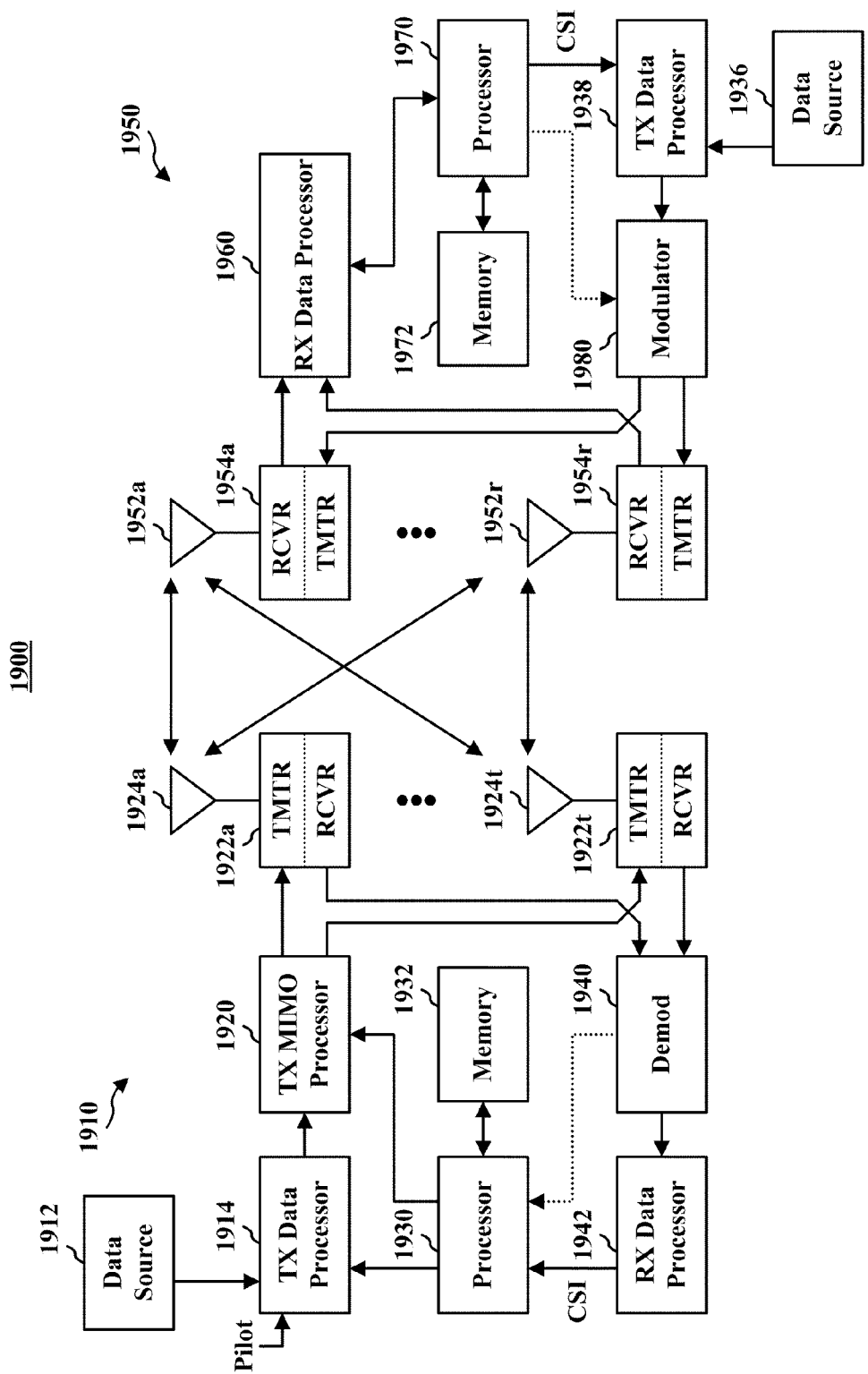
FIG. 19 is an illustration of an example wireless network environment that can be employed in conjunction with the various systems and methods described herein.

FIG. 19 shows an example wireless communication system 1900. The wireless communication system 1900 depicts one base station 1910 and one mobile device 1950 for sake of brevity. However, it is to be appreciated that system 1900 can include more than one base station and/or more than one mobile device, wherein additional base stations and/or mobile devices can be substantially similar or different from example base station 1910 and mobile device 1950 described below. In addition, it is to be appreciated that base station 1910 and/or mobile device 1950 can employ the systems (FIGS. 1-11 and 18), protocol stacks (FIG. 12-13) and/or methods (FIGS. 14-17) described herein to facilitate wireless communication therebetween.

At base station 1910, traffic data for a number of data streams is provided from a data source 1912 to a transmit (TX) data processor 1914. According to an example, each data stream can be transmitted over a respective antenna. TX data processor 1914 formats, codes, and interleaves the traffic data stream based on a particular coding scheme selected for that data stream to provide coded data.

The coded data for each data stream can be multiplexed with pilot data using orthogonal frequency division multiplexing (OFDM) techniques. Additionally or alternatively, the pilot symbols can be frequency division multiplexed (FDM), time division multiplexed (TDM), or code division multiplexed (CDM). The pilot data is typically a known data pattern that is processed in a known manner and can be used at mobile device 1950 to estimate channel response. The multiplexed pilot and coded data for each data stream can be modulated (e.g., symbol mapped) based on a particular modulation scheme (e.g., binary phase-shift keying (BPSK), quadrature phase-shift keying (QPSK), M-phase-shift keying (M-PSK), M-quadrature amplitude modulation (M-QAM), etc.) selected for that data stream to provide modulation symbols. The data rate, coding, and modulation for each data stream can be determined by instructions performed or provided by processor 1930.

The modulation symbols for the data streams can be provided to a TX MIMO processor 1920, which can further process the modulation symbols (e.g., for OFDM). TX MIMO processor 1920 then provides $N_T$ modulation symbol streams to $N_T$ transmitters (TMTR) 1922a through 1922t. In various aspects, TX MIMO processor 1920 applies beamforming weights to the symbols of the data streams and to the antenna from which the symbol is being transmitted.

Each transmitter 1922 receives and processes a respective symbol stream to provide one or more analog signals, and further conditions (e.g., amplifies, filters, and upconverts) the analog signals to provide a modulated signal suitable for transmission over the MIMO channel. Further, $N_T$ modulated signals from transmitters 1922a through 1922t are transmitted from $N_T$ antennas 1924a through 1924t, respectively.

At mobile device 1950, the transmitted modulated signals are received by $N_R$ antennas 1952a through 1952r and the received signal from each antenna 1952 is provided to a respective receiver (RCVR) 1954a through 1954r. Each receiver 1954 conditions (e.g., filters, amplifies, and down-converts) a respective signal, digitizes the conditioned signal to provide samples, and further processes the samples to provide a corresponding "received" symbol stream.

An RX data processor 1960 can receive and process the $N_R$ received symbol streams from $N_R$ receivers 1954 based on a particular receiver processing technique to provide $N_T$ "detected" symbol streams. RX data processor 1960 can demodulate, deinterleave, and decode each detected symbol stream to recover the traffic data for the data stream. The processing by RX data processor 1960 is complementary to that performed by TX MIMO processor 1920 and TX data processor 1914 at base station 1910.

A processor 1970 can periodically determine which precoding matrix to utilize as discussed above. Further, processor 1970 can formulate a reverse link message comprising a matrix index portion and a rank value portion.

The reverse link message can comprise various types of information regarding the communication link and/or the received data stream. The reverse link message can be processed by a TX data processor 1938, which also receives traffic data for a number of data streams from a data source 1936, modulated by a modulator 1980, conditioned by transmitters 1954a through 1954r, and transmitted back to base station 1910.

At base station 1910, the modulated signals from mobile device 1950 are received by antennas 1924, conditioned by receivers 1922, demodulated by a demodulator 1940, and processed by a RX data processor 1942 to extract the reverse link message transmitted by mobile device 1950. Further, processor 1930 can process the extracted message to determine which precoding matrix to use for determining the beamforming weights.

Processors 1930 and 1970 can direct (e.g., control, coordinate, manage, etc.) operation at base station 1910 and mobile device 1950, respectively. Respective processors 1930 and 1970 can be associated with memory 1932 and 1972 that store program codes and data. Processors 1930 and 1970 can also perform computations to derive frequency and impulse response estimates for the uplink and downlink, respectively.

Figure 20:
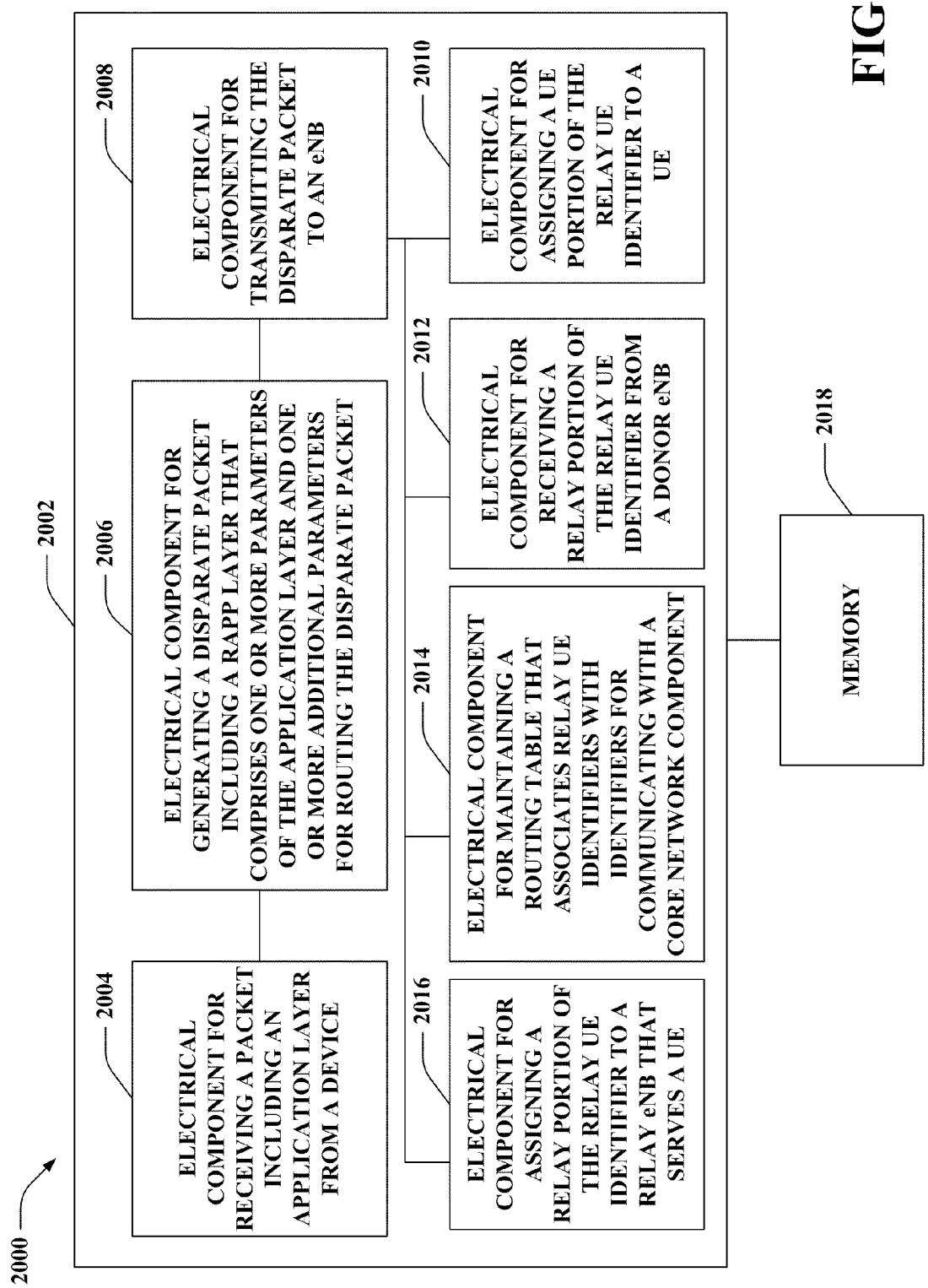
FIG. 20 is an illustration of an example system that facilitates translating application layers to RAPP layers for transmitting related packets through relay eNBs.

With reference to FIG. 20, illustrated is a system 2000 that facilitates translating packets from an application layer to a RAPP layer for forwarding among relay eNBs. For example, system 2000 can reside at least partially within a base station, mobile device, etc. It is to be appreciated that system 2000 is represented as including functional blocks, which can be functional blocks that represent functions implemented by a processor, software, or combination thereof (e.g., firmware). System 2000 includes a logical grouping 2002 of electrical components that can act in conjunction. For instance, logical grouping 2002 can include an electrical component for receiving a packet including an application layer from a device 2004. For example, as described, the device can be a UE, a donor eNB, a core network component, and/or the like. In addition, the packet can comprise control data, such as one or more messages for establishing network communications, establishing radio bearers, facilitating handover, etc. Additionally, logical grouping 2002 can include an electrical component for generating a disparate packet including a RAPP layer that comprises one or more parameters of the application layer and one or more additional parameters for routing the disparate packet 2006.

As described, the additional parameters can include a relay UE identifier, which can be utilized for associating the disparate packet with a respective UE and serving relay eNB. In another example, the additional parameters can include one or more identifiers related to relay radio bearers established or to be established with a UE. In addition, as described, the disparate packet can exclude some parameters of the application layer in the RAPP layer, such as parameters related to securing or interpreting data in a payload of the application/ RAPP layer. Moreover, logical grouping 2002 can include an electrical component for transmitting the disparate packet to an eNB 2008. For example, where the device is a UE and the packet and disparate packet are thus moving upstream toward the core network, the packet with the RAPP layer includes the relay UE identifier so a donor eNB can associate the disparate packet, and therefore responding packets from a core network, with the UE and the serving relay. Where the device is a core network component (or a donor eNB of a disparate cluster) and the packet and disparate packet are thus moving downstream, various eNBs can utilize the relay UE identifier (or a relay identifier where the intended recipient of the packet is a relay eNB) to determine routing for the disparate packet, as described.

In addition, logical grouping 2002 can include an electrical component for assigning a UE portion of the relay UE identifier to a UE 2010. Thus, where the device is a UE, electrical component 2010 can assign the UE portion of the relay UE identifier according to a specification, configuration, randomly, and/or the like. Moreover, logical grouping 2002 can include an electrical component for receiving a relay portion of the relay UE identifier from a donor eNB 2012. Further, logical grouping 2002 can include an electrical component for maintaining a routing table that associates relay UE identifiers with identifiers for communicating with a core network component 2014. As described above, a relay UE identifier can be determined by electrical component 2014 according to a received identifier for communicating with the core network component, and the relay UE identifier can be included in the disparate packet. Moreover, logical grouping can include an electrical component for assigning a portion of the relay UE identifier to a relay eNB that serves a UE 2016. Additionally, system 2000 can include a memory 2018 that retains instructions for executing functions associated with electrical components 2004, 2006, 2008, 2010, 2012, 2014, and 2016. While shown as being external to memory 2018, it is to be understood that one or more of electrical components 2004, 2006, 2008, 2010, 2012, 2014, and 2016 can exist within memory 2018.

Figure 21:
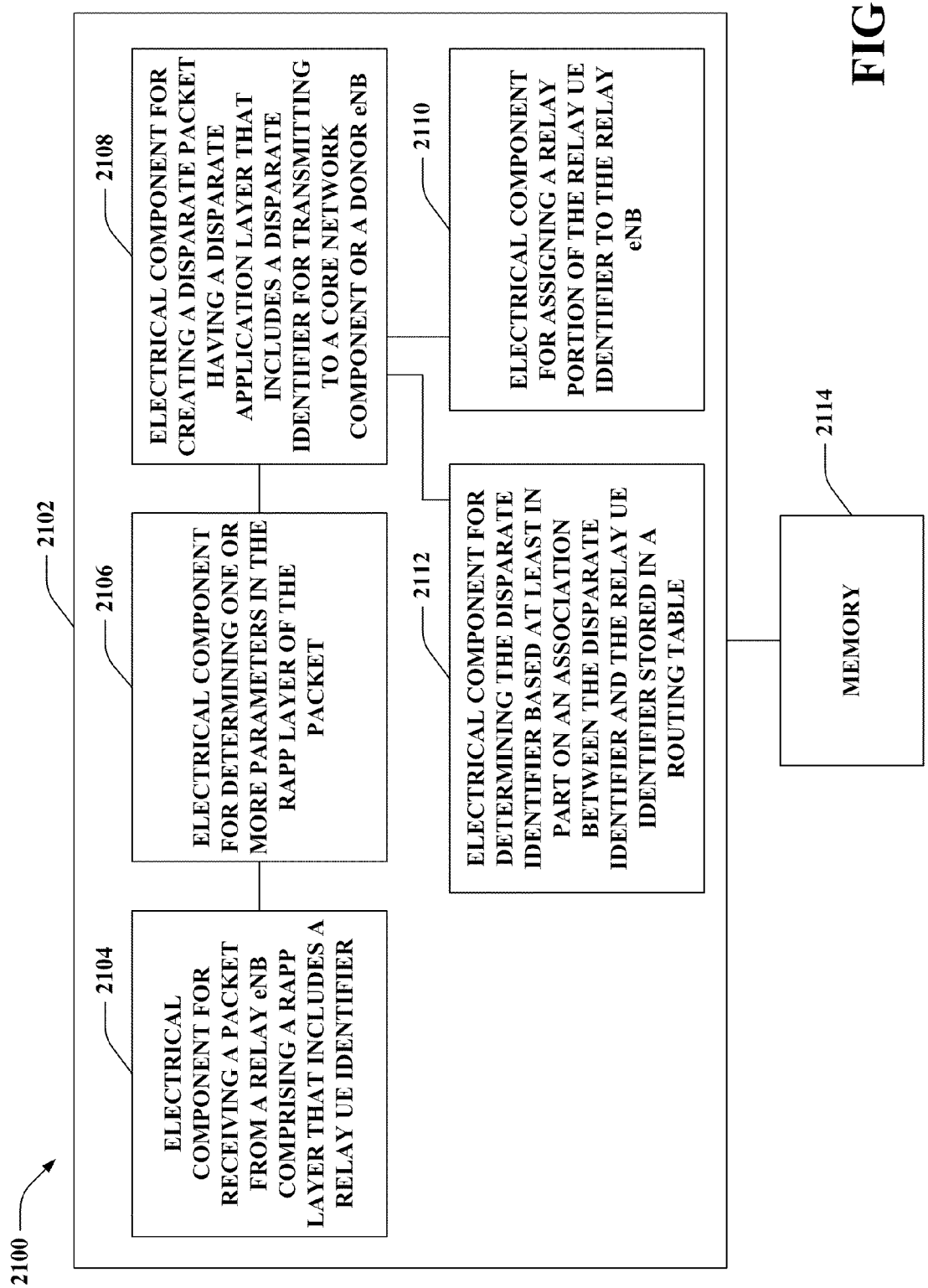
FIG. 21 is an illustration of an example system that facilitates processing RAPP layers of packets to create disparate application layers for communicating with a core network component or donor eNB.

With reference to FIG. 21, illustrated is a system 2100 that facilitates processing a RAPP layer of a received packet to generate a disparate packet with a disparate application layer. For example, system 2100 can reside at least partially within a base station, mobile device, etc. It is to be appreciated that system 2100 is represented as including functional blocks, which can be functional blocks that represent functions implemented by a processor, software, or combination thereof (e.g., firmware). System 2100 includes a logical grouping 2102 of electrical components that can act in conjunction. For instance, logical grouping 2102 can include an electrical component for receiving a packet from a relay eNB comprising a RAPP layer that includes a relay UE identifier 2104. For example, as described, the relay UE identifier can correspond to a UE related to the packet and its serving relay eNB in the associated wireless network. Additionally, logical grouping 2102 can include an electrical component for determining one or more parameters in the RAPP layer of the packet 2106.

In one example, as described, the one or more parameters can relate to or can be a payload of the RAPP layer of the packet, which can include a NAS message or similar messages or parameters related to establishing a connection with a network, establishing one or more radio bearers, initiating or processing a handover procedure, and/or the like. Moreover, logical grouping 2102 can include an electrical component for creating a disparate packet having a disparate application layer that includes a disparate identifier for transmitting to a core network component or a donor eNB 2108. Thus, as described, the RAPP layer can be used for routing among relay eNBs and can be removed when transmitting control communications to a core network or to one or more disparate clusters. Further, logical grouping 2102 can include an electrical component for assigning a relay portion of the relay UE identifier to the relay eNB 2110. As described, for example, electrical component 2110 can generate the relay portion according to a specification, configuration, random function, a type or class of the eNB, and/or the like.

In addition, logical grouping 2102 can include an electrical component for determining the disparate identifier based at least in part on an association between the disparate identifier and the relay UE identifier stored in a routing table 2112. As described, electrical component 2112 can maintain the routing table, updating it when new relay UE identifiers are received. Determining the disparate identifier can include matching the relay UE identifier received in the packet to the disparate identifier according to one or more entries in the routing table, as described. Additionally, system 2100 can include a memory 2114 that retains instructions for executing functions associated with electrical components 2104, 2106, 2108, 2110, and 2112. While shown as being external to memory 2114, it is to be understood that one or more of electrical components 2104, 2106, 2108, 2110, and 2112 can exist within memory 2114.

Figure 22:
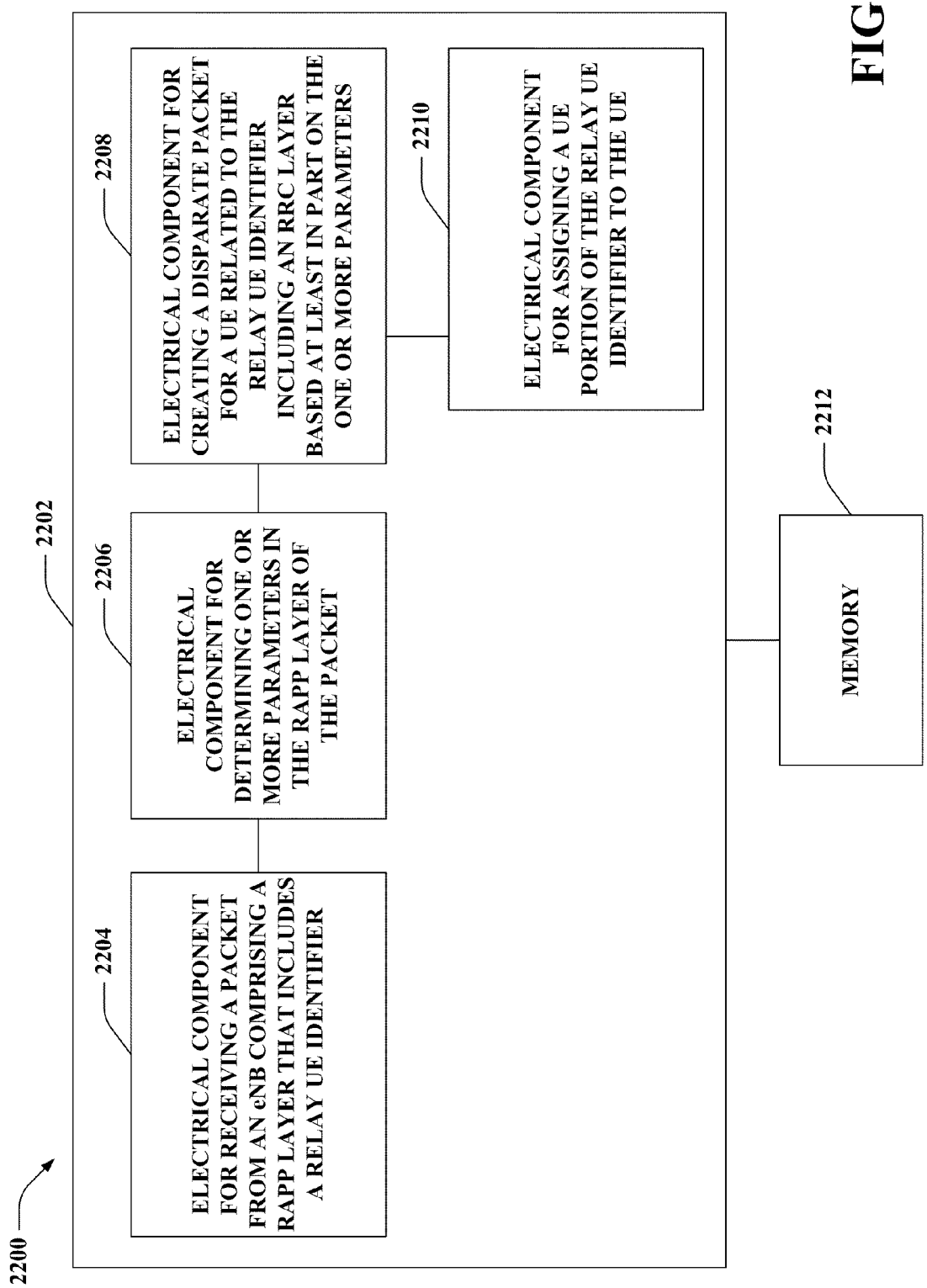
FIG. 22 is an illustration of an example system that facilitates processing RAPP layers of packets to create disparate application layers for communicating with a UE.

With reference to FIG. 22, illustrated is a system 2200 that facilitates processing RAPP packets received from eNBs for communicating related data with one or more UEs. For example, system 2200 can reside at least partially within a base station, mobile device, etc. It is to be appreciated that system 2200 is represented as including functional blocks, which can be functional blocks that represent functions implemented by a processor, software, or combination thereof (e.g., firmware). System 2200 includes a logical grouping 2202 of electrical components that can act in conjunction. For instance, logical grouping 2202 can include an electrical component for receiving a packet from an eNB comprising a RAPP layer that includes a relay UE identifier 2204. For example, as described, the relay UE identifier can correspond to a UE related to the packet and its serving relay eNB in the associated wireless network. Additionally, logical grouping 2202 can include an electrical component for determining one or more parameters in the RAPP layer of the packet 2206.

In one example, as described, the one or more parameters can relate to or can be a payload of the RAPP layer of the packet, which can include a NAS message or similar messages or parameters related to establishing a connection with a network, establishing one or more radio bearers, initiating or processing a handover procedure, and/or the like. Moreover, logical grouping 2202 can include an electrical component for creating a disparate packet for a UE related to the relay UE including an RRC layer based at least in part on the one or more parameters 2208. Thus, as described, the RAPP layer can be used for routing among relay eNBs and can be removed when transmitting control communications to a related UE. Further, logical grouping 2202 can include an electrical component for assigning a UE portion of the relay UE identifier to the UE 2210. As described, for example, electrical component 2210 can generate the UE portion according to a specification, configuration, random function, and/or the like. Additionally, system 2200 can include a memory 2212 that retains instructions for executing functions associated with electrical components 2204, 2206, 2208, and 2210. While shown as being external to memory 2212, it is to be understood that one or more of electrical components 2204, 2206, 2208, and 2210 can exist within memory 2212.

The various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

In one or more aspects, the functions described may be implemented in hardware, software, firmware, or any combination thereof. If implemented in software, the functions, procedures, etc. may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically with lasers. Combinations of the above should also be included within the scope of computer-readable media.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise. Furthermore, to the extent that the term "includes" is used in either the detailed description or the claims, such term is intended to be inclusive in a manner similar to the term "comprising" as "comprising" is interpreted when employed as a transitional word in a claim. Furthermore, although elements of the described aspects and/or aspects may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method, comprising:
   receiving a packet having information for an application layer from an initial device;
   generating a disparate packet having information for a relay application protocol (RAPP) layer that includes one or more parameters of the application layer and one or more additional parameters for routing the disparate packet among one or more relay evolved Node Bs (eNB), wherein the one or more additional parameters includes a relay user equipment (UE) identifier that corresponds to a UE related to the packet and a relay eNB serving the UE; and
   transmitting the disparate packet to an eNB.

2. The method of claim 1, wherein the receiving the packet includes receiving the packet from the UE, and the transmitting the disparate packet includes transmitting the disparate packet to a donor eNB.

3. The method of claim 2, further comprising assigning a UE portion of the relay UE identifier to the UE, wherein the receiving the packet includes receiving the packet comprising an attach request.

4. The method of claim 2, further comprising receiving a relay portion of the relay UE identifier from the donor eNB during a random access procedure with the donor eNB.

5. The method of claim 2, wherein the receiving the packet from the UE includes receiving the packet with a non-access stratum (NAS) message.

6. The method of claim 5, wherein the generating the disparate packet having the RAPP layer includes generating a NAS transport including the NAS message as a NAS protocol data unit in the RAPP layer of the NAS transport.

7. The method of claim 2, wherein the receiving the packet from the UE includes receiving the packet that acknowledges one or more security parameters at the UE provided by the donor eNB or establishment of one or more radio bearers for communicating with the UE.

8. The method of claim 2, further comprising determining to handover communications of the UE to one or more disparate eNBs, wherein the receiving the packet from the UE includes receiving the packet comprising one or more measurement reports related to the one or more disparate eNBs.

9. The method of claim 8, wherein the generating the disparate packet having the RAPP layer includes generating a handover request that includes one or more parameters regarding one or more relay radio bearers established for transmitting packets to the UE.

10. The method of claim 9, further comprising receiving an acknowledgement of the handover request from the donor eNB.

11. The method of claim 8, further comprising providing one or more packets in an uplink receive buffer and one or more sequence number status transfer parameters to the donor eNB.

12. The method of claim 1, wherein the receiving the packet includes receiving the packet from a core network component, and the transmitting the disparate packet includes transmitting the disparate packet to the relay eNB serving the UE.

13. The method of claim 12, further comprising assigning a relay portion of the relay UE identifier to the eNB upon establishing a connection with the eNB.

14. The method of claim 12, further comprising determining the relay UE identifier from a routing table that associates relay UE identifiers with disparate identifiers for communicating with the core network component.

15. The method of claim 12, wherein the receiving the packet from the core network component includes receiving the packet with an attach accept message from a mobility management entity related to an attach request from a UE.

16. The method of claim 15, wherein the generating the disparate packet having the RAPP layer includes generating a security mode command message including one or more parameters related to one or more radio bearers for transmitting packets to the UE.

17. The method of claim 12, wherein the receiving the packet from the core network component includes receiving the packet with a request to establish one or more radio bearers with the UE.

18. The method of claim 17, wherein the generating the disparate packet having the RAPP layer includes generating a bearer setup request including one or more parameters related to the one or more radio bearers to establish with the UE.

19. The method of claim 12, wherein the receiving the packet from the core network component includes receiving the packet comprising one or more messages from a disparate donor eNB related to handing over communications of the UE or a disparate UE.

20. The method of claim 1, wherein the receiving the packet includes receiving the packet from a donor eNB, and the transmitting the disparate packet includes transmitting the disparate packet to a target relay eNB in handover.

21. The method of claim 20, wherein the receiving the packet from the donor eNB includes receiving a handover request from the donor eNB.

22. The method of claim 21, further comprising transmitting a connection reconfiguration to the target relay eNB to establish one or more relay radio bearers indicated in the handover request.

23. The method of claim 22, further comprising receiving a connection reconfiguration complete from the target relay eNB and transmitting a handover request acknowledgement to the donor eNB.

24. A method comprising:
   receiving a packet having information for an application layer from an initial device, wherein the application layer is a radio resource control, S1-AP, or X2 layer;

generating a disparate packet having information for a relay application protocol (RAPP) layer that includes one or more parameters of the application layer and one or more additional parameters for routing the disparate packet among one or more relay evolved Node Bs (eNB), wherein the one or more additional parameters includes a relay user equipment (UE) identifier that corresponds to a UE related to the packet and a relay eNB serving the UE; and transmitting the disparate packet to an eNB.

25. A method comprising:

receiving a packet having information for an application layer from an initial device;

generating a disparate packet having information for a relay application protocol (RAPP) layer that includes one or more parameters of the application layer and one or more additional parameters for routing the disparate packet among one or more relay evolved Node Bs (eNB), wherein the RAPP layer further excludes one or more disparate parameters of the application layer; and transmitting the disparate packet to an eNB.

26. The method of claim 25, wherein the one or more disparate parameters of the application layer relates to security or encryption of the packet.

27. A method comprising:

receiving a packet having information for an application layer from an initial device;

generating a disparate packet having information for a relay application protocol (RAPP) layer that includes one or more parameters of the application layer and one or more additional parameters for routing the disparate packet among one or more relay evolved Node Bs (eNB), wherein the one or more additional parameters includes a relay user equipment (UE) identifier that corresponds to a UE related to the packet and a relay eNB serving the UE; and transmitting the disparate packet to an eNB, wherein the transmitting the disparate packet to the eNB includes transmitting the disparate packet among the one or more relay eNBs to the eNB.

28. A wireless communications apparatus, comprising:

at least one processor configured to:

obtain a packet from a device having information for an application layer;

create a disparate packet with information for a relay application protocol (RAPP) layer that includes one or more parameters of the application layer and one or more additional parameters for routing the disparate packet among one or more relay evolved Node Bs (eNB), wherein the one or more additional parameters comprises a relay user equipment (UE) identifier that corresponds to a UE related to the packet and a relay eNB serving the UE; and transmit the disparate packet to an eNB; and a memory coupled to the at least one processor.

29. The wireless communications apparatus of claim 28, wherein the device is the UE, and the eNB is a donor eNB that provides wireless network access to the relay eNB.

30. The wireless communications apparatus of claim 29, wherein the packet includes a non-access stratum (NAS) message.

31. The wireless communications apparatus of claim 30, wherein the at least one processing creates the disparate packet to include the NAS message in a NAS protocol data unit of the RAPP layer.

32. The wireless communications apparatus of claim 29, wherein the at least one processor is further configured to assign a UE portion of the relay UE identifier upon establishing a connection with the UE.

33. The wireless communications apparatus of claim 29, wherein the at least one processor is further configured to receive a relay portion of the relay UE identifier from the donor eNB.

34. The wireless communications apparatus of claim 29, wherein the packet includes an acknowledgement related to establishing one or more radio bearers for communicating with the UE or related to one or more security parameters provided by the donor eNB.

35. The wireless communications apparatus of claim 29, wherein the at least one processor is further configured to determine to handover communications of the UE to one or more disparate eNBs, and the packet includes one or more measurement reports related to the one or more disparate eNBs.

36. The wireless communications apparatus of claim 35, wherein the disparate packet includes a handover request comprising one or more parameters regarding one or more relay radio bearers established for communicating with the UE.

37. The wireless communications apparatus of claim 35, wherein the at least one processor is further configured to provide one or more packets in an uplink receive buffer and one or more sequence number status transfer parameters to the donor eNB.

38. The wireless communications apparatus of claim 28, wherein the device is a core network component, and the eNB is the relay eNB serving the UE.

39. The wireless communications apparatus of claim 38, wherein the at least one processor is further configured to locate the relay UE identifier in a routing table that associates relay UE identifiers with disparate identifiers for communicating with the core network component.

40. The wireless communications apparatus of claim 38, wherein the packet is an attach accept message from a mobility management entity related to an attach request from a UE, and the disparate packet includes a security mode command message including one or more parameters related to one or more radio bearers for transmitting packets to the UE.

41. The wireless communications apparatus of claim 38, wherein the packet comprises a request to establish one or more radio bearers with the UE, and the disparate packet includes a bearer setup request comprising one or more parameters related to the one or more radio bearers to establish with the UE.

42. The wireless communications apparatus of claim 38, wherein the packet comprises one or more messages from a disparate donor eNB related to handing over communications of the UE or a disparate UE.

43. The wireless communications apparatus of claim 38, wherein the at least one processor is further configured to assign a relay portion of the relay UE identifier to the relay eNB serving the UE.

44. The wireless communications apparatus of claim 28, wherein the device is a donor eNB, and the eNB is a target relay eNB in a handover procedure.

45. The wireless communications apparatus of claim 44, wherein the packet comprises a handover request, and the at least one processor is further configured to:

transmit a connection reconfiguration to the target relay eNB to establish one or more radio bearers indicated in the handover request; and receive a connection reconfiguration complete from the target relay eNB.

46. An apparatus, comprising:
means for receiving a packet including information for an application layer from a device;
means for generating a disparate packet including information for a relay application protocol (RAPP) layer that comprises one or more parameters of the application layer and one or more additional parameters for routing the disparate packet, wherein the one or more additional parameters includes a relay user equipment (UE) identifier that corresponds to a UE related to the packet and a relay eNB that serves the UE; and
means for transmitting the disparate packet to an evolved Node B (eNB).

47. The apparatus of claim 46, wherein the device is a UE, and the eNB is a donor eNB that serves the relay eNB that serves the UE or one or more intermediary relay eNBs communicating with the relay eNB that serves the UE.

48. The apparatus of claim 47, wherein the packet is a non-access stratum (NAS) message, and the disparate packet comprises the NAS message in a NAS protocol data unit in the RAPP layer.

49. The apparatus of claim 47, further comprising means for assigning a UE portion of the relay UE identifier to the UE.

50. The apparatus of claim 47, further comprising means for receiving a relay portion of the relay UE identifier from the donor eNB.

51. The apparatus of claim 46, wherein the device is a core network component, and the eNB is the relay eNB that serves the UE.

52. The apparatus of claim 51, further comprising means for maintaining a routing table that associates relay UE identifiers with disparate identifiers for communicating with the core network component and determining the relay UE identifier from a routing table association to a corresponding disparate identifier received in a communication from the core network component.

53. The apparatus of claim 51, further comprising means for assigning a relay portion of the relay UE identifier to the relay eNB that serves the UE.

54. The apparatus of claim 46, wherein the device is a donor eNB, and the eNB is a target relay eNB in a handover procedure.

55. The apparatus of claim 54, wherein the packet includes a handover request.

56. The apparatus of claim 55, wherein the means for transmitting the disparate packet to the eNB further transmits a connection reconfiguration to the target relay eNB to establish one or more relay radio bearers indicated in the handover request.

57. A computer program product, comprising:
a non-transitory computer-readable medium comprising:
code for causing at least one computer to obtain a packet from a device having information for an application layer;
code for causing the at least one computer to create a disparate packet with information for a relay application protocol (RAPP) layer that includes one or more parameters of the application layer and one or more additional parameters for routing the disparate packet among one or more relay evolved Node Bs (eNB), wherein the one or more additional parameters comprises a relay user equipment (UE) identifier that corresponds to a UE related to the packet and a relay eNB serving the UE; and
code for causing the at least one computer to transmit the disparate packet to an eNB.

58. The computer program product of claim 57, wherein the device is the UE, and the eNB is a donor eNB that provides wireless network access to the relay eNB.

59. The computer program product of claim 58, wherein the packet includes a non-access stratum (NAS) message, and the code for causing the at least one computer to generate generates the disparate packet to include the NAS message in a NAS protocol data unit of the RAPP layer.

60. The computer program product of claim 58, wherein the computer-readable medium further comprises code for causing the at least one computer to determine to handover communications of the UE to one or more disparate eNBs, the packet includes one or more measurement reports related to the one or more disparate eNBs, and code for causing the at least one computer to generate generates the disparate packet to include a handover request comprising one or more parameters regarding one or more relay radio bearers established for communicating with the UE.

61. The computer program product of claim 60, wherein the computer-readable medium further comprises code for causing the at least one computer to provide one or more packets in an uplink receive buffer and one or more sequence number status transfer parameters to the donor eNB.

62. The computer program product of claim 58, wherein the computer-readable medium further comprises code for causing the at least one computer to assign a UE portion of the relay UE identifier to the UE upon establishing a connection with the UE.

63. The computer program product of claim 58, wherein the computer-readable medium further comprises code for causing the at least one computer to receive a relay portion of the relay UE identifier from the donor eNB.

64. The computer program product of claim 57, wherein the device is a core network component, and the eNB is the relay eNB serving the UE.

65. The computer program product of claim 64, wherein the computer-readable medium further comprises code for causing the at least one computer to locate the relay UE identifier in a routing table that associates relay UE identifiers with disparate identifiers for communicating with the core network component.

66. The computer program product of claim 64, wherein the computer-readable medium further comprises code for causing the at least one computer to assign a relay portion of the relay UE identifier to the relay eNB serving the UE.

67. The computer program product of claim 57, wherein the device is a donor eNB, and the eNB is a target relay eNB in a handover procedure.

68. The computer program product of claim 67, wherein the packet comprises a handover request, and the computer-readable medium further comprises:
code for causing the at least one computer to transmit a connection reconfiguration to the target relay eNB to establish one or more radio bearers indicated in the handover request; and
code for causing the at least one computer to receive a connection reconfiguration complete from the target relay eNB.

69. An apparatus, comprising:
a component that receives a packet including information for an application layer from a device;
a relay application protocol (RAPP) translating component that generates a disparate packet including information for a RAPP layer that comprises one or more parameters of the application layer and one or more additional parameters for routing the disparate packet, wherein the one or more additional parameters includes a relay user equipment (UE) identifier that corresponds to a UE related to the packet and a relay eNB that serves the UE; and a RAPP communicating component that transmits the disparate packet to an evolved Node B (eNB).

70. The apparatus of claim 69, wherein the device is a UE, and the eNB is a donor eNB that serves the relay eNB that serves the UE or one or more intermediary relay eNBs communicating with the relay eNB that serves the UE.

71. The apparatus of claim 70, further comprising a relay UE ID generating component that assigns a UE portion of the relay UE identifier to the UE.

72. The apparatus of claim 70, further comprising a relay identifier receiving component that obtains a relay portion of the relay UE identifier from the donor eNB.

73. The apparatus of claim 70, wherein the packet is a non-access stratum (NAS) message, and the disparate packet comprises the NAS message in a NAS protocol data unit in the RAPP layer.

74. The apparatus of claim 69, wherein the RAPP communicating component additionally transmits one or more packets in an uplink receive buffer or one or more sequence number status transfer parameters to the donor eNB.

75. The apparatus of claim 69, wherein the device is a core network component, and the eNB is the relay eNB that serves the UE.

76. The apparatus of claim 75, further comprising a routing table component that associates relay UE identifiers with disparate identifiers for communicating with the core network component and determines the relay UE identifier based on a stored association to a corresponding disparate identifier received in a communication from the core network component.

77. The apparatus of claim 75, wherein the packet includes one or more measurement reports related to one or more disparate eNBs.

78. The apparatus of claim 77, wherein the disparate packet includes a handover request comprising one or more relay radio bearers established for transmitting packets to the UE.

79. The apparatus of claim 74, further comprising a relay identifier assigning component that generates a relay portion of the relay UE identifier for the relay eNB serving the UE.

80. The apparatus of claim 69, wherein the device is a donor eNB, and the eNB is a target relay eNB in a handover procedure.

81. The apparatus of claim 80, wherein the packet includes a handover request.

82. The apparatus of claim 81, wherein the RAPP communicating component further transmits a connection reconfiguration to the target relay eNB to establish one or more relay radio bearers indicated in the handover request.

* * * * *